United States Patent
Chockalingham et al.

(10) Patent No.: US 11,964,359 B2
(45) Date of Patent: Apr. 23, 2024

(54) APPARATUS AND METHOD OF FORMING A POLISHING ARTICLE THAT HAS A DESIRED ZETA POTENTIAL

(71) Applicant: Applied Materials, Inc., Santa Clara, CA (US)

(72) Inventors: Ashwin Chockalingham, San Jose, CA (US); Mahendra C. Orilall, Downingtown, PA (US); Mayu Yamamura, San Mateo, CA (US); Boyi Fu, San Jose, CA (US); Rajeev Bajaj, Fremont, CA (US); Daniel Redfield, Morgan Hill, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1204 days.

(21) Appl. No.: 16/661,400

(22) Filed: Oct. 23, 2019

(65) Prior Publication Data
US 2020/0055161 A1   Feb. 20, 2020

Related U.S. Application Data

(63) Continuation of application No. 15/298,766, filed on Oct. 20, 2016, now Pat. No. 10,618,141.
(Continued)

(51) Int. Cl.
*B33Y 80/00* (2015.01)
*B24B 37/20* (2012.01)
(Continued)

(52) U.S. Cl.
CPC .............. *B24B 37/20* (2013.01); *B24B 37/22* (2013.01); *B24B 37/24* (2013.01); *B24B 37/26* (2013.01);
(Continued)

(58) Field of Classification Search
CPC ......... B24B 37/20; B24B 37/22; B24B 37/24; B24B 37/245; B24B 37/26;
(Continued)

(56) References Cited

U.S. PATENT DOCUMENTS 2,001,911 A   5/1935  Wooddell et al.
3,357,598 A   12/1967 Kraft
(Continued)

FOREIGN PATENT DOCUMENTS

CN   1254441 A   5/2000
CN   1441017 A   9/2003
(Continued)

OTHER PUBLICATIONS

Japanese Office Action dated Sep. 27, 2022 for Application No. 2021-142982.
(Continued)

*Primary Examiner* — Joel D Crandall
(74) *Attorney, Agent, or Firm* — Patterson + Sheridan, LLP

(57) ABSTRACT

Implementations described herein generally relate to polishing articles and methods of manufacturing polishing articles used in polishing processes and cleaning processes. More particularly, implementations disclosed herein relate to composite polishing articles having graded properties. In one implementation, a polishing article is provided. The polishing article comprises one or more exposed first regions formed from a first material and having a first zeta potential and one or more second exposed regions formed from a second material and having a second zeta potential, wherein the first zeta potential is different from the second zeta potential.

26 Claims, 15 Drawing Sheets

Related U.S. Application Data

(60) Provisional application No. 62/249,025, filed on Oct. 30, 2015.

(51) Int. Cl.
*B24B 37/22* (2012.01)
*B24B 37/24* (2012.01)
*B24B 37/26* (2012.01)
*B24D 18/00* (2006.01)
*H01L 21/306* (2006.01)

(52) U.S. Cl.
CPC .......... *B24D 18/0045* (2013.01); *B33Y 80/00* (2014.12); *H01L 21/30625* (2013.01)

(58) Field of Classification Search
CPC .. B24D 18/0045; B24D 18/0063; B24D 3/20; B24D 3/22; B24D 3/24; B24D 3/26; B24D 3/28; B24D 3/30; B24D 3/32; B24D 3/34; B24D 3/348
See application file for complete search history.

(56) References Cited

U.S. PATENT DOCUMENTS

| | | |
|---|---|---|
| 3,741,116 A | 6/1973 | Green et al. |
| 4,459,779 A | 7/1984 | Shen |
| 4,575,330 A | 3/1986 | Hull |
| 4,836,832 A | 6/1989 | Tumey et al. |
| 4,841,680 A | 6/1989 | Hoffstein et al. |
| 4,844,144 A | 7/1989 | Murphy et al. |
| 4,942,001 A | 7/1990 | Murphy et al. |
| 4,960,673 A | 10/1990 | Beck et al. |
| 5,096,530 A | 3/1992 | Cohen |
| 5,120,476 A | 6/1992 | Scholz |
| 5,121,329 A | 6/1992 | Crump |
| 5,178,646 A | 1/1993 | Barber, Jr. et al. |
| 5,193,316 A | 3/1993 | Olmstead |
| 5,212,910 A * | 5/1993 | Breivogel ............... B24B 37/22 451/527 |
| 5,287,663 A | 2/1994 | Pierce et al. |
| 5,300,417 A | 4/1994 | Lushington et al. |
| 5,378,527 A | 1/1995 | Nakanishi et al. |
| 5,387,380 A | 2/1995 | Cima et al. |
| 5,470,368 A | 11/1995 | Culler |
| 5,533,923 A | 7/1996 | Shamouilian et al. |
| 5,605,499 A | 2/1997 | Sugiyama et al. |
| 5,605,760 A | 2/1997 | Roberts |
| 5,609,517 A | 3/1997 | Lofaro |
| 5,624,303 A | 4/1997 | Robinson |
| 5,626,919 A | 5/1997 | Chapman et al. |
| 5,645,471 A | 7/1997 | Strecker |
| 5,664,986 A | 9/1997 | Roh |
| 5,690,540 A | 11/1997 | Elliott et al. |
| 5,738,574 A | 4/1998 | Tolles et al. |
| 5,778,481 A | 7/1998 | Amsden et al. |
| 5,795,218 A | 8/1998 | Doan et al. |
| 5,876,268 A | 3/1999 | Lamphere et al. |
| 5,876,490 A | 3/1999 | Ronay |
| 5,888,121 A | 3/1999 | Kirchner et al. |
| 5,900,164 A | 5/1999 | Budinger et al. |
| 5,905,099 A | 5/1999 | Everaerts et al. |
| 5,906,863 A | 5/1999 | Lombardi et al. |
| 5,910,471 A | 6/1999 | Christianson et al. |
| 5,919,082 A | 7/1999 | Walker et al. |
| 5,921,855 A | 7/1999 | Osterheld et al. |
| 5,932,040 A | 8/1999 | Audisio |
| 5,932,290 A | 8/1999 | Lombardi et al. |
| 5,940,674 A | 8/1999 | Sachs et al. |
| 5,944,583 A | 8/1999 | Cruz et al. |
| 5,951,380 A | 9/1999 | Kim |
| 5,965,460 A | 10/1999 | Rach et al. |
| 5,976,000 A | 11/1999 | Hudson |
| 5,984,769 A | 11/1999 | Bennett et al. |
| 5,989,111 A | 11/1999 | Lamphere et al. |
| 5,989,470 A | 11/1999 | Doan et al. |
| 6,017,609 A | 1/2000 | Akamatsu et al. |
| 6,022,264 A | 2/2000 | Cook et al. |
| 6,029,096 A | 2/2000 | Manners et al. |
| 6,036,579 A * | 3/2000 | Cook .................... B24D 18/00 451/36 |
| 6,062,968 A | 5/2000 | Sevilla et al. |
| 6,077,581 A | 6/2000 | Kuramochi et al. |
| 6,090,475 A | 7/2000 | Robinson et al. |
| 6,095,902 A | 8/2000 | Reinhardt |
| 6,117,000 A | 9/2000 | Anjur et al. |
| 6,121,143 A | 9/2000 | Messner et al. |
| 6,122,564 A | 9/2000 | Koch et al. |
| 6,126,532 A | 10/2000 | Sevilla et al. |
| 6,155,910 A | 12/2000 | Lamphere et al. |
| 6,176,992 B1 | 1/2001 | Talieh |
| 6,206,759 B1 | 3/2001 | Agarwal et al. |
| 6,210,254 B1 | 4/2001 | Cook et al. |
| 6,213,845 B1 | 4/2001 | Elledge |
| 6,228,133 B1 | 5/2001 | Thurber et al. |
| 6,231,629 B1 | 5/2001 | Christianson et al. |
| 6,231,942 B1 | 5/2001 | Blizard et al. |
| 6,241,596 B1 | 6/2001 | Osterheld et al. |
| 6,254,460 B1 | 7/2001 | Walker et al. |
| 6,257,973 B1 | 7/2001 | Fernand Guiselin |
| 6,267,641 B1 | 7/2001 | Vanell et al. |
| 6,273,806 B1 | 8/2001 | Bennett et al. |
| 6,309,276 B1 | 10/2001 | Tsai et al. |
| 6,309,282 B1 | 10/2001 | Wright et al. |
| 6,313,038 B1 | 11/2001 | Chopra et al. |
| 6,319,108 B1 | 11/2001 | Adefris et al. |
| 6,322,728 B1 | 11/2001 | Brodkin et al. |
| 6,325,706 B1 | 12/2001 | Krusell et al. |
| 6,328,634 B1 | 12/2001 | Shen et al. |
| 6,332,832 B1 | 12/2001 | Suzuki |
| 6,338,901 B1 | 1/2002 | Veerasamy |
| 6,361,411 B1 | 3/2002 | Chopra et al. |
| 6,361,832 B1 | 3/2002 | Agarwal et al. |
| 6,368,184 B1 | 4/2002 | Beckage |
| 6,390,890 B1 | 5/2002 | Molnar |
| 6,399,501 B2 | 6/2002 | Birang et al. |
| 6,402,604 B2 | 6/2002 | Guiselin |
| 6,423,255 B1 | 7/2002 | Hoechsmann et al. |
| 6,428,586 B1 | 8/2002 | Yancey |
| 6,454,634 B1 | 9/2002 | James et al. |
| 6,477,926 B1 | 11/2002 | Swisher et al. |
| 6,488,570 B1 | 12/2002 | James et al. |
| 6,500,053 B2 | 12/2002 | James et al. |
| 6,506,097 B1 | 1/2003 | Adams et al. |
| 6,518,162 B2 | 2/2003 | Ono et al. |
| 6,520,834 B1 | 2/2003 | Marshall |
| 6,520,847 B2 | 2/2003 | Osterheld et al. |
| 6,544,373 B2 | 4/2003 | Chen et al. |
| 6,548,407 B1 | 4/2003 | Chopra et al. |
| 6,569,373 B2 | 5/2003 | Napadensky |
| 6,582,283 B2 | 6/2003 | James et al. |
| 6,585,563 B1 | 7/2003 | Redeker et al. |
| 6,586,494 B2 | 7/2003 | Mejiritski et al. |
| 6,592,443 B1 | 7/2003 | Kramer et al. |
| 6,641,463 B1 | 11/2003 | Molnar |
| 6,641,471 B1 | 11/2003 | Pinheiro et al. |
| 6,645,061 B1 | 11/2003 | Bennett et al. |
| 6,682,402 B1 | 1/2004 | Roberts et al. |
| 6,684,704 B1 | 2/2004 | Obeng |
| 6,685,548 B2 | 2/2004 | Chen et al. |
| 6,692,338 B1 | 2/2004 | Kirchner |
| 6,699,115 B2 | 3/2004 | Osterheld et al. |
| 6,719,818 B1 | 4/2004 | Birang et al. |
| 6,736,709 B1 | 5/2004 | James et al. |
| 6,736,714 B2 | 5/2004 | Dudovicz |
| 6,746,225 B1 | 6/2004 | McHugh |
| 6,746,311 B1 | 6/2004 | Kessel |
| 6,749,485 B1 | 6/2004 | James et al. |
| 6,749,714 B1 | 6/2004 | Ishikawa et al. |
| 6,773,474 B2 | 8/2004 | Koehnle et al. |
| 6,783,436 B1 | 8/2004 | Muldowney |
| 6,790,883 B2 | 9/2004 | Ogawa et al. |
| 6,796,880 B2 | 9/2004 | Redeker et al. |
| 6,811,680 B2 | 11/2004 | Chen et al. |

(56) References Cited

U.S. PATENT DOCUMENTS

| | | |
|---|---|---|
| 6,811,937 B2 | 11/2004 | Lawton |
| 6,815,570 B1 | 11/2004 | Negiz et al. |
| 6,833,046 B2 | 12/2004 | Wright |
| 6,838,149 B2 | 1/2005 | Lugg |
| 6,840,843 B2 | 1/2005 | Jones et al. |
| 6,843,711 B1 | 1/2005 | Muldowney |
| 6,847,014 B1 | 1/2005 | Benjamin et al. |
| 6,855,588 B1 | 2/2005 | Liao et al. |
| 6,860,793 B2 | 3/2005 | Budinger et al. |
| 6,860,802 B1 | 3/2005 | Vishwanathan et al. |
| 6,866,807 B2 | 3/2005 | Comb et al. |
| 6,869,350 B2 | 3/2005 | Roberts et al. |
| 6,875,096 B2 | 4/2005 | Park et al. |
| 6,875,097 B2 | 4/2005 | Grunwald |
| 6,887,137 B2 | 5/2005 | Lee et al. |
| 6,896,593 B2 | 5/2005 | Prasad |
| 6,913,517 B2 | 7/2005 | Prasad |
| 6,935,931 B2 | 8/2005 | Prasad |
| 6,955,588 B1 | 10/2005 | Anderson, II et al. |
| 6,984,163 B2 | 1/2006 | Roberts |
| 6,991,517 B2 | 1/2006 | Redeker et al. |
| 6,991,528 B2 | 1/2006 | Hu et al. |
| 6,998,166 B2 | 2/2006 | Prasad |
| 7,018,560 B2 | 3/2006 | Liu et al. |
| 7,029,747 B2 | 4/2006 | Huh et al. |
| 7,044,836 B2 | 5/2006 | Sun et al. |
| 7,059,949 B1 | 6/2006 | Elmufdi et al. |
| 7,059,950 B1 | 6/2006 | Muldowney |
| 7,077,879 B2 | 7/2006 | Ogawa et al. |
| 7,120,512 B2 | 10/2006 | Kramer et al. |
| 7,125,318 B2 | 10/2006 | Muldowney |
| 7,132,033 B2 | 11/2006 | Boldizar et al. |
| 7,166,017 B2 | 1/2007 | Minamihaba et al. |
| 7,169,030 B1 | 1/2007 | Kulp |
| 7,186,164 B2 | 3/2007 | Manens |
| 7,186,322 B2 | 3/2007 | Sato et al. |
| 7,192,336 B2 | 3/2007 | Kramer et al. |
| 7,195,544 B2 | 3/2007 | Prasad |
| 7,204,742 B2 * | 4/2007 | Prasad ............... B24B 37/20 |
| | | 451/527 |
| 7,234,224 B1 | 6/2007 | Naugler et al. |
| 7,252,871 B2 | 8/2007 | Crkvenac et al. |
| 7,264,641 B2 | 9/2007 | Prasad |
| 7,267,607 B2 | 9/2007 | Prasad |
| 7,267,610 B1 | 9/2007 | Elmufdi et al. |
| 7,268,173 B2 | 9/2007 | Graichen et al. |
| 7,300,340 B1 | 11/2007 | Elmufdi et al. |
| 7,300,619 B2 | 11/2007 | Napadensky et al. |
| 7,311,590 B1 | 12/2007 | Muldowney |
| 7,311,862 B2 | 12/2007 | Prasad |
| 7,332,104 B2 | 2/2008 | Minamihaba et al. |
| 7,357,698 B2 | 4/2008 | Choi |
| 7,371,160 B1 | 5/2008 | Cruz et al. |
| 7,377,840 B2 | 5/2008 | Deopura et al. |
| 7,382,959 B1 | 6/2008 | Jacobsen |
| 7,425,172 B2 | 9/2008 | Misra et al. |
| 7,425,250 B2 | 9/2008 | Basol et al. |
| 7,427,340 B2 | 9/2008 | Mavliev et al. |
| 7,435,161 B2 | 10/2008 | Prasad et al. |
| 7,435,165 B2 | 10/2008 | Prasad |
| 7,438,636 B2 | 10/2008 | Kulp et al. |
| 7,438,795 B2 | 10/2008 | Wylie et al. |
| 7,445,847 B2 | 11/2008 | Kulp |
| 7,455,571 B1 | 11/2008 | Kuo et al. |
| 7,497,885 B2 | 3/2009 | Kollodge |
| 7,513,818 B2 | 4/2009 | Miller et al. |
| 7,517,277 B2 | 4/2009 | Muldowney |
| 7,517,488 B2 | 4/2009 | Saikin |
| 7,520,798 B2 | 4/2009 | Muldowney |
| 7,524,345 B2 | 4/2009 | Nevoret et al. |
| 7,530,880 B2 * | 5/2009 | Bajaj ............... B23H 5/08 |
| | | 451/10 |
| 7,531,117 B2 | 5/2009 | Ederer et al. |
| 7,537,446 B2 | 5/2009 | James et al. |
| 7,582,127 B2 | 9/2009 | Vacassy et al. |
| 7,635,290 B2 | 12/2009 | Muldowney |
| 7,648,645 B2 | 1/2010 | Roberts et al. |
| 7,652,286 B2 | 1/2010 | Isobe et al. |
| 7,699,684 B2 | 4/2010 | Prasad |
| 7,704,122 B2 | 4/2010 | Misra et al. |
| 7,704,125 B2 | 4/2010 | Roy et al. |
| 7,731,568 B2 | 6/2010 | Shimomura et al. |
| 7,754,118 B2 | 7/2010 | Huh et al. |
| 7,762,870 B2 | 7/2010 | Ono et al. |
| 7,815,778 B2 | 10/2010 | Bajaj |
| 7,828,634 B2 | 11/2010 | Jiang et al. |
| 7,840,305 B2 | 11/2010 | Behr et al. |
| 7,846,008 B2 * | 12/2010 | Bajaj ............... B24B 37/26 |
| | | 451/529 |
| 7,871,309 B2 | 1/2011 | Ogawa et al. |
| 7,875,091 B2 | 1/2011 | Nevorct et al. |
| 7,926,521 B2 | 4/2011 | Izumoto et al. |
| 7,935,276 B2 | 5/2011 | Zhou et al. |
| 7,943,681 B2 | 5/2011 | Lee et al. |
| 7,976,901 B2 | 7/2011 | Kume et al. |
| 8,047,899 B2 | 11/2011 | Chen et al. |
| 8,053,487 B2 | 11/2011 | Ragain, Jr. et al. |
| 8,057,282 B2 | 11/2011 | Muldowney |
| 8,062,102 B2 | 11/2011 | Park et al. |
| 8,062,103 B2 | 11/2011 | Muldowney |
| 8,066,555 B2 | 11/2011 | Bajaj |
| 8,067,814 B2 | 11/2011 | Takehara et al. |
| 8,075,372 B2 | 12/2011 | Prasad |
| 8,075,745 B2 | 12/2011 | Bajaj |
| 8,083,820 B2 | 12/2011 | Kollodge et al. |
| 8,111,603 B2 | 2/2012 | Nishimura et al. |
| 8,118,641 B2 | 2/2012 | Kulp et al. |
| 8,142,860 B2 | 3/2012 | Vanmaele et al. |
| 8,142,869 B2 | 3/2012 | Kobayashi et al. |
| 8,172,648 B2 | 5/2012 | Lefevre et al. |
| 8,177,603 B2 | 5/2012 | Bajaj |
| 8,211,543 B2 | 7/2012 | Kato et al. |
| 8,257,545 B2 | 9/2012 | Loyack et al. |
| 8,260,447 B2 | 9/2012 | Mattes et al. |
| 8,282,866 B2 | 10/2012 | Hiraide |
| 8,287,793 B2 | 10/2012 | Deopura et al. |
| 8,288,448 B2 | 10/2012 | Kulp |
| 8,292,592 B2 | 10/2012 | Welch et al. |
| 8,292,692 B2 | 10/2012 | Bajaj |
| 8,337,282 B2 | 12/2012 | Park et al. |
| 8,349,706 B2 | 1/2013 | Noda |
| 8,377,623 B2 | 2/2013 | Fong |
| 8,380,339 B2 | 2/2013 | Misra et al. |
| 8,393,934 B2 | 3/2013 | Sung |
| 8,398,461 B2 | 3/2013 | Wang |
| 8,398,466 B2 | 3/2013 | Sung et al. |
| 8,409,976 B2 | 4/2013 | Hieslmair |
| 8,444,890 B2 | 5/2013 | Drury |
| 8,545,292 B2 | 10/2013 | Shinchi et al. |
| 8,546,717 B2 | 10/2013 | Stecker |
| 8,562,389 B2 | 10/2013 | Benvegnu et al. |
| 8,598,523 B2 | 12/2013 | Stecker et al. |
| 8,602,851 B2 | 12/2013 | Lombardo et al. |
| 8,647,179 B2 | 2/2014 | Nakayama et al. |
| 8,684,794 B2 | 4/2014 | Lefevre et al. |
| 8,690,978 B2 | 4/2014 | Arnaud et al. |
| 8,702,479 B2 | 4/2014 | Huang et al. |
| 8,709,114 B2 | 4/2014 | Cantrell et al. |
| 8,715,035 B2 | 5/2014 | Roy et al. |
| 8,734,206 B2 | 5/2014 | Chang et al. |
| 8,784,721 B2 | 7/2014 | Philippi et al. |
| 8,801,949 B2 | 8/2014 | Lakrout et al. |
| 8,821,214 B2 | 9/2014 | Joseph |
| 8,845,852 B2 | 9/2014 | Nakamori et al. |
| 8,853,082 B2 | 10/2014 | Hanano et al. |
| 8,853,527 B2 | 10/2014 | Hieslmair |
| 8,864,859 B2 | 10/2014 | Roy et al. |
| 8,883,392 B2 | 11/2014 | Napadensky et al. |
| 8,888,480 B2 | 11/2014 | Yoo et al. |
| 8,894,799 B2 | 11/2014 | Lakrout |
| 8,932,116 B2 | 1/2015 | Deopura et al. |
| 8,932,511 B2 | 1/2015 | Napadensky |
| 8,968,058 B2 | 3/2015 | Kerprich et al. |
| 8,980,749 B1 | 3/2015 | Itai et al. |

(56) References Cited

U.S. PATENT DOCUMENTS

| | | | |
|---|---|---|---|
| 8,986,585 B2 | 3/2015 | Cantrell et al. |
| 9,017,140 B2 | 4/2015 | Allison et al. |
| 9,033,764 B2 | 5/2015 | Kitamura et al. |
| 9,067,297 B2 | 6/2015 | Allison et al. |
| 9,067,298 B2 | 6/2015 | Lefevre et al. |
| 9,067,299 B2 | 6/2015 | Bajaj et al. |
| 9,068,085 B2 | 6/2015 | Kim et al. |
| 9,089,943 B2 | 7/2015 | Lipson |
| 9,108,291 B2 | 8/2015 | Lakrout |
| 9,126,304 B2 | 9/2015 | Kimura |
| 9,138,858 B2 | 9/2015 | Benvegnu et al. |
| 9,152,006 B2 | 10/2015 | Farrand et al. |
| 9,152,340 B2 | 10/2015 | Wu et al. |
| 9,156,124 B2 | 10/2015 | Allison et al. |
| 9,162,340 B2 | 10/2015 | Joseph et al. |
| 9,162,341 B2 | 10/2015 | LeFevre et al. |
| 9,211,628 B2 | 12/2015 | Allison et al. |
| 9,216,546 B2 | 12/2015 | DeSimone et al. |
| 9,254,545 B2 | 2/2016 | Park |
| 9,259,820 B2 | 2/2016 | Qian et al. |
| 9,259,821 B2 | 2/2016 | Qian et al. |
| 9,278,424 B2 | 3/2016 | Roy et al. |
| 9,296,085 B2 | 3/2016 | Bajaj et al. |
| 9,308,620 B2 | 4/2016 | Schutte et al. |
| 9,314,897 B2 | 4/2016 | Qian et al. |
| 9,333,620 B2 | 5/2016 | Qian et al. |
| 9,352,443 B2 | 5/2016 | Suen et al. |
| 9,375,821 B2 | 6/2016 | Chen et al. |
| 9,375,822 B2 | 6/2016 | Hsu et al. |
| 9,393,740 B2 | 7/2016 | Okamoto et al. |
| 9,421,666 B2 | 8/2016 | Krishnan et al. |
| 9,457,520 B2 | 10/2016 | Bajaj et al. |
| 9,469,800 B2 | 10/2016 | Jung |
| 9,481,069 B2 | 11/2016 | Chen et al. |
| 9,505,952 B2 | 11/2016 | Reiss et al. |
| 9,587,127 B2 | 3/2017 | Herlihy et al. |
| 9,630,249 B2 | 4/2017 | Toyserkani et al. |
| 9,669,512 B2 | 6/2017 | Bajaj et al. |
| 9,718,129 B2 | 8/2017 | Ljungblad et al. |
| 9,744,724 B2 | 8/2017 | Bajaj et al. |
| 9,776,361 B2 | 10/2017 | Krishnan et al. |
| 9,868,230 B2 | 1/2018 | Dikovsky et al. |
| 9,873,180 B2 | 1/2018 | Bajaj et al. |
| 9,950,405 B2 | 4/2018 | Deng |
| 9,951,054 B2 | 4/2018 | Li et al. |
| 9,956,314 B2 | 5/2018 | Skaria et al. |
| 9,993,907 B2 | 6/2018 | Murugesh et al. |
| 10,005,236 B2 | 6/2018 | Yudovin-Farber et al. |
| 10,016,877 B2 | 7/2018 | Krishnan et al. |
| 10,029,405 B2 | 7/2018 | Bajaj et al. |
| 10,086,500 B2 | 10/2018 | Orilall et al. |
| 10,220,487 B2 | 3/2019 | Roy et al. |
| 10,245,704 B2 | 4/2019 | Eilers et al. |
| 10,322,491 B2 | 6/2019 | Orilall et al. |
| 10,335,994 B2 | 7/2019 | Napadensky et al. |
| 10,384,330 B2 | 8/2019 | Bajaj et al. |
| 10,391,605 B2 | 8/2019 | Ganapathiappan et al. |
| 10,399,201 B2 | 9/2019 | Ganapathiappan et al. |
| 10,406,599 B2 | 9/2019 | Ljungblad et al. |
| 10,406,801 B2 | 9/2019 | Bell et al. |
| 10,456,886 B2 | 10/2019 | Ganapathiappan et al. |
| 10,483,235 B2 | 11/2019 | Chiao et al. |
| 10,493,691 B2 | 12/2019 | Krishnan et al. |
| 10,537,974 B2 | 1/2020 | Bajaj et al. |
| 10,593,574 B2 | 3/2020 | Fung et al. |
| 10,618,141 B2 | 4/2020 | Chockalingam et al. |
| 10,675,789 B2 | 6/2020 | Dikovsky et al. |
| 10,744,714 B2 | 8/2020 | Lopez et al. |
| 10,773,509 B2 | 9/2020 | Ng et al. |
| 10,821,573 B2 | 11/2020 | Bajaj et al. |
| 10,875,145 B2 | 12/2020 | Bajaj et al. |
| 10,875,153 B2 | 12/2020 | Bajaj et al. |
| 10,876,073 B2 | 12/2020 | Ishida |
| 10,919,123 B2 | 2/2021 | Hariharan et al. |
| 10,953,515 B2 | 3/2021 | Ganapathiappan et al. |
| 2001/0008830 A1 | 7/2001 | Tolles et al. |
| 2001/0020448 A1 | 9/2001 | Vaartstra et al. |
| 2001/0029151 A1 | 10/2001 | Chopra |
| 2001/0031558 A1* | 10/2001 | Sun .................. B24B 37/0056 |
| | | 438/690 |
| 2001/0034089 A1 | 10/2001 | Yamazaki et al. |
| 2001/0041511 A1 | 11/2001 | Lack et al. |
| 2001/0046834 A1 | 11/2001 | Ramana et al. |
| 2002/0016139 A1 | 2/2002 | Hirokawa et al. |
| 2002/0058468 A1 | 5/2002 | Eppert et al. |
| 2002/0069591 A1 | 6/2002 | Yancey |
| 2002/0077036 A1 | 6/2002 | Roberts et al. |
| 2002/0083577 A1 | 7/2002 | Suzuki |
| 2002/0098701 A1* | 7/2002 | Hasegawa ............... B24B 37/24 |
| | | 438/692 |
| 2002/0112632 A1 | 8/2002 | Faibish |
| 2002/0137450 A1 | 9/2002 | Osterheld et al. |
| 2002/0173248 A1 | 11/2002 | Doan et al. |
| 2003/0019570 A1* | 1/2003 | Chen ..................... B24B 37/24 |
| | | 156/252 |
| 2003/0022611 A1 | 1/2003 | Bartlett et al. |
| 2003/0056870 A1 | 3/2003 | Comb et al. |
| 2003/0113509 A1 | 6/2003 | Lugg |
| 2003/0134581 A1 | 7/2003 | Wang et al. |
| 2003/0153253 A1 | 8/2003 | Hanamoto et al. |
| 2003/0153255 A1* | 8/2003 | Hasegawa ............ C09K 3/1454 |
| | | 451/526 |
| 2003/0166381 A1 | 9/2003 | Lee et al. |
| 2003/0181137 A1 | 9/2003 | Redeker et al. |
| 2003/0205325 A1 | 11/2003 | Boyd et al. |
| 2003/0220061 A1 | 11/2003 | Prasad |
| 2004/0003895 A1 | 1/2004 | Amano et al. |
| 2004/0014413 A1 | 1/2004 | Kawahashi et al. |
| 2004/0033758 A1 | 2/2004 | Wiswesser |
| 2004/0055223 A1 | 3/2004 | Ono et al. |
| 2004/0058623 A1 | 3/2004 | Lin et al. |
| 2004/0092108 A1 | 5/2004 | Yajima et al. |
| 2004/0106367 A1* | 6/2004 | Walker ................. B24B 37/245 |
| | | 451/528 |
| 2004/0126575 A1 | 7/2004 | Yoshida et al. |
| 2004/0133298 A1 | 7/2004 | Toyserkani et al. |
| 2004/0154533 A1 | 8/2004 | Agarwal et al. |
| 2004/0171340 A1 | 9/2004 | Prasad |
| 2004/0173946 A1 | 9/2004 | Pfeifer et al. |
| 2004/0175451 A1 | 9/2004 | Maekawa et al. |
| 2004/0180611 A1 | 9/2004 | Tajima et al. |
| 2004/0187714 A1 | 9/2004 | Napadensky et al. |
| 2004/0198185 A1 | 10/2004 | Redeker et al. |
| 2004/0224616 A1 | 11/2004 | Shiho et al. |
| 2004/0266326 A1 | 12/2004 | Shiho et al. |
| 2005/0003189 A1 | 1/2005 | Bredt et al. |
| 2005/0016868 A1 | 1/2005 | Basol et al. |
| 2005/0020082 A1 | 1/2005 | Vishwanathan et al. |
| 2005/0032464 A1 | 2/2005 | Swisher et al. |
| 2005/0062900 A1 | 3/2005 | Kim |
| 2005/0086869 A1* | 4/2005 | Park ........................ B24B 37/26 |
| | | 51/297 |
| 2005/0098540 A1 | 5/2005 | Prasad |
| 2005/0101228 A1 | 5/2005 | Prasad |
| 2005/0110853 A1 | 5/2005 | Gardner et al. |
| 2005/0112998 A1 | 5/2005 | Matsuo et al. |
| 2005/0124262 A1 | 6/2005 | Manens |
| 2005/0153634 A1 | 7/2005 | Prasad et al. |
| 2005/0171224 A1 | 8/2005 | Kulp |
| 2005/0194681 A1 | 9/2005 | Hu et al. |
| 2005/0215177 A1 | 9/2005 | Prasad |
| 2005/0227590 A1* | 10/2005 | Sung ..................... B24D 11/001 |
| | | 451/526 |
| 2005/0250431 A1 | 11/2005 | Shih et al. |
| 2005/0260928 A1 | 11/2005 | Huh et al. |
| 2005/0260939 A1 | 11/2005 | Andrews et al. |
| 2005/0261150 A1 | 11/2005 | Yonker et al. |
| 2005/0274627 A1 | 12/2005 | Wylie et al. |
| 2005/0276967 A1 | 12/2005 | Prasad |
| 2005/0284536 A1 | 12/2005 | Kojima et al. |
| 2006/0019587 A1 | 1/2006 | Deopura et al. |
| 2006/0024434 A1 | 2/2006 | Wang et al. |
| 2006/0052040 A1 | 3/2006 | Prasad |
| 2006/0079159 A1 | 4/2006 | Naujok et al. |

(56) References Cited

U.S. PATENT DOCUMENTS

| | | |
|---|---|---|
| 2006/0096179 A1 | 5/2006 | Lu et al. |
| 2006/0125133 A1 | 6/2006 | Huh et al. |
| 2006/0160478 A1 | 7/2006 | Donohue et al. |
| 2006/0185256 A1 | 8/2006 | Nevoret et al. |
| 2006/0189269 A1 | 8/2006 | Roy et al. |
| 2006/0192315 A1 | 8/2006 | Farr et al. |
| 2006/0226567 A1 | 10/2006 | James et al. |
| 2006/0252900 A1 | 11/2006 | Bowman et al. |
| 2006/0276109 A1 | 12/2006 | Roy et al. |
| 2007/0007698 A1 | 1/2007 | Sano |
| 2007/0009606 A1 | 1/2007 | Serdy et al. |
| 2007/0032170 A1 | 2/2007 | Halley et al. |
| 2007/0037486 A1 | 2/2007 | Kang et al. |
| 2007/0054599 A1 | 3/2007 | Taylor et al. |
| 2007/0093185 A1 | 4/2007 | Naik |
| 2007/0117393 A1 | 5/2007 | Tregub et al. |
| 2007/0128874 A1 | 6/2007 | Shida et al. |
| 2007/0128991 A1 | 6/2007 | Yoon et al. |
| 2007/0149096 A1 | 6/2007 | Nishimura et al. |
| 2007/0204420 A1 | 9/2007 | Hornby et al. |
| 2007/0212979 A1* | 9/2007 | Preston ............... B24B 37/24 451/526 |
| 2007/0221287 A1 | 9/2007 | Izumoto |
| 2007/0235133 A1 | 10/2007 | Benassi |
| 2007/0235904 A1 | 10/2007 | Saikin |
| 2007/0243795 A1 | 10/2007 | Kobayashi et al. |
| 2007/0269987 A1 | 11/2007 | Nakano et al. |
| 2008/0004743 A1 | 1/2008 | Goers et al. |
| 2008/0009228 A1 | 1/2008 | Nagase et al. |
| 2008/0057845 A1 | 3/2008 | Prasad |
| 2008/0060734 A1 | 3/2008 | Stehle |
| 2008/0105818 A1 | 5/2008 | Cohen |
| 2008/0157436 A1 | 7/2008 | Patel et al. |
| 2008/0207100 A1 | 8/2008 | Roy et al. |
| 2008/0211141 A1 | 9/2008 | Deopura et al. |
| 2008/0220702 A1 | 9/2008 | Feng et al. |
| 2008/0255823 A1 | 10/2008 | Grant |
| 2008/0268760 A1 | 10/2008 | Bajaj et al. |
| 2008/0314878 A1 | 12/2008 | Cai et al. |
| 2009/0011679 A1 | 1/2009 | Bajaj et al. |
| 2009/0053976 A1 | 2/2009 | Roy et al. |
| 2009/0053983 A1 | 2/2009 | Hosaka et al. |
| 2009/0081927 A1 | 3/2009 | Grumbine et al. |
| 2009/0093201 A1 | 4/2009 | Kazuno et al. |
| 2009/0094902 A1 | 4/2009 | Hou |
| 2009/0105363 A1 | 4/2009 | Napadensky |
| 2009/0130956 A1 | 5/2009 | Ohta et al. |
| 2009/0133716 A1 | 5/2009 | Lee |
| 2009/0137121 A1 | 5/2009 | Hsu et al. |
| 2009/0169455 A1 | 7/2009 | Van Aert et al. |
| 2009/0206065 A1 | 8/2009 | Kruth et al. |
| 2009/0253353 A1 | 10/2009 | Ogawa et al. |
| 2009/0270019 A1 | 10/2009 | Bajaj |
| 2009/0308553 A1 | 12/2009 | Souzy et al. |
| 2009/0308739 A1 | 12/2009 | Riker et al. |
| 2009/0311955 A1 | 12/2009 | Kerprich et al. |
| 2009/0320379 A1 | 12/2009 | Jun et al. |
| 2009/0321979 A1 | 12/2009 | Hiraide |
| 2010/0007692 A1 | 1/2010 | Vanmaele et al. |
| 2010/0009612 A1 | 1/2010 | Park et al. |
| 2010/0011672 A1 | 1/2010 | Kincaid et al. |
| 2010/0087128 A1 | 4/2010 | Nakayama et al. |
| 2010/0112919 A1 | 5/2010 | Bonner et al. |
| 2010/0120249 A1 | 5/2010 | Hirose et al. |
| 2010/0120343 A1 | 5/2010 | Kato et al. |
| 2010/0130112 A1 | 5/2010 | Bajaj |
| 2010/0140850 A1 | 6/2010 | Napadensky et al. |
| 2010/0203815 A1* | 8/2010 | Bajaj ............... B24B 37/26 451/526 |
| 2010/0210197 A1 | 8/2010 | Matsumura et al. |
| 2010/0221489 A1 | 9/2010 | Lappalainen et al. |
| 2010/0255254 A1 | 10/2010 | Culler et al. |
| 2010/0323050 A1 | 12/2010 | Kumagai et al. |
| 2011/0011217 A1 | 1/2011 | Kojima |
| 2011/0014858 A1 | 1/2011 | Tsai et al. |
| 2011/0045199 A1 | 2/2011 | Cong |
| 2011/0048772 A1 | 3/2011 | Han |
| 2011/0059247 A1 | 3/2011 | Kuzusako et al. |
| 2011/0077321 A1 | 3/2011 | Napadensky |
| 2011/0130077 A1 | 6/2011 | Litke et al. |
| 2011/0171890 A1 | 7/2011 | Nakayama et al. |
| 2011/0180952 A1 | 7/2011 | Napadensky |
| 2011/0183583 A1 | 7/2011 | Joseph |
| 2011/0204538 A1 | 8/2011 | Drury |
| 2011/0277789 A1 | 11/2011 | Benson |
| 2011/0277877 A1 | 11/2011 | Stehle |
| 2012/0094487 A1 | 4/2012 | Kranz et al. |
| 2012/0178348 A1 | 7/2012 | Hsu et al. |
| 2012/0178845 A1 | 7/2012 | Napadensky et al. |
| 2012/0281334 A1 | 11/2012 | Sasaki et al. |
| 2012/0302148 A1* | 11/2012 | Bajaj ............... B29C 39/123 264/45.3 |
| 2012/0315830 A1 | 12/2012 | Joseph et al. |
| 2013/0012108 A1 | 1/2013 | Li et al. |
| 2013/0017769 A1 | 1/2013 | Kimura |
| 2013/0019570 A1 | 1/2013 | Weible |
| 2013/0048018 A1 | 2/2013 | Wargo et al. |
| 2013/0052917 A1 | 2/2013 | Park |
| 2013/0055568 A1 | 3/2013 | Dusel et al. |
| 2013/0059506 A1 | 3/2013 | Qian et al. |
| 2013/0059509 A1 | 3/2013 | Deopura et al. |
| 2013/0102231 A1 | 4/2013 | Joseph et al. |
| 2013/0122705 A1 | 5/2013 | Babu et al. |
| 2013/0137350 A1 | 5/2013 | Allison et al. |
| 2013/0139851 A1 | 6/2013 | Sin et al. |
| 2013/0172509 A1 | 7/2013 | Pawloski et al. |
| 2013/0183824 A1 | 7/2013 | Kwon et al. |
| 2013/0212951 A1 | 8/2013 | Ahn et al. |
| 2013/0231032 A1 | 9/2013 | Swedek et al. |
| 2013/0247477 A1 | 9/2013 | Cantrell et al. |
| 2013/0283700 A1* | 10/2013 | Bajaj ............... B24D 18/009 51/295 |
| 2013/0287980 A1 | 10/2013 | Burdzy et al. |
| 2013/0307194 A1 | 11/2013 | Elsey |
| 2013/0309951 A1 | 11/2013 | Benvegnu et al. |
| 2013/0316081 A1 | 11/2013 | Kovalcik et al. |
| 2013/0327977 A1 | 12/2013 | Singh et al. |
| 2013/0328228 A1 | 12/2013 | Pettis et al. |
| 2014/0024216 A1 | 1/2014 | Stender et al. |
| 2014/0034229 A1 | 2/2014 | Xu |
| 2014/0048970 A1 | 2/2014 | Batchelder et al. |
| 2014/0065932 A1 | 3/2014 | Kazuno et al. |
| 2014/0109784 A1 | 4/2014 | Daems et al. |
| 2014/0117575 A1 | 5/2014 | Kemperle et al. |
| 2014/0127973 A1 | 5/2014 | Motoshima et al. |
| 2014/0163717 A1 | 6/2014 | Das et al. |
| 2014/0206268 A1 | 7/2014 | Lefevre et al. |
| 2014/0230170 A1 | 8/2014 | Patel |
| 2014/0239527 A1 | 8/2014 | Lee |
| 2014/0324206 A1 | 10/2014 | Napadensky |
| 2014/0364044 A1 | 12/2014 | Ahn et al. |
| 2014/0370214 A1 | 12/2014 | Araki et al. |
| 2014/0370788 A1 | 12/2014 | Nair |
| 2015/0024233 A1 | 1/2015 | Gunther |
| 2015/0031781 A1 | 1/2015 | Landers et al. |
| 2015/0037601 A1 | 2/2015 | Blackmore |
| 2015/0038066 A1 | 2/2015 | Huang et al. |
| 2015/0043122 A1 | 2/2015 | Eto et al. |
| 2015/0044951 A1 | 2/2015 | Bajaj et al. |
| 2015/0045928 A1 | 2/2015 | Perez et al. |
| 2015/0056421 A1 | 2/2015 | Yudovin-Farber et al. |
| 2015/0056892 A1 | 2/2015 | Vacassy et al. |
| 2015/0056895 A1 | 2/2015 | Fotou et al. |
| 2015/0061170 A1 | 3/2015 | Engel et al. |
| 2015/0065020 A1 | 3/2015 | Roy et al. |
| 2015/0072522 A1 | 3/2015 | Jung |
| 2015/0084238 A1 | 3/2015 | Bonassar et al. |
| 2015/0089881 A1 | 4/2015 | Stevenson et al. |
| 2015/0093977 A1 | 4/2015 | Deopura et al. |
| 2015/0115490 A1 | 4/2015 | Reinarz |
| 2015/0123298 A1 | 5/2015 | Napadensky |
| 2015/0126099 A1 | 5/2015 | Krishnan et al. |
| 2015/0129798 A1 | 5/2015 | Napadensky |
| 2015/0159046 A1 | 6/2015 | Dinega et al. |

(56) References Cited

U.S. PATENT DOCUMENTS

| | | |
|---|---|---|
| 2015/0174826 A1 | 6/2015 | Murugesh et al. |
| 2015/0216790 A1 | 8/2015 | Feng et al. |
| 2015/0221520 A1 | 8/2015 | Singh et al. |
| 2015/0252202 A1 | 9/2015 | Nerad |
| 2015/0375361 A1 | 12/2015 | Qian et al. |
| 2016/0052103 A1 | 2/2016 | Qian et al. |
| 2016/0068996 A1 | 3/2016 | Lau et al. |
| 2016/0101500 A1 | 4/2016 | Fung et al. |
| 2016/0107287 A1 | 4/2016 | Bajaj et al. |
| 2016/0107288 A1 | 4/2016 | Orilall et al. |
| 2016/0107290 A1 | 4/2016 | Bajaj et al. |
| 2016/0107295 A1 | 4/2016 | Bajaj et al. |
| 2016/0107381 A1 | 4/2016 | Krishnan et al. |
| 2016/0114458 A1 | 4/2016 | Bajaj et al. |
| 2016/0136787 A1 | 5/2016 | Bajaj et al. |
| 2016/0176021 A1 | 6/2016 | Orilall et al. |
| 2016/0221145 A1 | 8/2016 | Huang et al. |
| 2016/0229023 A1 | 8/2016 | Lugg et al. |
| 2016/0236279 A1 | 8/2016 | Ashton et al. |
| 2016/0252813 A1 | 9/2016 | Kitson |
| 2016/0257856 A1 | 9/2016 | Reiss et al. |
| 2016/0271869 A1 | 9/2016 | Van De Vrie et al. |
| 2016/0279757 A1 | 9/2016 | Qian et al. |
| 2016/0346997 A1 | 12/2016 | Lewis et al. |
| 2016/0347002 A1 | 12/2016 | Bajaj et al. |
| 2016/0354901 A1 | 12/2016 | Krishnan et al. |
| 2016/0375546 A1 | 12/2016 | Pai et al. |
| 2017/0036320 A1 | 2/2017 | Prasad |
| 2017/0100817 A1 | 4/2017 | Ganapathiappan et al. |
| 2017/0120416 A1 | 5/2017 | Chockalingam et al. |
| 2017/0133252 A1 | 5/2017 | Fung et al. |
| 2017/0136603 A1 | 5/2017 | Ganapathiappan et al. |
| 2017/0148539 A1 | 5/2017 | Prestayko et al. |
| 2017/0151648 A1 | 6/2017 | Huang et al. |
| 2017/0173865 A1 | 6/2017 | Dikovsky et al. |
| 2017/0182629 A1 | 6/2017 | Lehuu et al. |
| 2017/0203406 A1 | 7/2017 | Ganapathiappan et al. |
| 2017/0203408 A1 | 7/2017 | Ganapathiappan et al. |
| 2017/0203409 A1 | 7/2017 | Lefevre et al. |
| 2017/0239886 A1 | 8/2017 | Norikane |
| 2017/0259396 A1 | 9/2017 | Yamamura et al. |
| 2017/0259499 A1 | 9/2017 | Ng et al. |
| 2017/0274498 A1 | 9/2017 | Oh et al. |
| 2018/0043613 A1 | 2/2018 | Krishnan et al. |
| 2018/0100073 A1 | 4/2018 | Chopra et al. |
| 2018/0100074 A1 | 4/2018 | Chopra et al. |
| 2018/0100075 A1 | 4/2018 | Chopra et al. |
| 2018/0158707 A1 | 6/2018 | Hunter et al. |
| 2018/0161954 A1 | 6/2018 | Bajaj et al. |
| 2018/0229343 A1 | 8/2018 | Kim et al. |
| 2018/0236632 A1 | 8/2018 | Murugesh et al. |
| 2018/0339397 A1 | 11/2018 | Redfield |
| 2018/0339402 A1 | 11/2018 | Redfield et al. |
| 2018/0339447 A1 | 11/2018 | Redfield |
| 2018/0340104 A1 | 11/2018 | Hampson et al. |
| 2018/0371276 A1 | 12/2018 | Miyano |
| 2019/0030678 A1 | 1/2019 | Kumar et al. |
| 2019/0039204 A1 | 2/2019 | Chockalingam et al. |
| 2019/0047112 A1 | 2/2019 | Fu et al. |
| 2019/0202024 A1 | 7/2019 | Ganapathiappan et al. |
| 2019/0218697 A1 | 7/2019 | Nakayama et al. |
| 2019/0224809 A1 | 7/2019 | Ganapathiappan et al. |
| 2019/0299357 A1 | 10/2019 | Orilall et al. |
| 2019/0299537 A1 | 10/2019 | McClintock et al. |
| 2019/0337117 A1 | 11/2019 | Ganapathiappan et al. |
| 2020/0001433 A1 | 1/2020 | Bajaj et al. |
| 2020/0055161 A1 | 2/2020 | Chockalingham et al. |
| 2020/0070302 A1 | 3/2020 | Ganapathiappan et al. |
| 2020/0101657 A1 | 4/2020 | Krishnan et al. |
| 2020/0135517 A1 | 4/2020 | Fung et al. |
| 2020/0147750 A1 | 5/2020 | Bajaj et al. |
| 2020/0156311 A1 | 5/2020 | Rolland et al. |
| 2020/0230781 A1 | 7/2020 | Chockalingam et al. |
| 2020/0299834 A1 | 9/2020 | Bajaj et al. |
| 2020/0325353 A1 | 10/2020 | Sridhar et al. |
| 2021/0013014 A1 | 1/2021 | Sarode Vishwanath |
| 2021/0039167 A1 | 2/2021 | Ashton et al. |
| 2021/0107116 A1 | 4/2021 | Bajaj et al. |
| 2021/0187822 A1 | 6/2021 | Yudovin-Farber et al. |
| 2021/0220857 A1 | 7/2021 | Baker et al. |

FOREIGN PATENT DOCUMENTS

| | | |
|---|---|---|
| CN | 1531473 A | 9/2004 |
| CN | 1851896 A | 10/2006 |
| CN | 1897226 A | 1/2007 |
| CN | 200970715 Y | 11/2007 |
| CN | 201049437 Y | 4/2008 |
| CN | 101184817 A | 5/2008 |
| CN | 101315918 A | 12/2008 |
| CN | 101428404 A | 5/2009 |
| CN | 101612722 A | 12/2009 |
| CN | 201483382 U | 5/2010 |
| CN | 101778701 A | 7/2010 |
| CN | 102159361 A | 8/2011 |
| CN | 101642898 B | 9/2011 |
| CN | 202825512 U | 3/2013 |
| CN | 103561907 A | 2/2014 |
| CN | 203542340 U | 4/2014 |
| CN | 104285281 A | 1/2015 |
| CN | 104428386 A | 3/2015 |
| CN | 103465155 B | 5/2016 |
| DE | 19834559 A1 | 2/2000 |
| EP | 1078717 A3 | 7/2003 |
| EP | 1419876 B1 | 4/2008 |
| EP | 2431157 A1 | 3/2012 |
| EP | 2537675 A1 | 12/2012 |
| GB | 2362592 A | 11/2001 |
| JP | H07102724 B2 | 11/1995 |
| JP | H08132342 A | 5/1996 |
| JP | H11254542 A | 9/1999 |
| JP | H11347761 A | 12/1999 |
| JP | 2000061817 A | 2/2000 |
| JP | 2000-158343 A | 6/2000 |
| JP | 2001018163 A | 1/2001 |
| JP | 200228849 A | 1/2002 |
| JP | 2002151447 A | 5/2002 |
| JP | 3324643 B2 | 9/2002 |
| JP | 2003168661 A | 6/2003 |
| JP | 2003303793 A | 10/2003 |
| JP | 2004235446 A | 8/2004 |
| JP | 3566430 B2 | 9/2004 |
| JP | 2004243518 A | 9/2004 |
| JP | 2004281685 A | 10/2004 |
| JP | 2005074614 A | 3/2005 |
| JP | 3641956 B2 | 4/2005 |
| JP | 2005-294661 A | 10/2005 |
| JP | 3801100 B2 | 7/2006 |
| JP | 2006231464 A | 9/2006 |
| JP | 2006305650 A | 11/2006 |
| JP | 2007-005612 A | 1/2007 |
| JP | 2007-235001 A | 9/2007 |
| JP | 4077192 B2 | 4/2008 |
| JP | 4512529 B2 | 7/2010 |
| JP | 4693024 B2 | 6/2011 |
| JP | 4798713 B2 | 10/2011 |
| JP | 2012-210709 A | 11/2012 |
| JP | 2013-018056 A | 1/2013 |
| JP | 5143528 B2 | 2/2013 |
| JP | 5226359 B2 | 7/2013 |
| JP | 5248152 B2 | 7/2013 |
| JP | 5697889 B2 | 4/2015 |
| JP | 2016023209 A | 2/2016 |
| JP | 5994183 B2 | 9/2016 |
| JP | 6422325 B2 | 11/2018 |
| JP | 6584895 B2 | 10/2019 |
| KR | 10-2000-0075987 A | 12/2000 |
| KR | 2003-0020658 A | 3/2003 |
| KR | 20100028294 A | 3/2010 |
| TW | 200540960 A | 12/2005 |
| TW | I279287 B | 4/2007 |
| TW | 200817132 A | 4/2008 |
| TW | I319891 B | 1/2010 |
| TW | 201201962 A | 1/2012 |

(56) References Cited

FOREIGN PATENT DOCUMENTS

| | | |
|---|---|---|
| TW | I463003 B | 12/2014 |
| TW | 201510203 A | 3/2015 |
| WO | 9849723 | 11/1998 |
| WO | 0238688 A3 | 10/2002 |
| WO | 02085570 A2 | 10/2002 |
| WO | 03/103959 A1 | 12/2003 |
| WO | 2006003697 A1 | 1/2006 |
| WO | 2009158665 A1 | 12/2009 |
| WO | 2011/088057 A1 | 7/2011 |
| WO | 2012173885 A3 | 5/2013 |
| WO | 2013162856 A1 | 10/2013 |
| WO | 2014039378 A1 | 3/2014 |
| WO | 2015/111366 A1 | 7/2015 |
| WO | 2015120430 A1 | 8/2015 |

OTHER PUBLICATIONS

Chinese Office Action dated Aug. 11, 2022 for Application No. 202110382961.3.
Search Report for Taiwan Application No. 105134381 dated Aug. 14, 2019.
Office Action for Chinese Application No. 201680068254.4 dated Jul. 15, 2020.
Search Report for Chinese Application No. 201680068254.4 dated Jul. 9, 2020.
Office Action for U.S. Appl. No. 15/298,766 dated Jan. 25, 2019.
Final Office Action for U.S. Appl. No. 15/298,766 dated Sep. 5, 2019.
J.-G. Park, et al., Post-CMP Cleaning: Interaction between Particles and Surfaces, International Conference on Planarization/CMP Technology, Oct. 25-27, 2007, VDE Verlag CMBH, Berlin-Offenbach, 6 pp.
International Search Report and Written Opinion for International Application No. PCT/US2016/057811 dated Jan. 31, 2017.
Office Action for Japanese Application No. 2018-521856 dated Oct. 27, 2020.
Office Action for Chinese Application No. 201680068254.4 dated Oct. 11, 2019.
Search Report for Chinese Application No. 201680068254.4 dated Sep. 26, 2019.
Korean Office Action dated Jun. 27, 2023 for Application No. 10-2018-7015338.
Japanese Office Action dated Apr. 18, 2023 for Application No. 2021-142982.
Taiwan Office Action dated Mar. 9, 2023 for Application No. 111115373.
Wikipedia [online]; 3D Printing; 2013; 17 total pages.
3D Printing: The Next Industrial Revolution: Christopher Barnatt Publisher: CreateSpace Independent Publishing Platform (May 4, 2013) Language: English, ISBN-10: 148418176X ISBN-13: 978-1484181768.
C. Wong. "Damping Associated with Incipient Melting in Aluminum-Indium Alloys", David Taylor Research Center—SME 89-99. Jan. 1990.
Tammy Hickey et al. "Internal Friction and Modules Studies on Austempered Ductile Iron", Technical Report ARCCB-TR-98001. Jan. 1996. 24 pages.
Rodel. Rodel IC1000 CMP Pad. 1999. 2 pages.
Byoung-Ho Kwon et al. "Dishing and Erosion in STI CMP". System IC R&D Center, Hyundai Electronics Industries Co. Ltd. 1999 IEEE. 3 pages.
S. Raghavan et al. "Chemical Mechanical Planarization in Integrated Circuit Device Manufacturing". vol. 98-7. 1998. 19 pages.
Rajeev Bajaj et al. "Effect of Polishing Pad Material Properties on Chemical Mechanical Polishing (CMP) Processes". 1994. 8 pages.
Rodel. Rodel IC1010. 1998. 2 pages.
Peter Freeman et al. "A Study of the Variation of Physical Properties in Random Lots of Urethane Polishing Pads for CMP". A Rodel Publication. vol. 2, Issue 6. Jun. 1996. 8 Pages.
John J. Aklonis et al. "Introduction to Polymer Viscoelasticity". Second Edition. 1983. 6 pages.
Weidan Li et al. "The Effect of the Polishing Pad Treatments on the Chemical-Mechanical Polishing of SiO2 Films", Thin Solid Films 270 (1995). 6 pages.
Van Den Berg, Antje M.J. "Inkjet Printing of Polyurethane Colloidal Suspensions", www.rsc.org/softmatter. Jul. 13, 2006.
Yu-Lim Jun et al. "Slicing Bitmap Generation and Patterning Technique a SFF System Using UV-Resin", International Conference on Control, Automation and Systems 2007. 5 Pages.
H. Yang. "High Viscosity Jetting System for 3D Reactive Inkjet Printing", Additive Manufacturing and 3D Printing Group, University of Nottingham. 9 pages.
I Hermant et al. "A Comparative Study of Polyurethane-Poly(Methyl Methacrylate) Interpenetrating and Semi-1 Interprenetrating Polymer Networks", vol. 20, No. 1. pp. 85-89, 1984.
Lee M. Cook. "CMP Consumables II: Pad" Chapter 6. Semiconductors and Semimetals, vol. 63. Published 1999. Chemical Mechanical Polishing in Silicon Processing. ISBN: 978-0-12-752172-5.
Peter Krober et al. "Reactive Inkjet Printing of Polyurethanes", www.rsc.org/materials. Journal of Materials Chemistry. Jan. 6, 2009.
Plastics in Action; 3-D Printing Speeds Prototype Development dated May/Jun. 1998; 2 total pages.
The Dow Chemical Company—"Specialty Elastomers for Automotive TPO Compounds" brochure, Nov. 2006, 8 pages.
The Dow Chemical Company—"Dow VLDPE DFDB-1085 NT, Very Low Density Polyethylene Resin" Technical Data, UL Prospector, Oct. 2003, 2 pages.
Lubrizol Advanced Materials, Inc.—"Lubrizol Engineered Polymers, Estane 58144 TPU" Technical Data, Feb. 2014, 2 pages.
Sekisui Voltek, LLC—"Volara Type EO" Technical Data, Jan. 2010, 2 pages.
Rogers Corporation, High Performance Foams Division, Poron Microcellular Urethanes—Product Availability Booklet, May 1, 2015, 11 pages.
Andrews, Rodney J., et al.—"Glass Transition Temperatures of Polymers," Polymer Handbook, Fourth Edition, J. Brandrup et al., Editors, A Wiley Interscience Publication, John Wiley & Sons, Inc., 1999, VI / 193-198.
Crow—"Glass Transition Temperature," webpage, Polymer Properties Database, http://polymerdatabase.com/polymer%20physics/GlassTransition.html, 2015, printed Apr. 10, 2019, 2 pages.
Crow—"Glass Transition Temperatures," webpage, Polymer Properties Database, http://polymerdatabase.com/polymer%20physics/Polymer%20Tg%20C.html, 2015, printed Apr. 10, 2019, 6 pages.
HUPC—"Dipropylene Glycol Diacrylate (DPGDA)" webpage, CAS No. 57472-68-1_Radiation, http://www.union-pigment.com/china/radiation-curable-57472.html, printed Apr. 8, 2019, 2 pages.
Polysciences, Inc.—"Monomers Product Guide," 2012, 16 pages.
Whisnaut, David—"Polymer Chemistry: The Glass Transition" webpage, Engineering Libre Texts, https://eng.libretexts.org/Bookshelves/Materials_Schience?Supplemental_Modules_Materia . . . , printed Apr. 10, 2019, 2 pages.
Sigma-Aldrich—"Thermal Transitions of Homopolymers: Glass Transition & Melting Point" webpage, https://www.sigmaaldrich.com/technical-documents/articles/materials-science/polymer-scie . . . , printed Apr. 8, 2019, 3 pages.
Moylan, John—"Considerations for Measuring Glass Transition Temperature," webpage on Element Materials Technology's website, https://www.element.com/nucleus/2017/08/15/18/45/considerations-for-measuring-glass-transition-temperature, Feb. 19, 2019, 8 pages.
Shahrubudin, N., et al.—"An Overview on 3D Printing Technology: Technological, Materials, and Applications," 2nd International Conference on Sustainable Materials Processing and Manufacturing (SMPM 2019), Procedia Manufacturing, 35 (2019), published by Elsevier B.V., pp. 1286-1296.
Rao, Sunil M., The Effectiveness of Silane and Siloxane Treatments on the Superhydrophobicity and Icephobicity of Concrete Surfaces, Rao, PhD Thesis, 1-118.
Arkema, "Liquid Resins for UV Curling", N3XTDIMENSION. Sartomer's Custom Liquid Resin Systems. 3D-arkema.com.

(56) References Cited

OTHER PUBLICATIONS

GPS Safety Summary, "Tripropyleneglycol diacrylate", (TPGDA-SR 306)—Mar. 11, 2013.
Shyam Dev Maurya et al. "A Review on Acrylate-Terminated Urethane Oligomers and Polymers: Synthesis and Applications", Polymer-Plastics Technology and Engineering. ISSN:0360-2559 (Print) 1525-6111 (Online) Journal homepage: https://www.tandfonline.com/loi/lpte20.
UV/EB Curable Resins. Product Guide—Americas. www.allnex.com.
Office Action and Office Action Summary for Taiwan Application No. 109112576 dated Aug. 5, 2021.
Search Report for Taiwan Application No. 109112576 dated Jul. 7, 2021.
Communication pursuant to Article 94(3) EPC for European Application No. 15850855.6 dated Sep. 22, 2021.

* cited by examiner

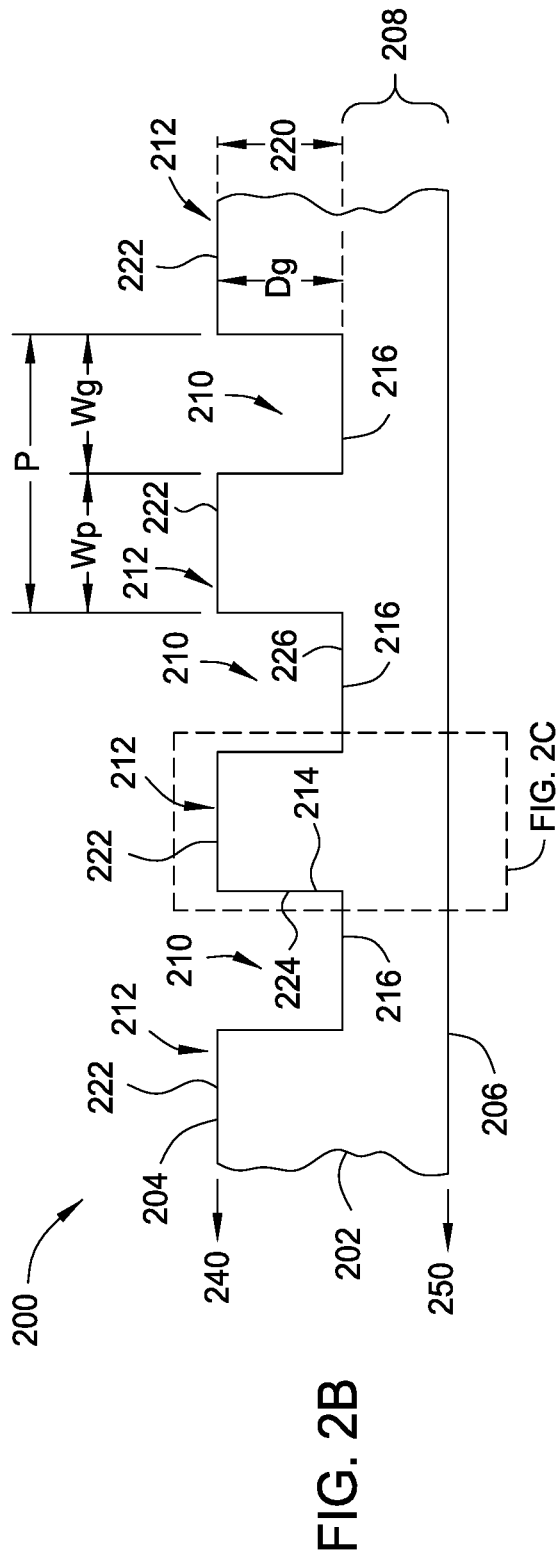
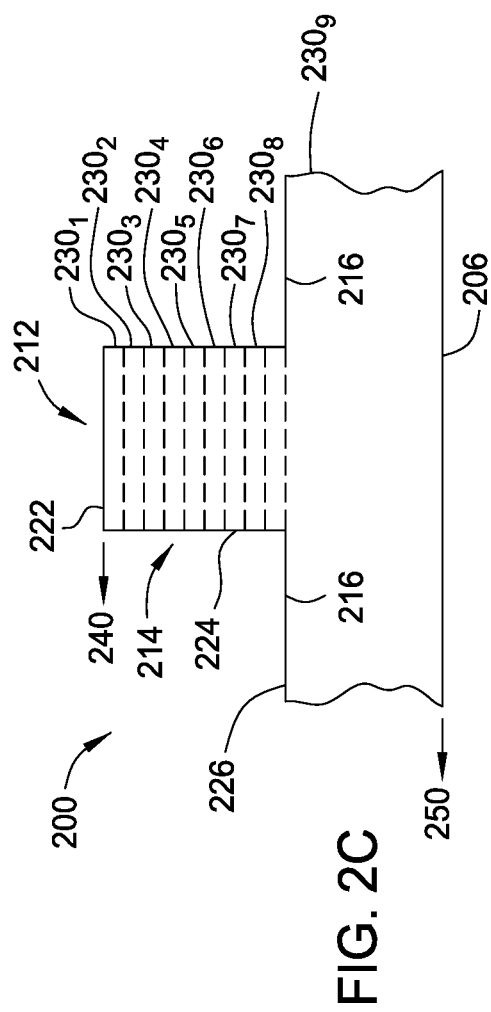
FIG. 2B
FIG. 2C

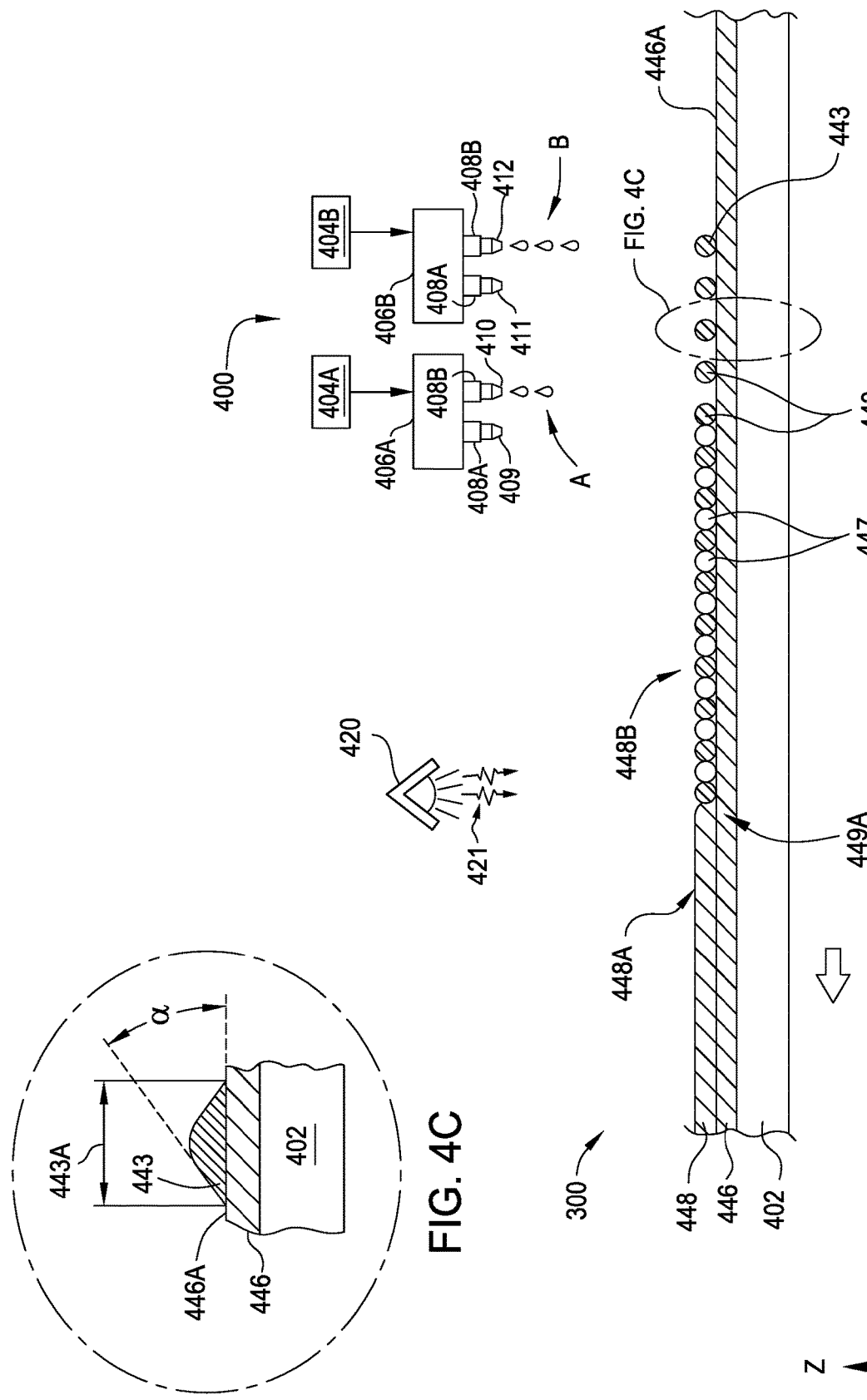

APPARATUS AND METHOD OF FORMING A POLISHING ARTICLE THAT HAS A DESIRED ZETA POTENTIAL

CROSS-REFERENCE TO RELATED APPLICATIONS

This application is a continuation of U.S. patent application Ser. No. 15/298,766, filed Oct. 20, 2016, which claims benefit of U.S. provisional patent application Ser. No. 62/249,025, filed Oct. 30, 2015. The aforementioned related patent application is incorporated herein by reference in its entirety.

BACKGROUND

Field

Implementations described herein generally relate to polishing articles and methods of manufacturing polishing articles used in polishing processes and cleaning processes. More particularly, implementations disclosed herein relate to composite polishing articles having graded properties.

Description of the Related Art

Chemical-mechanical polishing (CMP) processes are commonly used for planarization of substrates during fabrication of semiconductor devices. During CMP processing, a substrate is mounted on a carrier head with the device surface placed against a rotating polishing pad. The carrier head provides a controllable load on the substrate to push the device surface against the polishing pad. A polishing liquid, such as slurry with abrasive particles (e.g., silica ($SiO_2$), alumina ($Al_2O_3$), or ceria ($CeO_2$)), is typically supplied to the surface of the polishing pad.

As feature sizes decrease, planarization of both the front layers and the back layers by CMP processes becomes more critical. Unfortunately, byproducts of the CMP process, for example, abrasive particles and metallic contaminants generated during the CMP process may damage the surface of the substrate. In cases where abrasive polishing slurries are used, these abrasive particles may originate from the polishing slurry. In some cases, the abrasive particles may originate from the polishing pad. Additionally, abrasive particles may originate from the polished surface materials of the substrate and the polishing equipment. These particles may physically attach to the surface of the substrate due to the mechanical pressure generated by the polishing pad. Metallic contaminants arise from the abraded metal lines, metal ions in slurries, and the polishing equipment. These metallic contaminants may embed in the surface of the substrate and are often difficult to remove using subsequent cleaning processes. Current polishing pad designs and post-polishing cleaning processes often yield polished substrates suffering from defects caused by the byproducts of the CMP process.

Therefore, there is a need for a polishing article that provides an improved polishing process with reduced defects and methods for making the improved polishing pad.

SUMMARY

Implementations described herein generally relate to polishing articles and methods of manufacturing polishing articles used in polishing processes and cleaning processes. More particularly, implementations disclosed herein relate to composite polishing articles having graded properties. In one implementation, a polishing article is provided. The polishing article comprises one or more exposed first regions formed from a first material and having a first zeta potential and one or more second exposed regions formed from a second material and having a second zeta potential, wherein the first zeta potential is different from the second zeta potential.

In another implementation, a polishing article is provided. The polishing article comprises a composite polishing pad body, having a first grooved surface, a second flat surface opposite the first grooved surface and a gradient towards the first grooved surface with a varying zeta potential.

In yet another implementation, a method of forming a polishing article is provided. The method comprises depositing a plurality of composite layers with a 3D printer to reach a target thickness, wherein depositing the plurality of composite layers comprises depositing a first material having an exposed first region with a first zeta potential and depositing a second material having an exposed second region with a second zeta potential. The plurality of composite layers is solidified to form a composite pad body having one or more first features comprising the first material and one or more second features comprising the second material, wherein the one or more first features and the one or more second features form a unitary body.

In yet another implementation, a method of forming a polishing article may comprise depositing a plurality of composite layers with a 3D printer to reach a target thickness. The method of depositing the plurality of composite layers may comprise depositing a first material comprising a urethane acrylate having an exposed first region with a first zeta potential, and depositing a second material comprising a urethane acrylate having an exposed second region with a second zeta potential. The method may then include UV curing the plurality of composite layers to form a composite pad body having one or more first features comprising the first material and one or more second features comprising the second material, wherein the one or more first features and the one or more second features form a unitary body.

In yet another implementation, a polishing article may comprise a composite polishing pad body, having a first grooved surface, a second flat surface opposite the first grooved surface, and a material property gradient extending from the first grooved surface to the second flat surface, wherein the material property gradient comprises a varying zeta potential. In some cases, the zeta potential of the material property gradient may become more electropositive towards the first grooved surface. In other cases, the zeta potential of the material property gradient may become more electronegative towards the first grooved surface. The varying zeta potential of the material property gradient, which is measured using a neutral solution, may vary within a range of between about −70 mV and about +50 mV.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

FIG. 2B is a schematic cross-sectional view of a portion of the polishing pad of FIG. 2A;

FIG. 2C is an enlarged schematic cross-sectional view of a portion of the polishing pad of FIG. 2B;

FIG. 4B is a schematic view of a deposition section of the system for manufacturing polishing pads illustrated in FIG. 4A according to an implementation of the present disclosure;

FIG. 4C is an enlarged close-up schematic view of a dispensed droplet disposed on a surface of a region of the polishing pad illustrated in FIG. 4B according to an implementation of the present disclosure;

Figure 1:
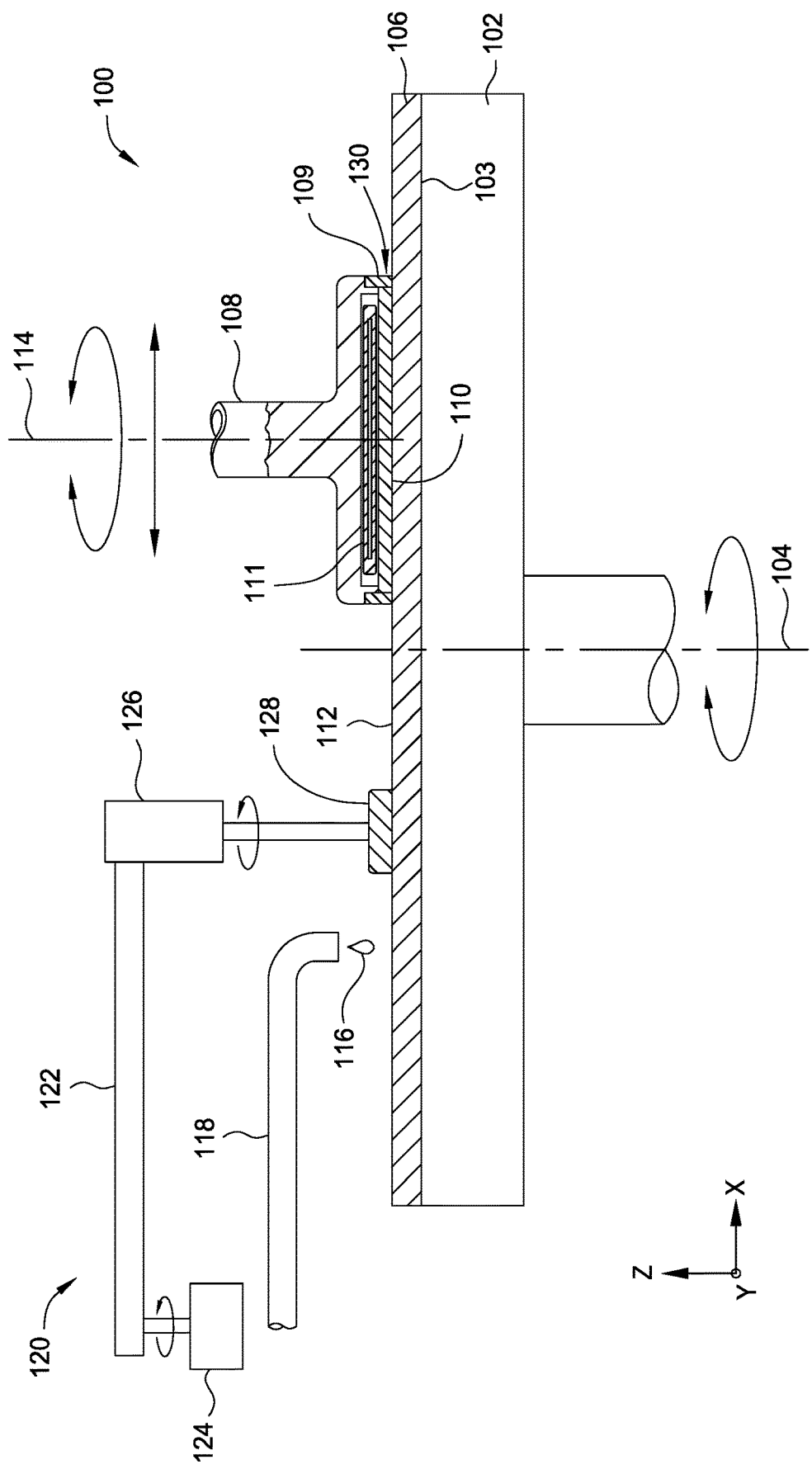
FIG. 1 is a schematic sectional view of a polishing station that may benefit from the polishing pad designs described herein.

To facilitate understanding, identical reference numerals have been used, where possible, to designate identical elements that are common to the figures. It is contemplated that elements and features of one implementation may be beneficially incorporated in other implementations without further recitation. It is to be noted, however, that the appended drawings illustrate only exemplary implementations of this disclosure and are therefore not to be considered limiting of its scope, for the disclosure may admit to other equally effective implementations.

DETAILED DESCRIPTION

Implementations described herein generally relate to polishing articles and methods of manufacturing polishing articles used in polishing processes and cleaning processes. More particularly, implementations disclosed herein relate to composite polishing articles having graded properties such as zeta potential. Zeta potential is the electrokinetic potential of a solid surface with respect to that of a liquid at the slipping plane. The electrokinetic potential of the solid surface provides an indirect measure of surface functionality. The addition or subtraction of protonated groups on solid surfaces generates a charge on the surface. The electrostatics between the solid and liquid interface has a large influence on the charge of the interfacial double layer.

Implementations of the present disclosure provide polishing articles and methods of forming polishing articles that have varying regions of zeta potential throughout the surface of the polishing article. The varying regions of zeta potential of the polishing article may be tuned based on the slurry composition systems used and the materials to be polished. This varying zeta potential may be tuned to transport active slurry to the interface between the polishing article and substrate while removing polishing byproducts and contaminants from the interface. For example, in some implementations, the polishing article has a more positive zeta potential near the polishing surface of the polishing article (i.e. the interface between the polishing article and the liquid interface) and a more negative zeta potential near the bottom of a groove of the polishing article. The more positive zeta potential repels unwanted positively charged ions (e.g., metal ions, dielectric material ions) from the liquid interface while the more negative zeta potential attracts the unwanted positive ions toward the bottom of the groove where the collected ions can be removed from the polishing article.

In polishing systems where the active slurry contains abrasives having a negative zeta potential (e.g., native silica, such as fumed silica), the abrasives may be attracted to the more positive zeta potential near the polishing surface and correspondingly repelled by the negative potential near the bottom of the groove. In some implementations where the active slurry contains an abrasives having a positive zeta potential (e.g., alumina) the polishing surface may be designed to have a more negative zeta potential relative to other regions of the surface of the polishing article to attract the abrasive to the interface between the polishing article and the liquid interface.

In some implementations described herein, this tunable zeta potential is achieved by addition of a zeta potential modifier to the prepolymer containing composition used to form the polishing article. The prepolymer containing composition may comprise one or more oligomers and one or more monomers, wherein at least one of the oligomers, monomers, or both has an ionic charge (e.g., cationic, anionic, or nonionic) which modulates the zeta potential of the polishing article by co-polymerization with the prepolymer components.

In some implementations described herein, a gradient of zeta potential is formed in a direction normal to the polishing surface of the polishing article or in the plane of the polishing surface of the polishing article. The gradient of zeta potential can vary from a high concentration to a low concentration in one direction or vice versa. In some implementations described herein, one or more regions of the polishing article may include more complex gradients of zeta potential such as a high/low/high or low/high/low zeta potential.

The average zeta potential of at least one of the exposed surfaces of the polishing article measured with the use of a neutral solution may range from about −70 mV to about +50 mV. The average zeta potential of at least one of the exposed surfaces of the polishing article measured with the use of a neutral solution may be at least −70 mV, −65 mV, −60 mV, −55 mV, −50 mV, −45 mV, −40 mV, −35 mV, −30 mV, −25 mV, −20 mV, −15 mv, −10 mv, −5 mV, 0 mV, 5 mV, 10, mV, 15 mV, 20 mV, 25 mV, 30 mv, 35, mv, 40 mV, or 45 mV. The average zeta potential of at least one of the exposed surfaces of the polishing article measured with the use of a neutral solution may be at most −65 mV, −60 mV, −55 mV, −50 mV, −45 mV, −40 mV, −35 mV, −30 mV, −25 mV, −20 mV, −15 mv, −10 mv, −5 mV, 0 mV, 5 mV, 10, mV, 15 mV, 20 mV, 25 mV, 30 mv, 35, mV, 40 mV, 45 mV, or 50 mV. In another implementation, the average zeta potential of at least one of the exposed surfaces of the polishing article measured with the use of a neutral solution may range from about −70 mV to about 0 mV (e.g., from about −50 mV to about −5 mV; from about −40 mV to about −10 mV; or from about −30 mV to about −20 mV. In another implementation, the average zeta potential of at least one of the exposed surfaces of the polishing article measured with the use of a neutral solution may range from about 0 mV to about 50 mV (e.g., from about 5 mV to about 40 mV; from about 10 mV to about 30 mV; or from about 20 mV to about 30 mV).

The following disclosure describes polishing articles and methods for manufacturing polishing articles. Certain details are set forth in the following description and in FIGS. 1-11 to provide a thorough understanding of various implementations of the disclosure. Other details describing well-known structures and systems often associated with polishing articles and methods of manufacturing polishing articles are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

It should be understood that although the polishing articles described herein are polishing pads, the implementations describe herein are also applicable to other polishing articles including, for example, buffing pads. Further, although the polishing articles described herein are discussed in relation to a chemical mechanical polishing process, the polishing articles and methods of manufacturing polishing articles described herein are also applicable to other polishing processes including polishing lenses and other processes including both abrasive and non-abrasive slurry systems. In addition, the polishing articles described herein may be used in at least the following industries: aerospace, ceramics, hard disk drive (HDD), MEMS and Nano-Tech, metalworking, optics and electro-optics, and semiconductor, among others.

In one implementation, an additive manufacturing process, such as a three dimensional printing (or 3-D printing) process may be used to produce (or make) the polishing articles described herein. In one implementation, a computer (CAD) model of the part is first made and then a slicing algorithm maps the information for every layer. In one non-limiting example of a 3-D printing process, a layer starts with a thin distribution of powder spread over the surface of a powder bed. A chosen binder material is then dispensed which selectively joins particles where the object is to be formed. Then a piston, which supports the powder bed and the part in progress, is lowered in order for the next powder layer to be formed. After each layer, the same process is repeated followed by a final heat treatment to make the object. In another example, the 3-D printing process may include, but is not limited to, a process in which droplets of a liquid precursor composition material are dispensed on a surface and are then cured to form the polishing article in layer-by-layer fashion, which is discussed further below. Since 3-D printing processes can exercise local control over the material composition, microstructure and surface texture, various (and previously inaccessible) geometries may be achieved with this method.

In one implementation, a polishing article as described herein may be represented in a data structure readable by a computer rendering device or a computer display device. The computer-readable medium may contain a data structure that represents the polishing article. The data structure may be a computer file, and may contain information about the structures, materials, textures, physical properties, or other characteristics of one or more articles. The data structure may also contain code, such as computer executable code or device control code that engages selected functionality of a computer rendering device or a computer display device. The data structure may be stored on the computer-readable medium. The computer-readable medium may include a physical storage medium such as a magnetic memory, floppy disk, or any convenient physical storage medium. The physical storage medium may be readable by the computer system to render the article represented by the data structure on a computer screen or a physical rendering device, which may be an additive manufacturing device, such as a 3D printer.

FIG. 1 is a schematic sectional view of a polishing station 100 that may be positioned within a larger chemical mechanical polishing (CMP) system that contains multiple polishing stations. The polishing station 100 includes a platen 102. The platen 102 may rotate about a central axis 104. A polishing pad 106 may be placed on the platen 102. While not intending to limit the disclosure provided herein, typically, the polishing pad 106 covers an upper surface 103 of the platen 102 which is at least one to two times larger than the size of the substrate 110 (e.g., substrate diameter) that is to be processed in the polishing station 100. In one example, the polishing pad 106 and platen 102 are between about 6 inches (150 millimeters) and about 40 inches (1,016 millimeters) in diameter. The polishing pad 106 includes a polishing surface 112 configured to contact and process one or more substrates 110. The platen 102 supports the polishing pad 106 and rotates the polishing pad 106 during polishing. A carrier head 108 may hold a substrate 110 being processed against the polishing surface 112 of the polishing pad 106. A polishing interface 130 is formed between the polishing surface 112 and the substrate 110. The carrier head 108 typically includes a flexible diaphragm 111 that is used to urge the substrate 110 against the polishing pad 106 and a carrier ring 109 that is used to correct for an inherently non-uniform pressure distribution found across the substrate's surface during the polishing process. The carrier head 108 may rotate about a central axis 114 and/or move in a sweeping motion to generate relative motions between the substrate 110 and the polishing pad 106.

During polishing, a polishing fluid 116, such as an abrasive slurry or non-abrasive slurry, may be supplied to the polishing surface 112 by a delivery arm 118. The polishing fluid 116 may contain abrasive particles, a pH adjuster and/or chemically active components to enable chemical mechanical polishing of the substrate. The slurry chemistry of 116 is designed to polish substrate surfaces and/or features that may include metals, metal oxides, and semimetal oxides. One will note that the surface topography of the polishing pad 106 is used to control the transport of the polishing fluid 116 (e.g., slurry) which interacts with the substrate 110 during the polishing process. For example, the surface topology of the polishing pad 106 may include grooves, channels and other protuberances, which may be disposed over, upon and within the polishing pad 106. The surface topology of the polishing pad may be formed by techniques including casting, molding, or machining.

In some implementations, the polishing station 100 includes a pad conditioning assembly 120 that includes a conditioning arm 122 and actuators 124 and 126. The actuators 124 and 126 are configured to cause a pad conditioning disk 128 (e.g., diamond impregnated disk) to be urged against and sweep across the polishing surface 112 at different times during the polishing process cycle to abrade and rejuvenate the polishing surface 112 of the polishing pad 106. During processing the moving polishing pad 106 and carrier head 108 apply mechanical energy to the substrate 110, which in combination with the chemicals and abrasive components in the polishing fluid 116, will cause the surface of the substrate to become planarized.

Figure 2A:
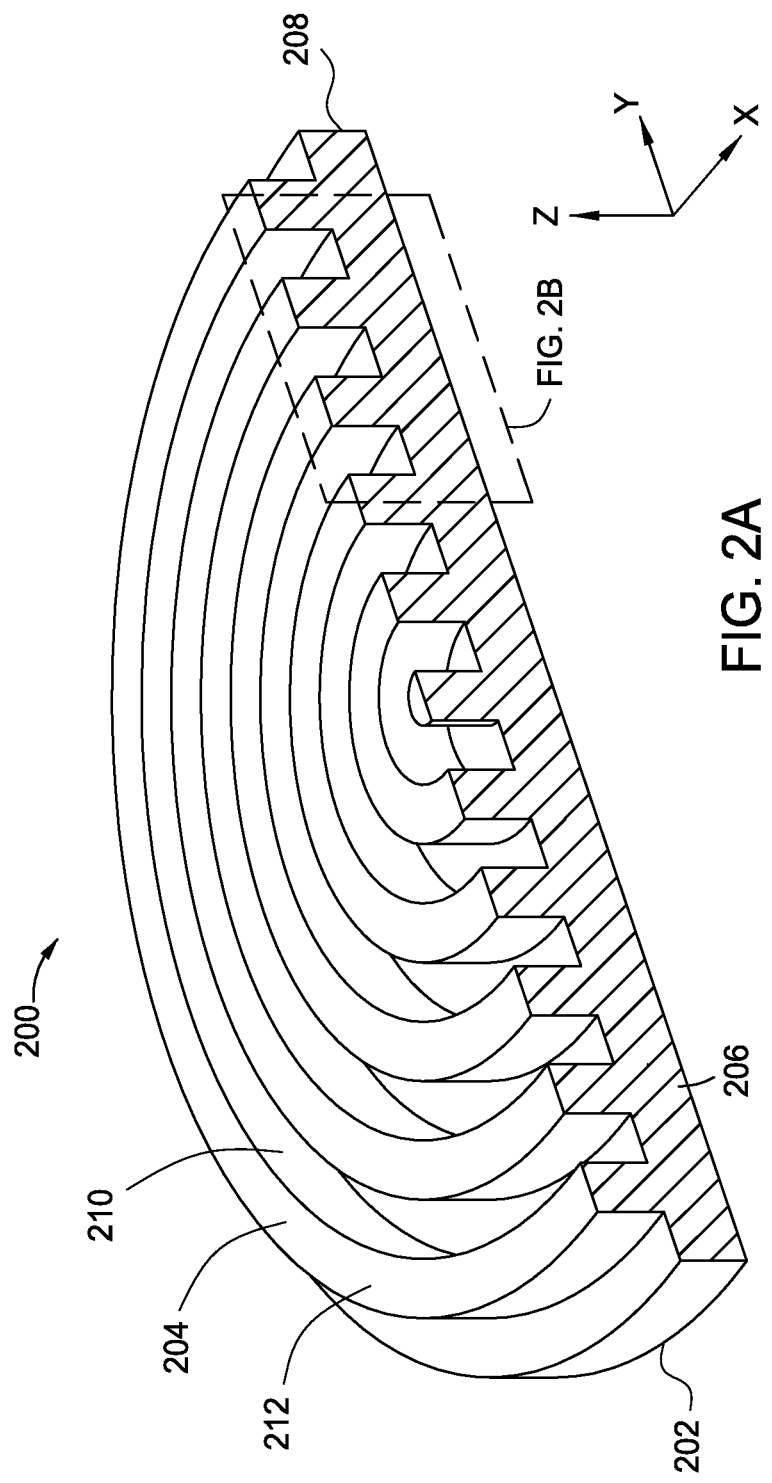
FIG. 2A is a schematic perspective view of a polishing pad having surfaces with regions of varying zeta potential according to one implementation of the present disclosure.

FIG. 2A is a schematic perspective view of a polishing pad 200 having surfaces with regions of varying zeta potential according to implementations of the present disclosure. FIG. 2B is a schematic cross-sectional view of a portion of the polishing pad 200 of FIG. 2A. FIG. 2C is an enlarged schematic cross-sectional view of a portion of the polishing pad of FIG. 2B. The polishing pad 200 may be used in polishing stations, such as polishing station 100, for polishing substrates by chemical mechanical polishing. The polishing pad 200 includes a pad body 202. The pad body 202 may be a homogenous pad body. The pad body 202 may alternately be a composite pad body. The pad body 202 may be formed by any suitable technique. Exemplary techniques for forming the pad body 202 include 3D printing, molding, casting, or sintering. The pad body 202 may include a plurality of exposed regions or surfaces.

In one implementation, at least two of the exposed regions or surfaces have different surface properties such as zeta potential. In one implementation, regions within each exposed surface are modified to have different zeta potential. In one implementation, the zeta potential of the regions or surfaces may be tuned so polishing byproducts, such as abrasive particles and metallic contaminants generated during the CMP process are easily removed from the polishing interface between the substrate and the polishing pad, while an active slurry that is disposed on the polishing pad is delivered or attracted to the interface between the substrate and the polishing pad.

In one implementation, the pad body 202 comprises one or more exposed first regions or surfaces formed from a first material and having a first zeta potential. The pad body 202 further comprises one or more second exposed regions formed from a second material and having a second zeta potential, wherein the first zeta potential is different from the second zeta potential. In one implementation, the first zeta potential measured with the use of a neutral solution is equal to or above −70 mV and less than 0 mV and the second zeta potential measured with the use of a neutral solution is equal to or above 0 mV and less than 50 mV. In another implementation, the first zeta potential measured with the use of a neutral solution is equal to or above 0 mV and less than 50 mV and the second zeta potential measured with the use of a neutral solution is equal to or above −70 mV and less than 0 mV.

Any suitable material or combination of materials having the desired zeta potential properties may be used to form the pad body 202. In one implementation, the pad body may be formed from one or more thermoplastic polymers, thermoset polymers, or both thermoplastic and thermoset polymers. For example, the pad body 202 may be formed from thermoplastic polymers, such as polyurethane, polypropylene, polystyrene, polyacrylonitrile, polymethyl methacrylate, polychlorotrifluoroethylene, polytetrafluoroethylene, polyoxymethylene, polycarbonate, polyimide, polyetheretherketone, polyphenylene sulfide, polyether sulfone, acrylonitrile butadiene styrene (ABS), polyetherimide, polyamides, melamines, polyesters, polysulfones, polyvinyl acetates, fluorinated hydrocarbons, and the like, and acrylates, copolymers, grafts, and mixtures thereof. The pad body 202 may be formed from thermoplastic polymers that include, for example, polyurethane, acrylate, an epoxy, acrylonitrile butadiene styrene (ABS), polyetherimide, or polyamde. In one implementation, different polymers having different zeta potentials are used to form each exposed surface. In another implementation, the thermoplastic polymer is modified with various zeta potential modifiers to achieve exposed surfaces having different zeta potentials as described herein.

In one implementation, the pad body 202 includes a plurality of layers that may be formed in a stacked orientation. Materials having different zeta potential may be used to form at least part of the different layers of the plurality of layers. At least two of the layers of the plurality of layers each have an exposed surface having a different zeta potential than an exposed surface of at least one other layer.

The pad body 202 includes a first, polishing surface 204 and a second, flat surface 206 opposite the first, polishing surface 204. The pad body 202 includes a lower portion 208 with a plurality of grooves 210 or channels extending above the lower portion 208 of the pad body 202. The plurality of grooves 210 or channels are disposed in the polishing surface 204 forming a grooved surface of the polishing pad 200. The grooves 210 may be any suitable shape. The grooves 210 may be circular. In some implementations where the grooves are circular, the grooves 210 may be concentric with each other.

The grooves 210 are spaced with a pitch P. The pitch P, as shown most clearly by FIG. 2B, is the radial distance between adjacent grooves. Between each groove is a feature 212 or partition having a width Wp. The feature 212 may be any suitable shape. The feature 212 may be an annular feature. Each groove 210 includes walls 214, which terminate in a base portion 216. As shown in FIG. 2B, the base portion 216 may have a rectangular-shaped profile. Alternately, the base portion 216 may have a U-shaped profile. Each groove 210 may have a depth Dg and a width Wg. The walls 214 may be generally perpendicular and terminate at base portion 216.

In one implementation, a height 220 of the features 212 is higher than the base portion 216 of each groove 210 so that upper surfaces 222 of the features 212 protrude from the lower portion 208 of the pad body 202. Grooves 210 or channels are formed between the features 212 and the base portion 216. During polishing, the upper surfaces 222 of the features 212 form the polishing surface 204 that contacts the substrate, while the grooves 210 retain the polishing fluid.

In one implementation, a width Wp of the feature 212 may be between about 250 microns to about 2 millimeters. A width Wg of the grooves 210 may be between about 250 microns to about 2 millimeters. The pitch "P" between the features 212 may be between about 0.5 millimeters to about 5 millimeters. The width Wp of the feature 212, the width Wg of the groove 210, and/or the pitch P may vary across a radius of the polishing pad 200 to zones of varied hardness.

The pad body 202 may include a plurality of exposed surfaces. In one implementation, at least a portion of two of the exposed surfaces of the plurality of surfaces has different surface properties such as zeta potential. In one implementation, regions within each exposed surface are modified to have different zeta potentials. The exposed surface may be selected to form a gradient with an increasing zeta potential. In one implementation, the exposed surfaces are selected from the upper surface 222 of the feature 212, a surface 224 of the wall 214, and a surface 226 of the base portion 216. For example, in one implementation, at least a portion of the upper surface 222 of the feature 212 comprises a first material having a first zeta potential, at least a portion of a surface 224 of the wall 214 comprises a material having a second zeta potential, and at least a portion of a surface 226 of the base portion 216 of the groove 210 comprises a third material having a third zeta potential. In another implementation, at least a portion of the upper surface 222 of the feature 212 and a portion of the surface 224 of the wall 214 have a first zeta potential and at least a portion of the surface 226 of the base portion 216 of the groove 210 comprises a second material having a second zeta potential different than the first zeta potential.

With reference to FIG. 2C, the pad body 202 may include a plurality of layers of material $230_1$-$230_9$ (collectively 230). Materials having different surface properties such as zeta potential may be used to form each of the different layers. At least two of the layers of the plurality of layers of material $230_1$-$230_9$ each have an exposed surface having a different zeta potential than an exposed surface of the other layer. It should be understood that the polishing pad 200 depicted in FIG. 2C comprising nine layers is only exemplary and any number of layers of material 230 may be used to create the desired gradient of zeta potential.

In one implementation, the zeta potential is graded throughout the pad body 202. The zeta potential may be graded throughout the pad body 202 with a material property gradient (240→250) from the polishing surface 204 to the flat surface 206. In one implementation, the varying zeta potential of the material property gradient (240→250) measured with the use of a neutral solution varies within a range of between about −70 mV and about +50 mV. In one implementation, the gradient of zeta potential increases from the polishing surface 204 to the flat surface 206. For example, in one implementation, the one or more exposed first regions or surfaces and the one or more second regions or surfaces are arranged to form a gradient of zeta potential wherein the zeta potential increases from the polishing surface 204 to the flat surface 206. In another implementation, the zeta potential increases from the flat surface 206 to the polishing surface 204. For example, in one implementation, the upper surface 222 of the feature 212 comprises a first layer of material $230_1$ having a first zeta potential, at least a portion of the surface 224 of the wall 214 comprises a second layer of material (any combination of $230_2$-$230_8$) having a second zeta potential, and a surface 226 of the base portion 216 of the groove 210 comprises a third layer of material $230_8$ having a third zeta potential. In another implementation, layers of material $230_1$-$230_8$ have a first zeta potential and layer of material $230_9$ has a second zeta potential.

Figure 3A:
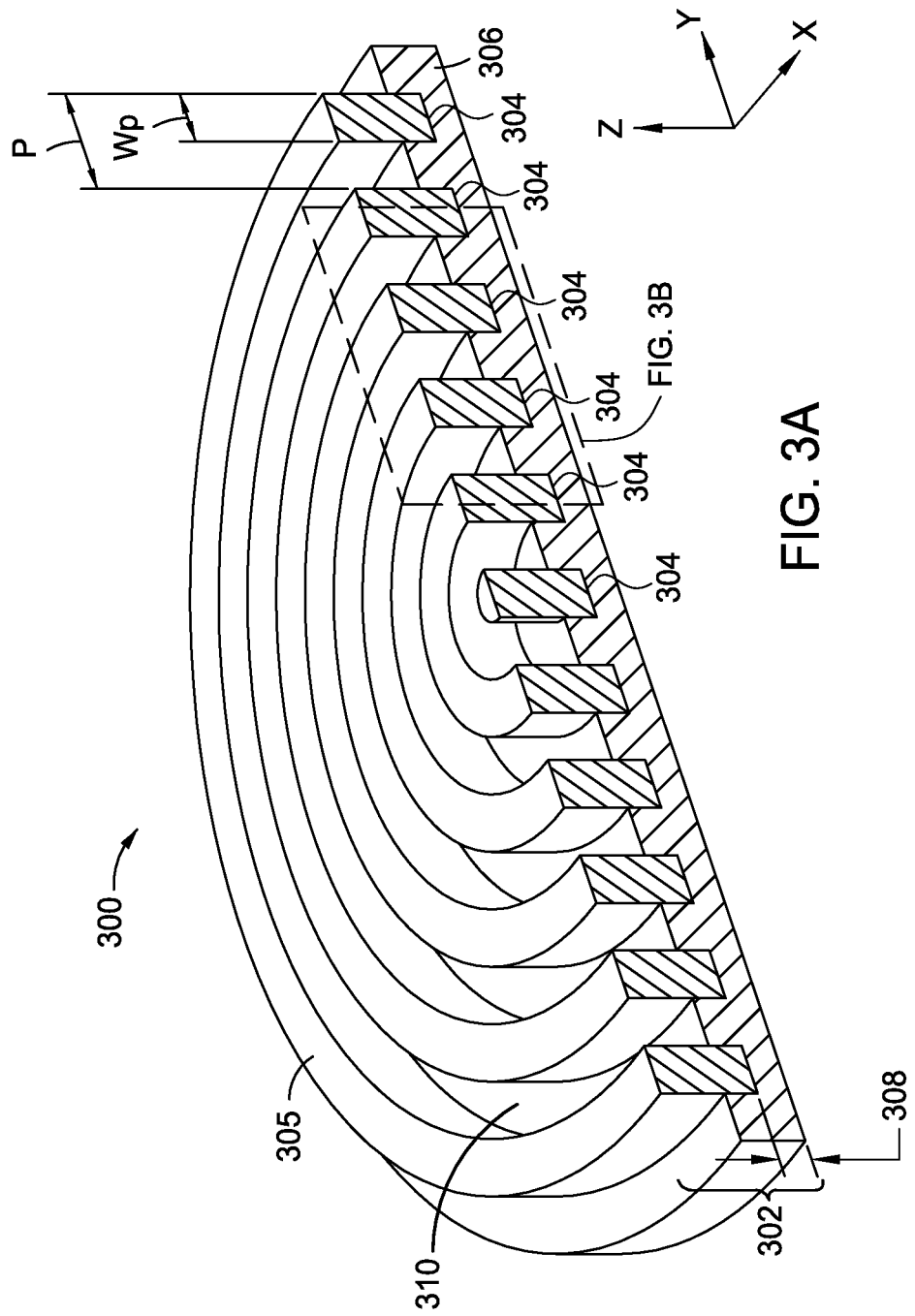
FIG. 3A is a schematic perspective view of a polishing pad having surfaces with regions of varying zeta potential according to another implementation of the present disclosure.
Figure 3B:
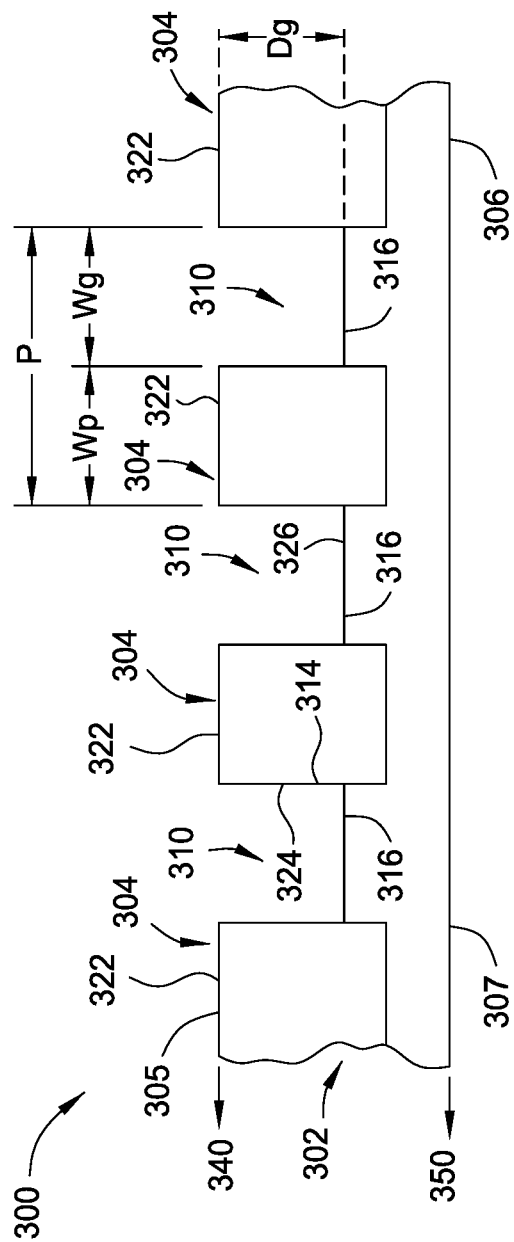
FIG. 3B is a schematic cross-sectional view of a portion of the polishing pad of FIG. 3A.

FIG. 3A is a schematic perspective view of a polishing pad 300 having surfaces with varying zeta potential according to another implementation of the present disclosure. FIG. 3B is a schematic cross-sectional view of a portion of the polishing pad 300 of FIG. 3A. The polishing pad 300 may be used in polishing stations, such as polishing station 100, for polishing substrates by chemical mechanical polishing. The polishing pad is similar to polishing pad 200 except that polishing pad 300 includes a plurality of discrete features having exposed regions or surfaces. In one implementation, at least two of the exposed regions or surfaces of the plurality of regions or surfaces have different surface properties such as zeta potential. In one implementation, the zeta potential of the regions or surfaces may be tuned so polishing byproducts, such as abrasive particles and metallic contaminants generated during the CMP process, are removed from the polishing interface between the substrate and the polishing pad and active slurry is delivered to the interface between the substrate the polishing pad.

The polishing pad 300 includes a composite pad body 302. The composite pad body 302 includes a first, polishing surface 305 and a second, flat surface 307 opposite the first, polishing surface 305. The composite pad body 302 includes one or more first polishing features 304 and one or more second polishing feature(s) 306. Portions of at least two of the exposed surfaces of at least one of the one or more first polishing features 304 and the one or more second polishing feature(s) 306 may be modified as described herein to have surfaces of varying zeta potential. The first polishing features 304 and the second polishing feature(s) 306 are discrete features that are joined together at boundaries to form the composite pad body 302. In one implementation, the first polishing features 304 may be a hard feature having a hardness of about 40 Shore D scale to about 90 Shore D scale. The second polishing feature(s) 306 may be an elastic feature having a hardness value between about 26 Shore A scale to about 95 Shore A scale.

Exemplary techniques for forming the composite pad body 302 include 3D printing, molding, casting, or sintering. The composite pad body 302 may include a plurality of layers, which each include regions of the second polishing feature(s) 306 and/or regions of the first polishing features 304 according to the design of the composite pad body 302 that are deposited by a 3D printer. The plurality of layers may then be cured, for example by UV light or by a heat source, to solidify and achieve a target hardness. After deposition and curing, a unitary composite pad body 302 is formed including the first polishing features 304 and the second polishing feature(s) 306 that are coupled or joined together with exposed surfaces of varying zeta potential.

Materials having different mechanical properties may be selected for the second polishing feature(s) 306 and the first polishing features 304 to achieve a target polishing process. The dynamic mechanical properties of the second polishing feature(s) 306 and the first polishing features 304 may be achieved by selecting different materials and/or choosing different curing processes used during the feature forming process. In one implementation, the second polishing feature(s) 306 may have a lower hardness value and a lower value of Young's modulus, while the first polishing features 304 may have a higher hardness value and a higher value of Young's modulus. In one implementation, the second polishing feature(s) 306 may have a lower zeta potential value, while the first polishing features 304 has a higher zeta potential value. In another implementation, the second polishing feature(s) 306 may have a higher zeta potential value, while the first polishing features 304 has a lower zeta potential value. As described herein, the surface properties, such as zeta potential, may be controlled within each feature and/or by the physical layout, pattern or combination of second polishing feature(s) 306 and first polishing features 304 within or across the polishing surface of the polishing pad.

The first polishing features 304 may be formed from one or more polymer materials. The first polishing features 304 may be formed from a single polymer material or a mixture of two or more polymers in combination with various zeta potential modifiers to achieve exposed surfaces having different zeta potentials as described herein. In one implementation, the first polishing features 304 may be formed from one or more thermoplastic polymers. The first polishing features 304 may be formed from thermoplastic polymers, such as polyurethane, polypropylene, polystyrene, polyacrylonitrile, polymethyl methacrylate, polychlorotrifluoroethylene, polytetrafluoroethylene, polyoxymethylene, polycarbonate, polyimide, polyetheretherketone, polyphenylene sulfide, polyether sulfone, acrylonitrile butadiene styrene (ABS), polyetherimide, polyamides, melamines, polyesters, polysulfones, polyvinyl acetates, fluorinated hydrocarbons, and the like, and acrylates, copolymers, grafts, and mixtures thereof. In another implementation, the thermoplastic polymer used to form the first polishing features 304 is modified with various zeta potential modifiers to achieve exposed regions having different zeta potentials as described herein. In one implementation, the first polishing features 304 may be formed from acrylates. For example, the first polishing features 304 may be polyurethane acrylate, polyether acrylate, or polyester acrylate. In another implementation, the first polishing features 304 may include one or more thermosetting polymers, such as epoxies, phenolics, amines, polyesters, urethanes, silicon, and acrylates, mixtures, copolymers, and grafts thereof.

In one implementation, the first polishing features 304 may be formed from a simulating plastic 3D printing material. In one implementation, abrasive particles may be embedded in the first polishing features 304 to enhance the polishing process. The material comprising the abrasive particles may be a metal oxide, such as ceria, alumina, silica, or a combination thereof, a polymer, an inter-metallic or ceramic.

The second polishing feature(s) 306 may be formed from one or more polymer materials. The second polishing feature(s) 306 may be formed from a single polymer material or a mixture of two more polymers to achieve target properties. In one implementation, the second polishing feature(s) 306 may be formed from storage modulus one or more of thermoplastic polymers. For example, the second polishing feature(s) 306 may be formed from thermoplastic polymers, such as polyurethane, polypropylene, polystyrene, polyacrylonitrile, polymethyl methacrylate, polychlorotrifluoroethylene, polytetrafluoroethylene, polyoxymethylene, polycarbonate, polyimide, polyetheretherketone, polyphenylene sulfide, polyether sulfone, acrylonitrile butadiene styrene (ABS), polyetherimide, polyamides, melamines, polyesters, polysulfones, polyvinyl acetates, fluorinated hydrocarbons, and the like, and acrylates, copolymers, grafts, and mixtures thereof. In another implementation, the thermoplastic polymer used to form the second polishing feature(s) 306 is modified with various zeta potential modifiers to achieve exposed regions having different zeta potentials as described herein. In one implementation, the second polishing feature(s) 306 may be formed from acrylates. For example, the second polishing feature(s) 306 may be polyurethane acrylate, polyether acrylate, or polyester acrylate. In another implementation, the second polishing feature(s) 306 may be formed from thermoplastic elastomers. In one implementation, the second polishing feature(s) 306 may be formed from a rubber-like 3D printing material.

In some implementations, the first polishing features 304 are generally harder and more rigid than the second polishing feature(s) 306, while the second polishing feature(s) 306 are softer and more flexible than the first polishing features 304. Materials and patterns of the first polishing features 304 and the second polishing feature(s) 306 may be selected to achieve a "tuned" bulk material of the polishing pad 300 with regions of varying zeta potentials. The polishing pad 300 formed with this "tuned" bulk material and varying zeta potential has various advantages, such as improved polishing results (e.g., reduced defects), reduced cost of manufacturing, elongated pad life. In one implementation, the "tuned" bulk material or the polishing pad as a whole may have hardness between about 65 shore A to about 75 shore D. Tensile strength of the polishing pad may be between 5 MPa to about 75 MPa. The polishing pad 300 may have about 5% to about 350% elongation to break. The polishing pad may have shear strength above about 10 mPa. The polishing pad 300 may have storage modulus between about 5 MPa to about 2000 MPa. The polishing pad may have stable storage modulus over temperature range 25 degrees Celsius to 90 degrees Celsius such that storage modulus ratio at E'30/E'90 falls within the range between about 6 to about 30, wherein E'30 is the storage modulus at 30 degrees Celsius and E'90 is the storage modulus at 90 degrees Celsius.

In one implementation, the materials of the first polishing features 304 and second polishing feature(s) 306 are chemically resistant to attack from the polishing slurry. In another implementation, the materials of the first polishing features 304 and second polishing feature(s) 306 are hydrophilic.

The composite pad body 302 includes a plurality of grooves 310 or channels extending above a lower portion 308 of the second polishing feature(s) 306 of the composite pad body 302. The plurality of grooves 310 or channels are disposed in the polishing surface 305 of the polishing pad 300. The grooves 310 may be any suitable shape. The grooves 310 may be circular. In some implementations where the grooves are circular, the grooves 310 may be concentric with each other.

The grooves 310 are spaced with a pitch P. The pitch P, as shown most clearly by FIG. 3B, is the radial distance between adjacent grooves. Between each groove is the first polishing feature 304 or partition having a width Wp. The first polishing feature 304 may be any suitable shape. The first polishing feature 304 may be an annular feature. Each groove 310 includes walls 314, which terminate in a base portion 316. As shown in FIG. 3B, the base portion 316 may have a rectangular-shaped profile. Alternately, the base portion 316 may have a U-shaped profile. Each groove 310 may have a depth Dg and a width Wg. The walls 314 may be generally perpendicular and terminate at the base portion 316.

In one implementation, the first polishing features 304 and the second polishing feature(s) 306 may be alternating concentric rings alternately arranged to form a composite pad body 302 that is circular. In one implementation, a height of the first polishing features 304 is higher than a height of the second polishing feature(s) 306 so that upper surfaces 322 of the first polishing features 304 protrude from the second polishing feature(s) 306. Grooves 310 or channels are formed between the first polishing features 304 and the second polishing feature(s) 306. During polishing, the upper surfaces 322 of the first polishing features 304 form the polishing surface 305 that contacts the substrate, while the grooves 310 retain the polishing fluid. In one implementation, the first polishing features 304 are thicker than the second polishing feature(s) 306 in a direction normal to a plane parallel to the composite pad body 302 so that the grooves 310 and/or channels are formed on the top surface of the composite pad body 302.

In one implementation, a width Wp of the first polishing features 304 may be between about 250 microns to about 2 millimeters. The pitch "P" between the first polishing features 304 may be between about 0.5 millimeters to about 5 millimeters. Each first polishing feature 304 may have a width within a range between about 250 microns to about 2 millimeters. The width Wp and/or the pitch "P" may vary across a radius of the polishing pad 300 to zones of varied hardness.

The composite pad body 302 may include a plurality of exposed surfaces. In one implementation, at least a portion of two of the exposed surfaces of the plurality of surfaces have different surface properties such as zeta potential. The exposed surface may be selected to form a gradient with an increasing zeta potential. In one implementation, the exposed surfaces are selected from the upper surface 322 of the first polishing feature 304, a surface 324 of the wall 314, and a surface 326 of the base portion 316. For example, in one implementation, at least a portion of the upper surface 322 of the first polishing feature 304 comprises a first material having a first zeta potential, at least a portion of a surface 324 of the wall 314 comprises a material having a second zeta potential, and at least a portion of a surface 326 of the base portion 316 of the groove 310 comprises a third material having a third zeta potential. In another implementation, at least a portion of the upper surface 322 of the first polishing feature 304 and a portion of the surface 324 of the wall 314 of the first polishing feature 304 have a first zeta potential and at least a portion of the surface 326 of the base portion 316 of the groove 310 comprises a second material having a second zeta potential different than the first zeta potential.

In one implementation, the composite pad body 302 may include a plurality of material layers as shown in FIG. 2C. Materials having different surface properties such as zeta potential may be used to form each of the different layers. At least two of the layers of the plurality of layer each have an exposed surface having a different zeta potential than an exposed surface of the other layer.

In one implementation, the zeta potential is graded throughout the composite pad body 302. The zeta potential may be graded throughout the composite pad body 302 with a material property gradient (340→350) from the polishing surface 305 to the flat surface 307. In one implementation, the gradient of zeta potential increases from the polishing surface 305 to the flat surface 307. In another implementation, the zeta potential increases from the flat surface 307 to the polishing surface 305. For example, in one implementation, the upper surface 322 of the first polishing feature 304 comprises a first layer of material having a first zeta potential, at least a portion of the surface 324 of the wall 314 comprises a second layer of material having a second zeta potential, and a surface 326 of the base portion 316 of the groove 310 comprises a third layer of material having a third zeta potential.

Figure 3C:
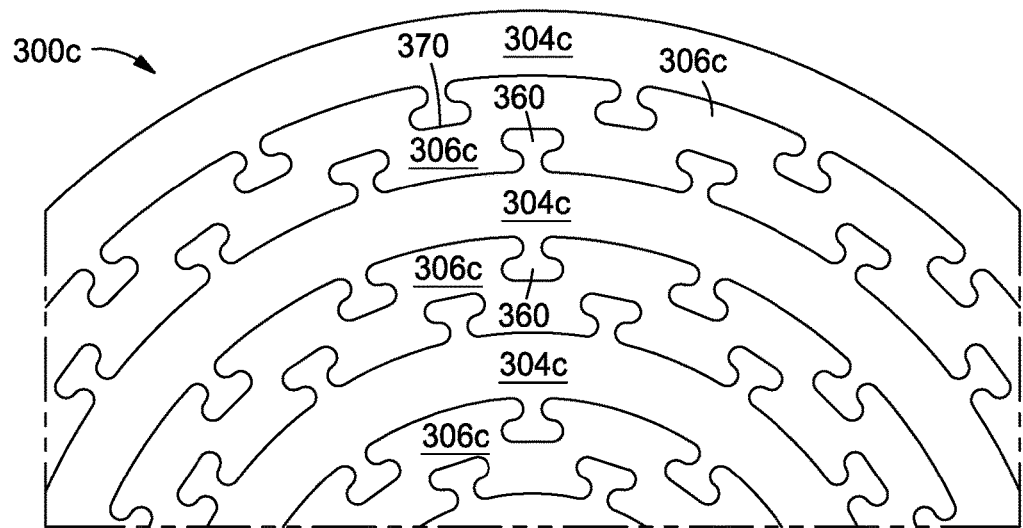
FIG. 3C is a schematic partial top view of a polishing pad having surfaces with regions of varying zeta potential according to another implementation of the present disclosure.

FIG. 3C is a schematic partial top view of a polishing pad 300c having surfaces with regions of varying zeta potential according to an implementation of the present disclosure. The polishing pad 300c is similar to the polishing pad 300 of FIG. 3A except that the polishing pad 300c includes interlocking first polishing features 304c and second polishing feature(s) 306c. The first polishing features 304c and the second polishing feature(s) 306c may form a plurality of concentric rings. In one implementation, the first polishing features 304c may include protruding vertical ridges 360 and the second polishing feature(s) 306c may include vertical recesses 370 for receiving the vertical ridges 360. Alternatively, the second polishing feature(s) 306c may include protruding ridges while the first polishing features 304c include recesses. Interlocking the second polishing feature(s) 306c with the first polishing features 304c increase the mechanical strength of the polishing pad 300c in relation to applied shear forces, which may be generated during the CMP process and/or material handling. The first polishing features 304c and the second polishing feature(s) 306c may each have a region of varying zeta potential.

Figure 3D:
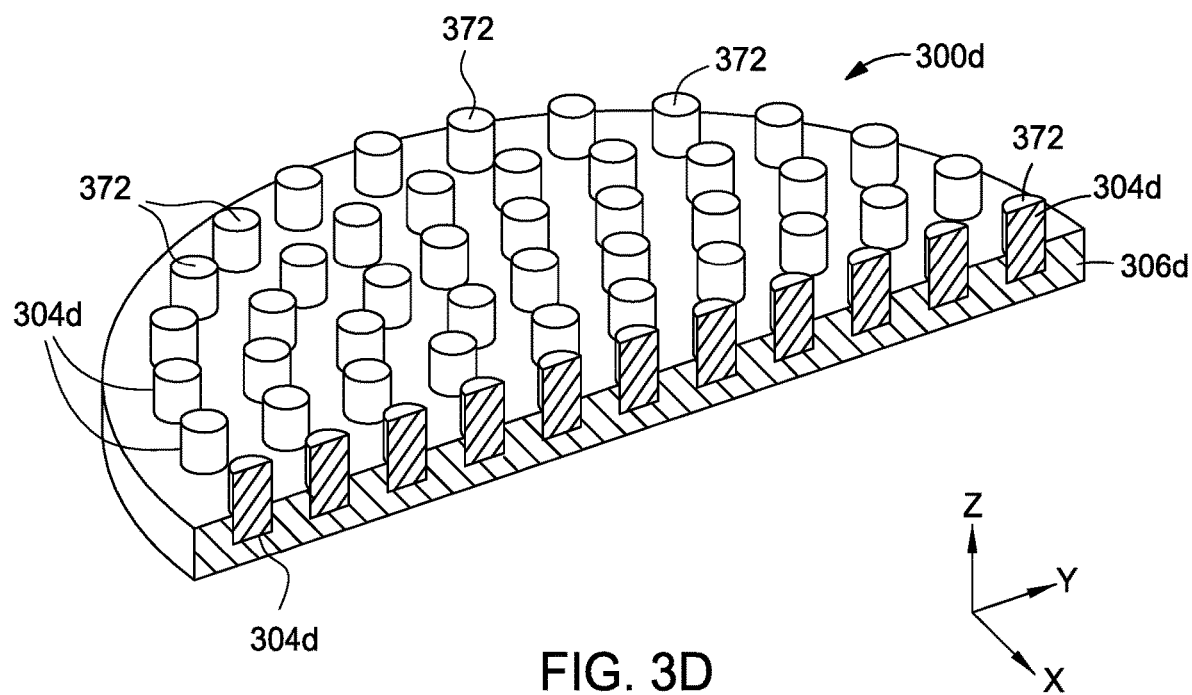
FIG. 3D is a schematic perspective sectional view of a polishing pad having surfaces with regions of varying zeta potential according to another implementation of the present disclosure.

FIG. 3D is a schematic perspective sectional view of a polishing pad 300d having surfaces with regions of varying zeta potential according to implementations of the present disclosure. The polishing pad 300d includes a plurality of first polishing features 304d extending from a base material layer, such as the second polishing feature(s) 306d. Upper surfaces 372 of the first polishing features 304d form a polishing surface for contacting with the substrate during polishing. The first polishing features 304d and the second polishing feature(s) 306d have different material and structural properties. For example, the first polishing features 304d may be formed from a material having a first zeta potential, such as materials for the first polishing feature 304 of the polishing pad 300, while the second polishing feature(s) 306d may be formed from a material having a second zeta potential. Further, the first polishing features 304d may be formed from a hard material, such as materials for the hard features of the polishing pad 300, while the second polishing feature(s) 306d may be formed from a soft or low storage modulus E' material, such as materials for the second polishing features of the polishing pad 300. The polishing pad 300d may be formed by 3D printing, similar to the polishing pad 300.

In one implementation, the first polishing features 304d may be substantially the same size. Alternatively, the first polishing features 304d may vary in size to create varied mechanical and surface properties, such as varied zeta potential, varied storage modulus E' or and/or varied loss modulus E", across the polishing pad 300d. In one implementation, the first polishing features 304d may be uniformly distributed across the polishing pad 300d. Alternatively, the first polishing features 304d may be arranged in a non-uniform pattern to achieve target properties in the polishing pad 300d.

In FIG. 3D, the first polishing features 304d are shown to be circular columns protruding from the second polishing feature(s) 306d. Alternatively, the first polishing features 304d may be of any suitable shape, for example columns with oval, square, rectangle, triangle, polygonal, or irregular sectionals. In one implementation, the first polishing features 304d may be of different cross-sectional shapes to tune hardness, mechanical strength, zeta potential or other desirable properties of the polishing pad.

Figure 3E:
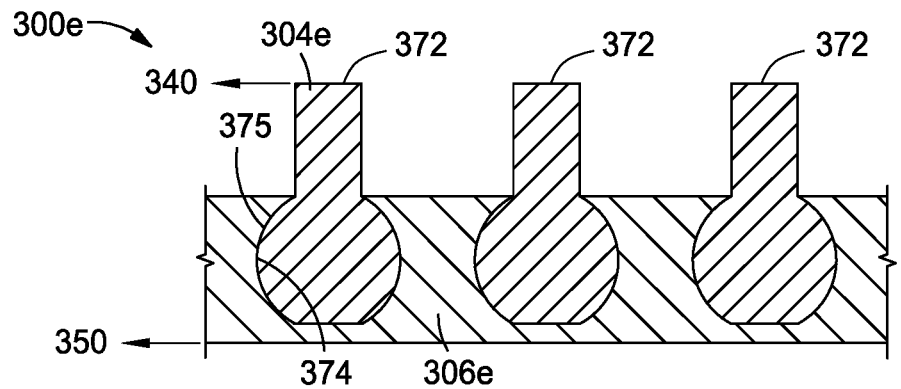
FIG. 3E is a schematic partial sectional view of a polishing pad having surfaces with regions of varying zeta potential according to another implementation of the present disclosure.

FIG. 3E is a schematic partial sectional view of a polishing pad 300e having surfaces with regions of varying zeta potential according to an implementation of the present disclosure. The polishing pad 300e is similar to the polishing pad 300, 300c or 300d of FIGS. 3A-3D except that the polishing pad 300e includes interlocking first polishing features 304e and second polishing feature(s) 306e. The first polishing features 304e and the second polishing feature(s) 306e may include a plurality of concentric rings and/or discrete elements that form part of the composite pad body 302. In one implementation, the first polishing features 304e may include protruding sidewalls 374 while the second polishing feature(s) 306e may include recessing sidewalls 375 to receive the first polishing features 304e. Alternatively, the second polishing feature(s) 306e may include protruding sidewalls while the first polishing features 304e include recessing sidewalls. By having the second polishing feature(s) 306e interlock with the first polishing features 304e by protruding sidewalls, the polishing pad 300e obtains an increased tensile, compressive and/or shear strength. Additional, the interlocking sidewalls prevents the polishing pad 300e from being pulled apart.

In one implementation, the boundaries between the first polishing features 304e and second polishing feature(s) 306e include a cohesive transition from at least one composition of material to another, such as a transition or compositional gradient from a first composition used to form the first polishing feature 304e and a second composition used to form the second polishing feature(s) 306e. The cohesiveness of the materials thus formed from the compositions are used to form portions of the composite pad body 302 is a direct result of the additive manufacturing process described herein, which enables micron scale control and intimate mixing of the one or more chemical compositions in a layer by layer additively formed structure.

Figure 3F:
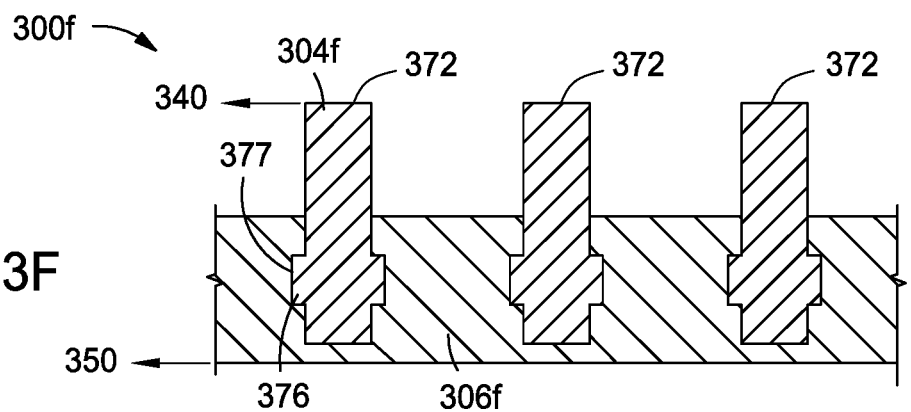
FIG. 3F is a schematic partial sectional view of a polishing pad having surfaces with regions of varying zeta potential according to another implementation of the present disclosure.

FIG. 3F is a schematic partial sectional view of a polishing pad 300f having surfaces with regions of varying zeta potential according to an implementation of the present disclosure. FIG. 3F is a schematic partial sectional view of a polishing pad according to one implementation of the present disclosure. The polishing pad 300f is similar to the polishing pad 300e of FIG. 3E except that the polishing pad 300f includes differently configured interlocking features. The polishing pad 300f may include first polishing features 304f and second polishing feature(s) 306f. The first polishing features 304f and the second polishing feature(s) 306f may include a plurality of concentric rings and/or discrete elements. In one implementation, the first polishing features 304f may include horizontal ridges 376 while the second polishing feature(s) 306f may include horizontal recesses 377 to receive the horizontal ridges 376 of the first polishing features 304f. Alternatively, the second polishing feature(s) 306f may include horizontal ridges while the first polishing features 304f include horizontal recesses. In one implementation, vertical interlocking features, such as the interlocking features of FIG. 3C and horizontal interlocking features, such as the interlocking features of FIGS. 3E and 3F, may be combined to form a polishing pad.

FIGS. 3G-3L are top views of polishing pad designs having surfaces with regions of varying zeta potential according to an implementation of the present disclosure. Each of the FIGS. 3G-3L include pixel charts having white regions (regions in white pixels) that represent the first polishing features 304g-304l, respectively, for contacting and polishing a substrate, and black regions (regions in black pixels) that represent the second polishing feature(s) 306g-306l. The first polishing features 304g-304l may be similar to the first polishing features 304 discussed herein. The second polishing feature(s) 306g-306l may be similar to the second polishing feature(s) 306 of the polishing pad. As similarly discussed herein, the white regions generally protrude over the black regions so that channels are formed in the black regions between the white regions. Polishing slurry may flow through and may be retained in the channels during polishing. The polishing pads shown in FIGS. 3G-3L may be formed by depositing a plurality of layers of materials using an additive manufacturing process. Each of the plurality of layers may include two or more materials to form the first polishing features 304g-304f and second polishing feature(s) 306g-306f. In one implementation, the first polishing features 304g-304f may be thicker than the second polishing feature(s) 306g-306f in a direction normal to a plane that is parallel to the plurality of layers of materials so that grooves and/or channels are formed on a top surface of the polishing pad.

Figure 3G:
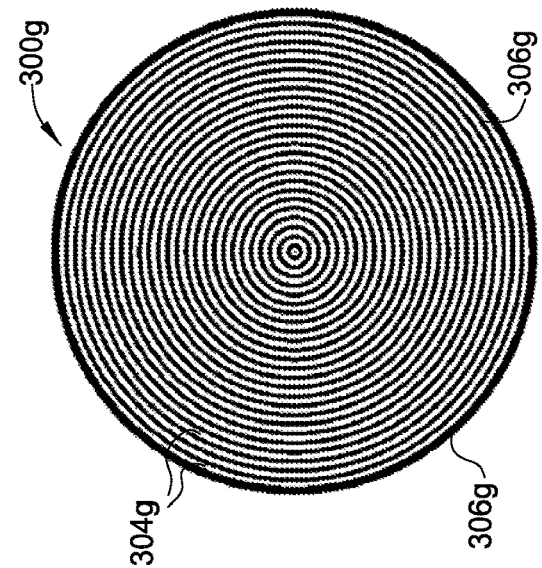
FIGS. 3G-3L are top views of polishing pad designs having surfaces with regions of varying zeta potential according to implementation of the present disclosure.

FIG. 3G is a schematic pixel chart of a polishing pad design 300g having a plurality of first polishing features 304g that are concentric polishing features. The first polishing features 304g may be concentric circles of identical width. In one implementation, the second polishing feature(s) 306g may also have identical width so that the pitch of the first polishing feature(s) 304g is constant along the radial direction. During polishing, channels between the first polishing feature(s) 304g retain the polishing slurry and prevent rapid loss of the polishing slurry due to a centrifugal force generated by rotation of the polishing pad about its central axis (i.e., center of concentric circles).

Figure 3H:
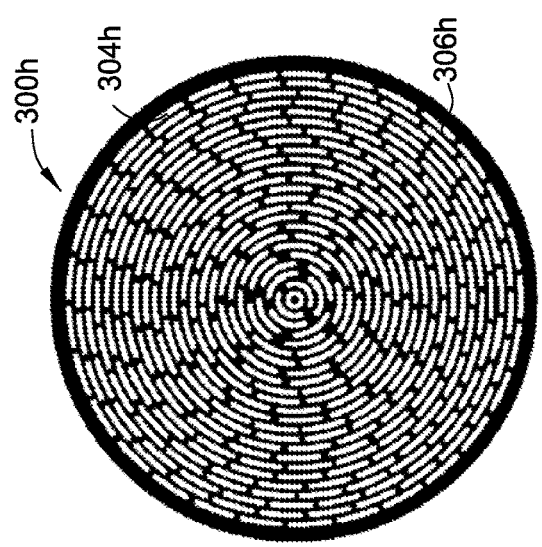

FIG. 3H is a schematic pixel chart of a polishing pad design 300h having a plurality of segmented first polishing features 304h arranged in concentric circles. In one implementation, the segmented first polishing features 304h may have substantially identical length. The segmented first polishing features 304h may form a plurality of concentric circles. In each circle, the segmented first polishing features 304h may be equally distributed within each concentric circle. In one implementation, the segmented first polishing features 304h may have an identical width in the radial direction. In some implementations, the segmented first polishing features 304h each substantially has an identical length irrespective of the radius is of the concentric circle (e.g., equal arc length except for the center region of the polishing pad). In one implementation, the second polishing feature(s) 306h is disposed between the plurality of concentric circles and has an identical width so that the pitch of the concentric circles is constant. In one implementation, gaps between the segmented first polishing features 304h may be staggered from circle to circle to prevent polishing slurry from directly flowing out of the polishing pad under the centrifugal force generated by rotation of the polishing pad about its central axis.

Figure 3I:
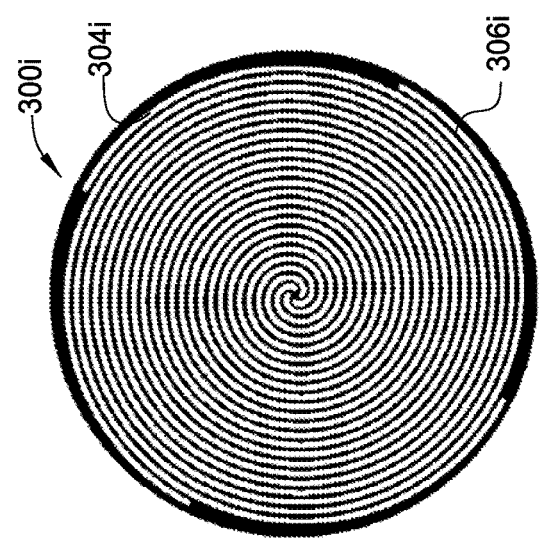

FIG. 3I is a schematic pixel chart of a polishing pad design 300i having spiral first polishing features 304i over second polishing feature(s) 306i. In FIG. 3I, the polishing pad design 300i has four spiral first polishing features 304i extending from a center of the polishing pad to an edge of the polishing pad. Even though four spiral polishing features are shown, less or more numbers of spiral first polishing features 304i may be arranged in similar manner. The spiral first polishing features 304i define spiral channels. In one implementation, each of the spiral first polishing features 304i has a constant width. In one implementation, the spiral channels also have a constant width. During polishing, the polishing pad may rotate about a central axis in a direction opposite to the direction of the spiral first polishing features 304i to retain polishing slurry in the spiral channels. For example, in FIG. 3I, the spiral first polishing features 304i and the spiral channels are formed in a counter-clockwise direction, and thus during polishing the polishing pad may be rotated clockwise to retain polishing slurry in the spiral channels and on the polishing pad. In some implementations, each of the spiral channels is continuous from the center of the polishing pad to the edge of the polishing pad. This continuous spiral channels allow polishing slurry along with any polishing waste to flow from the center of the polishing pad to the edge of the polishing pad. In one implementation, the polishing pad may be cleaned by rotating the polishing pad in the same direction as the spiral first polishing features 304i (e.g., counter-clockwise in FIG. 3I).

Figure 3J:
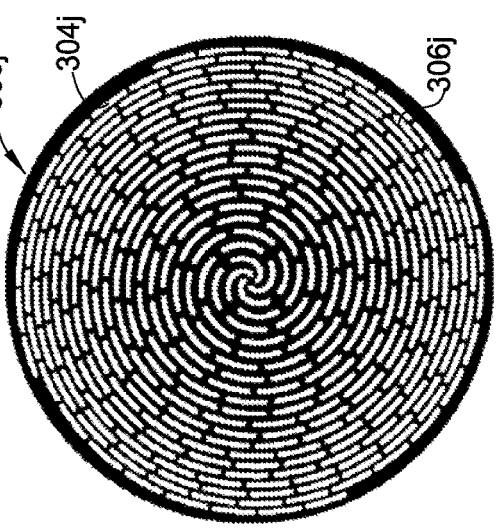

FIG. 3J is a schematic pixel chart of a polishing pad design 300j having first polishing features 304j that are segmented polishing features arranged in a spiral pattern on second polishing feature(s) 306j. The polishing pad illustrated in FIG. 3J is similar to the polishing pad in FIG. 3I except that the first polishing features 304j are segmented, and the radial pitch of the first polishing features 304j varies. In one implementation, the radial pitch of the first polishing features 304j decreases from a center of the polishing pad to an edge region of the polishing pad.

Figure 3K:
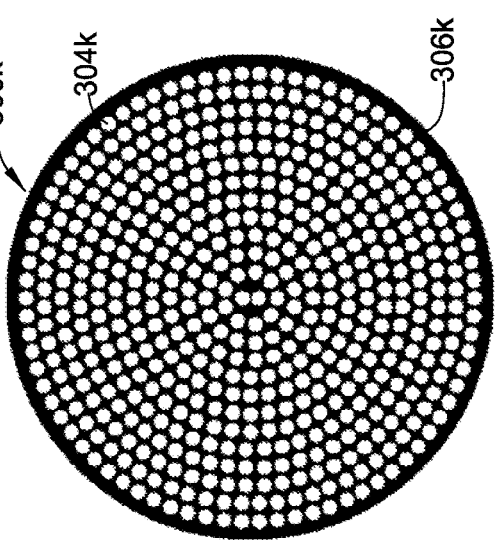

FIG. 3K is a schematic pixel chart of a polishing pad design 300k having a plurality of discrete first polishing features 304k formed in second polishing feature(s) 306k. In one implementation, each of the plurality of first polishing features 304k may be a cylindrical post type structure, similar to the configuration illustrated in FIG. 3D. In one implementation, the plurality of first polishing features 304k may have the same dimension in the plane of the polishing surface. In one implementation, the plurality of first polishing features 304k may be arranged in concentric circles. In one implementation, the plurality of first polishing features 304k may be arranged in a regular 2D pattern relative to the plane of the polishing surface.

Figure 3L:
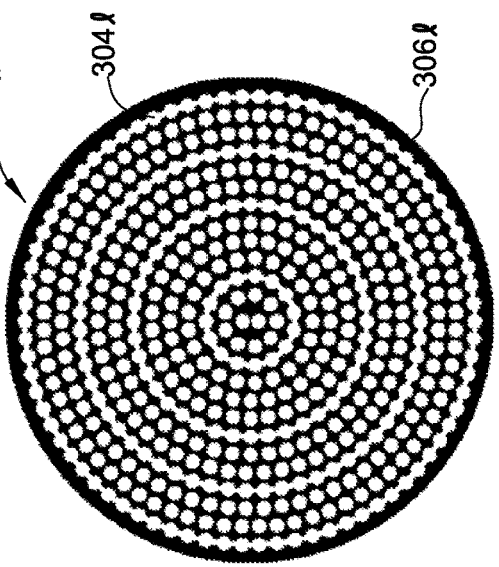

FIG. 3L is a schematic pixel chart of a polishing pad design 300f having a plurality of discrete first polishing features 304f formed over a second polishing feature(s) 306f. The polishing pad of FIG. 3L is similar to the polishing pad of FIG. 3K except that some first polishing features 304f in FIG. 3L may be connected to form one or more closed circles. The one or more closed circles may create one or more damns to retain polishing slurry during polishing.

The first polishing features 304a-304f in the designs of FIGS. 3A-3L may be formed from an identical material or identical compositions of materials. Alternatively, the material composition and/or material properties of the first polishing features 304a-304f in the designs of FIG. 3A-3L may vary from polishing feature to polishing feature. Individualized material composition and/or material properties allow polishing pads to be tailored for specific needs.

Figure 4A:
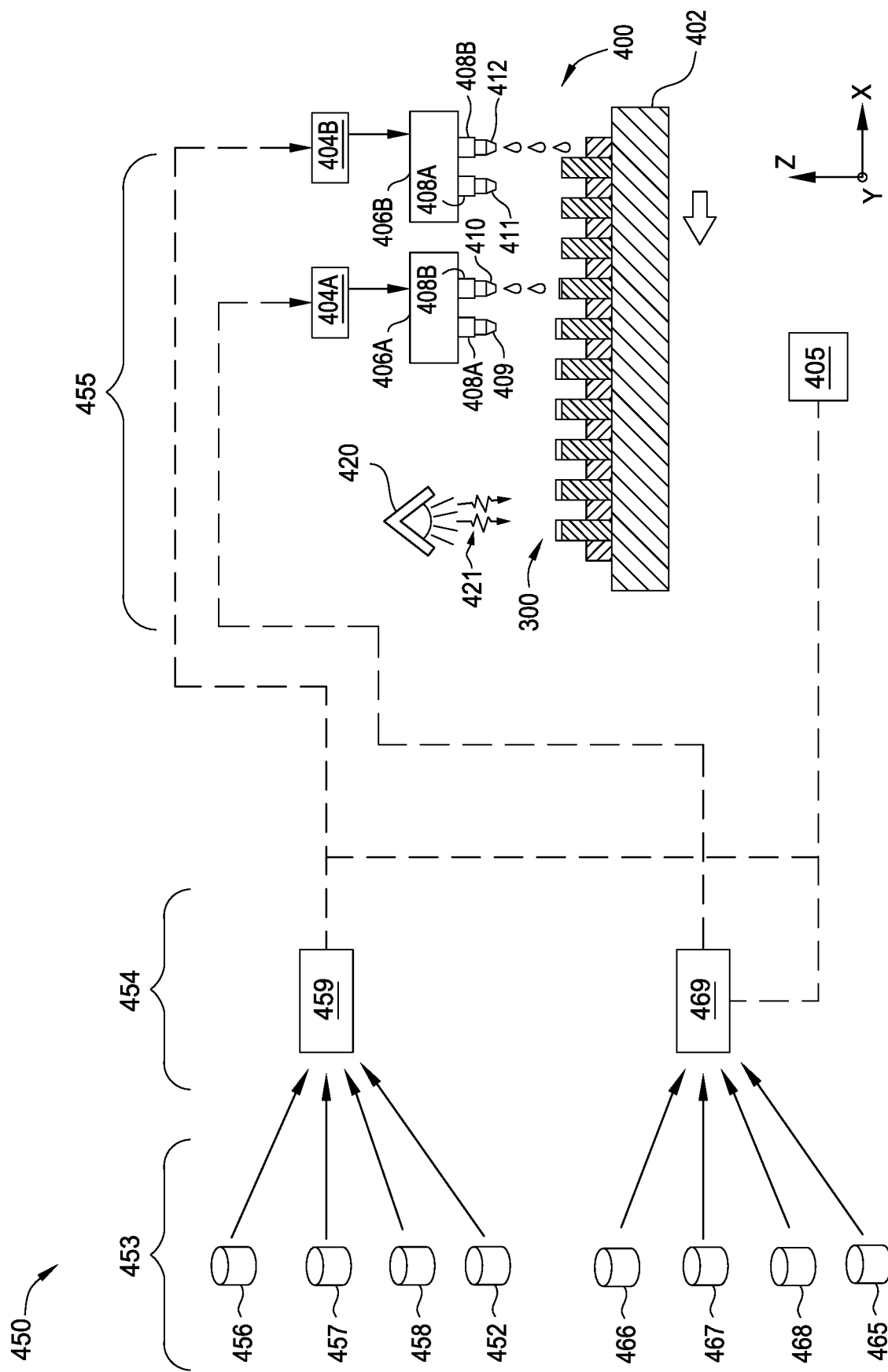
FIG. 4A is a schematic view of a system for manufacturing polishing pads having surfaces with regions of varying zeta potential according to an implementation of the present disclosure.

FIG. 4A is a schematic sectional view of an additive manufacturing system 450 that can be used to form a polishing pad having surfaces with regions of varying zeta potential using an additive manufacturing process according to one or more implementations of the present disclosure. An additive manufacturing process may include, but is not limited to a process, such as a polyjet deposition process, inkjet printing process, fused deposition modeling process, binder jetting process, powder bed fusion process, selective laser sintering process, stereolithography process, vat photopolymerization digital light processing, sheet lamination process, directed energy deposition process, or other similar 3D deposition process (e.g., 3-D printing process). Additive manufacturing processes, such as 3D printing, have been found to be especially useful in forming polishing pads having regions of varying zeta potential.

The additive manufacturing system 450 generally includes a precursor delivery section 453, a precursor formulation section 454 and a deposition section 455. The deposition section 455 will generally include an additive manufacturing device, or hereafter printing station 400, which is used to form a polishing pad 200, 300-300l. During processing, the polishing pads 200, 300-300l may be printed on a support 402 within the printing station 400. In some implementations, the polishing pad 200, 300-300l is formed layer by layer using one or more droplet ejecting printers 406, such as printer 406A and printer 406B illustrated in FIG. 4A, from a CAD (computer-aided design) program. The printers 406A, 406B and the support 402 may move relative to each other during the printing process.

The droplet ejecting printer 406 may include one or more print heads 408 having one or more nozzles (e.g. nozzles 409-412) for dispensing liquid precursors. In the implementation of FIG. 4A, the printer 406A includes print head 408A that has a nozzle 409 and a print head 408B having a nozzle 410. The nozzle 409 may be configured to dispense a first liquid precursor composition to form a first polymer material, such as a polymer material having a first zeta potential, while the nozzle 410 may be used to dispense a second liquid precursor to form a second polymer material having a second zeta potential. The liquid precursor compositions may be dispensed at selected locations or regions to form a polishing pad that has regions of varying zeta potential. These selected locations collectively form the target printing pattern that can be stored as a CAD-compatible file that is then read by an electronic controller 405, which controls the delivery of the droplets from the nozzles of the droplet ejecting printer 406.

The electronic controller 405 is generally used to facilitate the control and automation of the components within the additive manufacturing system 450, including the printing station 400. The electronic controller 405 can be, for example, a computer, a programmable logic controller, or an embedded controller. The electronic controller 405 typically includes a central processing unit (CPU), memory (e.g., a computer-readable medium), and support circuits for inputs and outputs (I/O) (not shown). The CPU may be one of any form of computer processors that are used in industrial settings for controlling various system functions, substrate movement, chamber processes, and control support hardware (e.g., sensors, motors, heaters, etc.), and monitor the processes performed in the system. The memory or computer readable medium is connected to the CPU, and may be one or more of a readily available non-volatile memory, such as random access memory (RAM), flash memory, read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the electronic controller 405 determines which tasks are performable by the components in the additive manufacturing system 450. In one implementation, the program is software readable by the electronic controller 405 and includes code to perform tasks relating to monitoring, execution and control of the delivery and positioning of droplets delivered from the droplet ejecting printer 406. The program may also include tasks relating to the movement, support, and/or positioning of the components within the printing station 400 along with the various process tasks and various sequences being performed in the electronic controller 405.

After 3D printing, the polishing pad 200, 300-300f may be solidified by use of a curing device 420 that is disposed within the deposition section 455 of the additive manufacturing system 450. The curing process performed by the curing device 420 may be performed by heating the printed polishing pad to a curing temperature or exposing the pad to one or more forms of electromagnetic radiation. In one example, the curing process may be performed by exposing the printed polishing pad to ultraviolet radiation 421 generated by an ultraviolet light source within the curing device 420.

The additive manufacturing process offers a convenient and highly controllable process for producing polishing pads with discrete features formed from different materials and/or different compositions of materials. In one implementation, features having a first zeta potential and/or features having a second zeta potential may be formed using the additive manufacturing process. For example, features of a polishing pad having a first zeta potential may be formed from the first composition containing polyurethane segments dispensed from the nozzle 412 of the printer 406B, and features having a second zeta potential of the polishing pad may be formed from droplets of the second composition dispensed from the nozzle 410 of the printer 406A. Further, droplets of the first composition may be used to form soft or low storage modulus E' features of the polishing pad and droplets of the second composition may be used to form hard or high storage modulus E' features of the polishing pad.

In another implementation, the first polishing features 304 and/or the second polishing feature(s) 306 may each be formed from a mixture of two or more compositions. In one example, a first composition may be dispensed in the form of droplets by a first print head, such as the print head 408A, and the second composition may be dispensed in the form of droplets by a second print head, such as the print head 408B of the printer 406A. To form first polishing features 304 with a mixture of the droplets delivered from multiple print heads will typically include the alignment of the pixels corresponding to the first polishing features 304 on predetermined pixels within a deposition map found in the electronic controller 405. The deposition map is generally a representation of the position where the various droplets of each composition are to be disposed across a surface (e.g., X-Y plane) to form a layer within the stack of deposited layers (e.g., layers stacked in the Z direction). The print head 408A may then align with the pixels corresponding to where the first polishing features 304 are to be formed and then dispense droplets on the predetermined pixels. The polishing pad may thus be formed from a first composition of materials that is formed by depositing droplets of a first droplet composition and a second material that comprises a second composition of materials that is formed by depositing droplets of a second droplet composition.

FIG. 4B schematic close up cross-sectional view of a portion of the printing station 400 and polishing pad 300 during the polishing pad manufacturing process. The printing station 400, as illustrated in one example which is shown FIG. 4B, includes two printers 406A and 406B that are used to sequentially form a portion of the polishing pad 300 by a layer by layer deposition process. The portion of the polishing pad 300 shown in FIG. 4B may include, for example, part of either the first polishing feature 304 or the second polishing feature(s) 306 in the finally formed polishing pad 300. During processing the printers 406A and 406B are configured to deliver droplets "A" or "B," respectively, to a first surface of the support 402 and then successively to a surface of the growing polishing pad that is disposed on the support 402 in a layer by layer process. As shown in FIG. 4B, a second layer 448 is deposited over a first layer 446 which has been formed on the support 402. In one implementation, the second layer 448 is formed over the first layer 446, which has been processed by the curing device 420 that is disposed downstream from the printers 406A and 406B in the pad manufacturing process.

One will note that in some implementations, portions of the second layer 448 may be simultaneously processed by the curing device 420 while one or more of the printers 406A and 406B are depositing droplets "A" and/or "B" on to the surface 446A of the previously formed first layer 446. In this case, the layer that is currently being formed may include a processed portion 448A and an unprocessed portion 448B that are disposed on either side of a curing zone 449A. The unprocessed portion 448B generally includes an array of dispensed droplets, such as dispensed droplets 443 and 447, which are deposited on the surface 446A of the previously formed first layer 446 by use of the printers 406B and 406A, respectively.

FIG. 4C is a close up cross-sectional view of the dispensed droplet 443 that is disposed on the surface 446A of the previously formed first layer 446, as illustrated in FIG. 4B. Based on the properties of the materials within the dispensed droplet 443, and due to surface energy of the surface 446A the dispensed droplet will spread across the surface an amount that is larger than the size of the original dispensed droplet (e.g., droplets "A" or "B"), due to surface tension. The amount of spread of the dispensed droplet will vary as a function of time from the instant that it is deposited on the surface 446A. However, after a very short period of time (e.g., <1 second) the spread of the droplet will reach an equilibrium size, and have a contact angle α. The spread of the dispensed droplet across the surface affects the resolution of the placement of the droplets on the surface of the growing polishing pad, and thus the resolution of the features and compositions found within various regions of the final polishing pad.

In some implementations, it is desirable to simultaneously expose the droplets "A", "B" as they are being dispensed to cure, or "fix," the droplet at a desired size before the droplet has a chance to spread to its normal uncured equilibrium size on the surface of the substrate. In this case, the energy supplied to the dispensed droplet, and surface that the droplet is placed on, by the curing device 420 and the droplet's material composition are adjusted to control the resolution of each of the dispensed droplet. Therefore, one parameter to control or tune during a 3D printing process is the control of the dispensed droplet's surface tension relative to the surface that the droplet is disposed on. Also, as is further discuss below, in some implementations, it is desirable to add one or more initiators (e.g., photo-initiators) to the droplet's formulation to control the kinetics of the curing process, prevent oxygen inhibition, and/or control the contact angle of the droplet on the surface that the droplet is deposited on.

It has been found that it is desirable to only partially cure each dispensed droplet to "fix" its surface properties and dimensional size during the printing process. The ability to "fix" the droplet at a desirable size can be accomplished by adding a desired amount of one or more photoinitiators to the droplet's material composition and delivering a sufficient amount of energy from the curing device 420 during the printing process. In some implementations, it is desirable to use a curing device 420 that is able to deliver between about 1 milli-joule per centimeter squared (mJ/cm$^2$) and 100 mJ/cm$^2$, such as about 10-15 mJ/cm$^2$, of ultraviolet (UV) light during the droplet dispensing and additive layer formation process. The UV radiation may be provided by any UV source, such as mercury microwave arc lamps, pulsed xenon flash lamps, high-efficiency UV light emitting diode arrays, and UV lasers. The UV radiation may have a wavelength between about 170 nm and about 400 nm.

In some implementations, the size of dispensed droplets "A", "B" may be from about 10 to about 100 microns, such as 50 to about 70 microns. Depending on the surface energy (dynes) of the substrate or polymer layer that the droplet is dispensed over and upon, the uncured droplet may spread upon and across the surface to a fixed droplet size 443A of between about 10 and about 500 microns, such as such as between about 50 and about 200 microns. The height of such a droplet may be from about 5 to about 100 microns, again depending on such factors as surface energy, wetting, and/or resin composition, which may include other additives such as flow agents, thickening agents, and surfactants. One source for the above additives is BYK-Gardner GmbH of Geretsried, Germany.

It is generally desirable to select a photoinitiator, an amount of the photoinitiator in the droplet composition, and the amount of energy supplied by curing device 420 to allow the dispensed droplet to be "fixed" within a time less than about 1 second, such as less than about 0.5 seconds. In an effort to "fix" the droplet in this short timeframe the dispense nozzle of the droplet ejecting printer 406 is positioned a small distance from the surface of the polishing pad, such as between 0.1 and 10 millimeters (mm), or even 0.5 and 1 mm, while the nozzle and surface 446A of the polishing pad are exposed to the ultraviolet radiation 421 delivered from the curing device 420. It has also been found that by controlling droplet composition, the amount of cure of the previously formed layer (e.g., surface energy of the previously formed layer), the amount of energy from the curing device 420 and the amount of the photoinitiator in the droplet composition, the contact angle α of the droplet can be controlled to control the fixed droplet size, and thus the resolution of the printing process. A droplet that has been fixed, or at least partially cured, is also referred to herein as a cured droplet. In some implementations, the fixed droplet size 443A is between about 10 and about 200 microns. In some implementations, the contact angle can be desirably controlled to a value of at least 50°, such as greater than 55°, or even greater than 60°.

The amount of curing of the surface of the dispensed droplet that forms the next underlying layer is a polishing pad formation process parameter. The amount of curing in this initial dose may affect the surface energy that the subsequent layer of dispensed droplets will be exposed to during the printing process. The amount of the initial cure dose may affect the amount of curing that each deposited layer will finally achieve in the formed polishing pad, due to repetitive exposure of each deposited layer to additional transmitted curing radiation supplied through the subsequently deposited layers, as they are grown thereon. One will note that it is generally desirable to not over cure a formed layer, since over curing will affect the material properties of the over cured materials. The UV radiation exposure time to effect polymerization of an exemplary 10 micron thick layer of dispensed droplet may be formed during an exposure of about 0.1 seconds to about 1 second, and intensity of the UV radiation may be from about 10 to about 15 mJ/cm2.

In some implementations, it is desirable to control the droplet composition and the amount of energy delivered from the curing device 420 during the initial curing process, or process in which the deposited layer of dispensed droplets are directly exposed to the energy provided by the curing device 420, to cause the layer to only partially cure a desired amount. In general, it is desirable for the initial curing process to predominantly surface cure the dispensed droplet versus bulk cure the dispensed droplet, since controlling the surface energy of the formed layer is relevant for controlling the dispensed droplet size in the subsequently printed layer. In one example, the amount that a dispensed droplet is partially cured can be defined by the amount of chemical conversion of the materials in the dispensed droplet. In one example, the conversion of the acrylates found in a dispensed droplet that is used to form a urethane acrylate containing layer, is defined by a percentage x, which is calculated by the equation:

$$x = 1 - [(A_{C=C}/A_{C=O})_x / (A_{C=C}/A_{C=O})_0],$$

where $A_{C=C}$ and $A_{C=O}$ are the values of the C=C peak at 910 cm$^{-1}$ and the C=O peaks at 1700 cm$^{-1}$ found using FT-IR spectroscopy. The $A_{C=C}/A_{C=O}$ ratio refers to the relative ratio of C=C to C=O bonds within the cured droplet, and thus the $(A_{C=C}/A_{C=O})_0$ denotes the initial ratio of $A_{C=C}$ to $A_{C=O}$ in the droplet, while $(A_{C=C}/A_{C=O})_x$ denotes the ratio of $A_{C=C}$ to $A_{C=O}$ on the surface of cured substrate after the droplet has been cured. In some implementations, the amount that a layer is initially partially cured may be equal to or greater than about 70% of the material that is disposed in the dispensed droplet. In some configurations, it may be desirable to partially cure the material in the dispensed droplet during the initial layer formation step to a level of between about 70-80%.

As discussed further below, the mixture of the dispensed droplet, or positioning of the dispensed droplets, can be adjusted on a layer-by-layer basis to form layers that have the same or differing material, mechanical or dynamic properties. In one example, as shown in FIG. 4B, a mixture of dispensed droplets includes a 50:50 ratio of the dispensed droplets 443, 447, wherein the dispensed droplet 443 includes at least one different material from the material found in the dispensed droplet 447. Properties of portions of the composite pad body 302, such as the first polishing features 304 and/or second polishing feature(s) 306 may be adjusted or tuned according to the ratio and/or distribution of a first composition and a second composition that are formed from the positioning of the dispensed droplets during the deposition process. For example, the weight % of the first composition may be from about 1% by weight based on total composition weight to about 100% based on total composition weight. In a similar fashion, the second composition may be from about 1% by weight based on total composition weight to about 100% based on total composition weight.

Depending on the material properties that are desired, such as zeta potential, hardness and/or modulus, compositions of two or more materials can be mixed in different ratios to achieve a desired effect. In one implementation, the composition of the first polishing features 304 and/or second polishing feature(s) 306 is controlled by selecting at least one composition or a mixture of compositions, and size, location, speed, and/or density of the droplets dispensed by one or more printers. Therefore, the electronic controller 405 is generally adapted to position the nozzles 409-410, 411-412 to form a layer that has interdigitated droplets that have been positioned in a desired density and pattern on the surface of the polishing pad that is being formed.

Even though only two compositions are generally discussed herein for forming the first polishing features 304 and/or second polishing feature(s) 306, implementations of the present disclosure encompass forming features on a polishing pad with a plurality of materials that are interconnected with compositional gradients. In some configurations, the composition of the first polishing features 304 and/or second polishing feature(s) 306 in a polishing pad are adjusted within a plane parallel to the polishing surface and/or through the thickness of the polishing pad, as discussed further below.

The ability to form zeta potential gradients and the ability to tune the chemical content locally, within, and across a polishing pad are enabled by "ink jettable" low viscosity compositions, or low viscosity "inks" in the 3D printing arts that are used to form the droplets "A" and/or "B" illustrated in FIG. 4B. The low viscosity inks are "pre-polymer" compositions and are the "precursors" to the formed first polishing features 304 and second polishing feature(s) 306 found in the composite pad body 302. The low viscosity inks therefore enable the delivery of a wide variety of chemistries and discrete compositions that are not available by conventional techniques (e.g., molding and casting), and thus enable controlled compositional transitions or zeta potential gradients to be formed within different regions of the composite pad body 302. This is achieved by the addition and mixing of viscosity thinning reactive diluents to high viscosity functional oligomers and zeta potential modifiers to achieve the appropriate viscosity formulation, followed by copolymerization of the diluent(s) with the higher viscosity functional oligomers and zeta potential modifiers when exposed to a curing energy delivered by the curing device 420, such as UV radiation and/or heat. The reactive diluents may also serve as a solvent, thus eliminating the use of inert non-reactive solvents or thinners that are typically removed at each step.

Referring to the precursor delivery section 453 and precursor formulation section 454 of FIG. 4A, in one implementation, a first zeta potential modifier precursor 452, a first precursor 456, and optionally a second precursor 457 are mixed with a diluent 458 to form a first printable ink composition 459, which is delivered to reservoir 404B of the printer 406B, and used to form portions of the pad body 202. Similarly, a second zeta potential modifier precursor 465, a third precursor 466, and optionally a fourth precursor 467 can be mixed with a diluent 468 to form a second printable ink composition 469, which is delivered to reservoir 404A of the printer 406A, and used to form another portion of the pad body 202. In some implementations, the first precursor 456 and the third precursor 466 each comprise an oligomer, such as a multifunctional oligomer, the second precursor 457 and the fourth precursor 467 each comprise a multifunctional monomer, the diluent 458 and the diluent 468 each comprise a reactive diluent (e.g., monomer) and/or initiator (e.g., photo-initiator), and the first zeta potential modifier precursor 452 and the second zeta potential modifier precursor 465 comprises a class of monomers/oligomers that copolymerize with the other monomers and oligomers and modify zeta potential.

FIGS. 5A-5D provide examples of pixel charts 500a-500d of a polishing pad that includes a gradient of zeta potential across one or more regions of the polishing pad that are formed within the printing station 400. In FIGS. 5A-5D, the white pixel marks are intended to schematically illustrate where a dispensed droplet of a first material is dispensed while the black pixels mark where no material is dispensed within one or more layers used to form a polishing pad. By use of these techniques, composition gradients in the cured material, or material formed by a plurality of cured droplets, can be formed in one or more of the printed layers used to form at least part of a complete polishing pad. The tailored composition of one or more of the printed layers within a polishing pad can be used to adjust and tailor the overall properties of the polishing pad. It should be noted that the composition of polishing features may vary in any suitable pattern. Although polishing pads described herein are shown to be formed from two kinds of materials, this configuration is not intended to be limiting of the scope of the disclosure provided herein, since polishing pads including three or more kinds of materials is within the scope of the present disclosure. It should be noted that the compositions of the polishing features in any designs of the polishing pad, such as the polishing pads in FIGS. 3A-3L, may be varied in similar manner as the polishing pads in FIGS. 5A-5F.

Figure 5B:
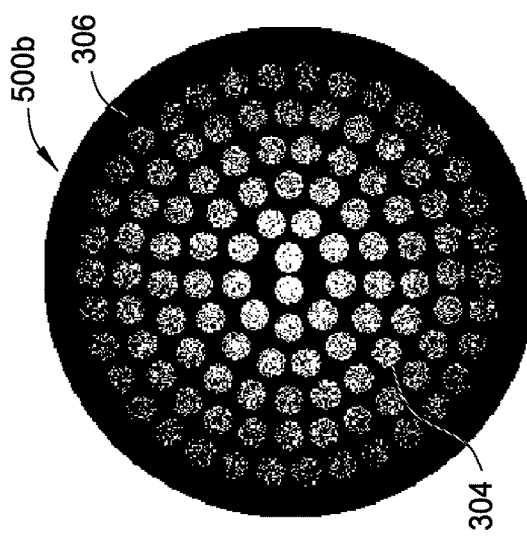
FIGS. 5A-5F provide examples of polishing pads having surfaces of varying zeta potential across one or more regions of the polishing body that are formed within the system of FIG. 4A according to an implementation of the present disclosure.
Figure 5D:
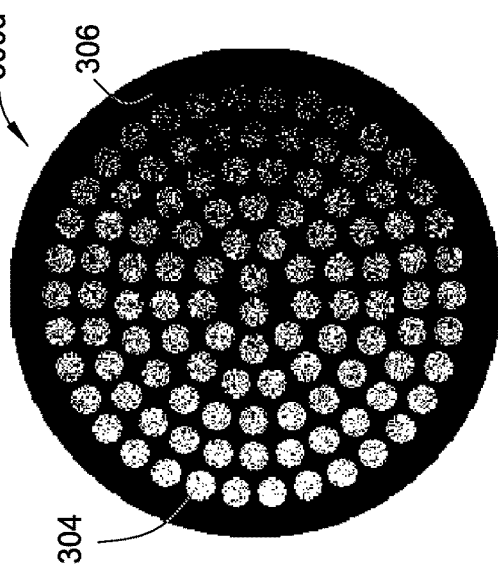
Figure 5A:
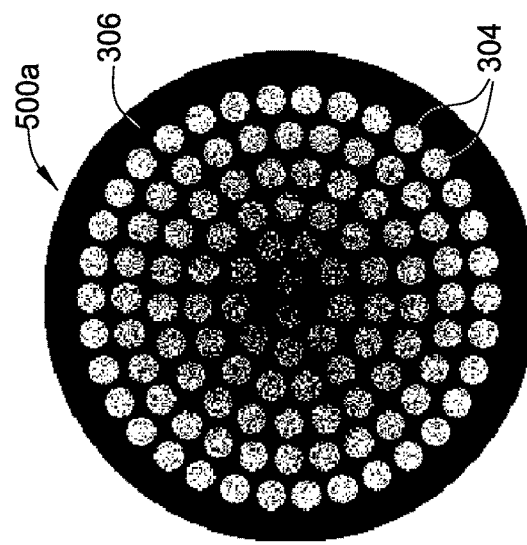

FIGS. 5A and 5B are black and white bitmap images reflecting pixel charts of a printed layer within a polishing pad that includes portions of first polishing features 304 and one or more second polishing feature(s) 306. In FIGS. 5A and 5B, the white pixels mark where a droplet of a first material is dispensed while the black pixels mark where no material is dispensed and cured. FIG. 5A is the pixel chart 500a of a first portion of a layer within a polishing pad 300 and FIG. 5B is the pixel chart 500b of a second portion of the same polishing pad. The first portion may be dispensed by a first print head according to the pixel chart 500a and the second portion may be dispensed by a second print head according to the pixel chart 500b. The two print heads superimpose the pixel charts 500a, 500b together to form one or more layers that contains discrete polishing features. The polishing features near an edge region of the polishing pad include more of the first material than the second material. The polishing features near a center region of the polishing pad include more of the second material than the first material. In this example, each polishing feature has a unique combination of the first material and the second material. Therefore, by use of pixel charts, the polishing body can be sequentially formed so that a desired zeta potential gradient in material composition is achieved in the polishing body to achieve a desired polishing performance of the polishing pad.

Figure 5C:
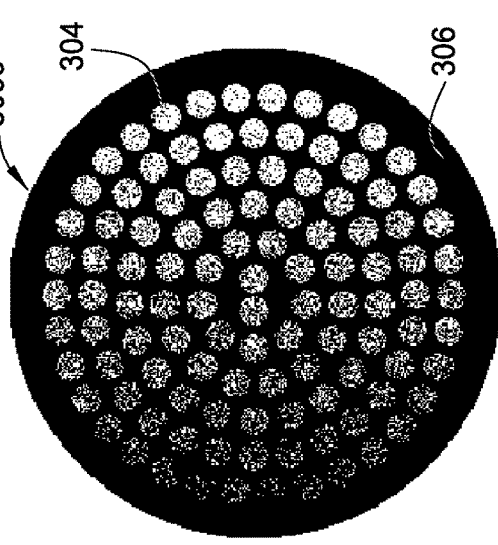

FIGS. 5C and 5D are pixel charts 500c, 500d of a polishing pad having features. In some implementations, FIG. 5C is the pixel chart 500c of a first portion of a polishing pad and FIG. 5D is the pixel chart 500d of a second portion of the same polishing pad. The polishing pad according to FIGS. 5C, 5D is similar to the polishing pad of FIGS. 5A, 5B except the gradient in the material composition of the polishing body varies from left to right across the polishing pad.

Figure 5F:
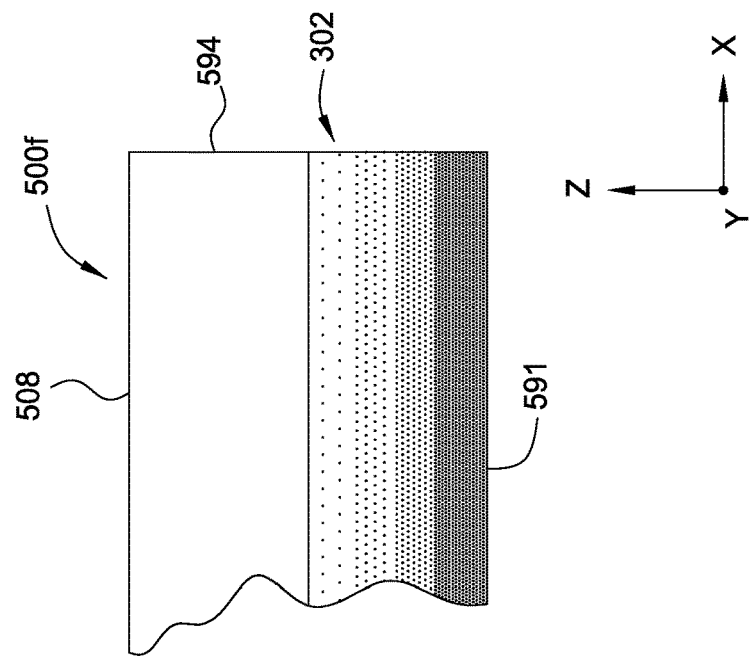
Figure 5E:
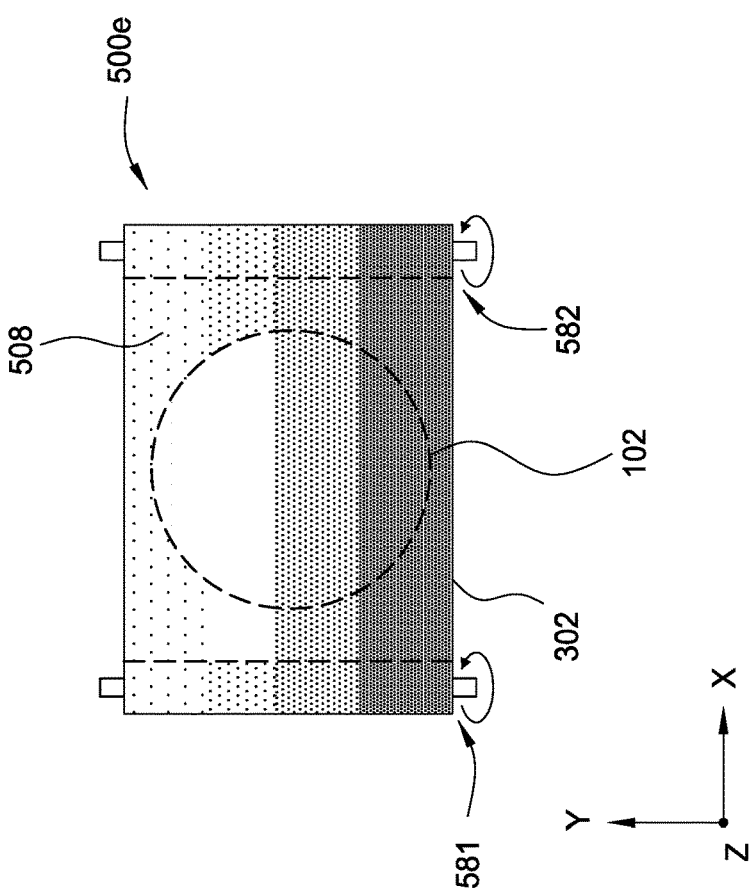

FIG. 5E is schematic view of web based polishing pad 500e that is formed using an additive manufacturing process to form a polishing surface 508 that has a gradient in zeta potential across the polishing surface 508 (e.g., Y-direction). As shown in FIG. 5E the polishing material may be disposed over a platen 102 between a first roll 581 and a second roll 582.

FIG. 5F is schematic side cross-sectional view of a polishing pad 500f that is formed using an additive manufacturing process to form a polishing base layer 591 that has a gradient in zeta potential in the Z-direction. Gradients in zeta potential of the stacked printed layers of the polishing base layer 591 can vary from a high concentration to a low concentration in one direction, or vice versa. In one example, the stacked printed layers are sequentially stacked in the Z-direction by use of an additive manufacturing process. In some cases, one or more regions with polishing pad may include more complex concentration gradients, such as a high/low/high or low/high/low concentration gradient in one or more directions, such as the X, Y and Z directions. In some configurations, the polishing pad 500f may include a polishing feature region 594 that may include discrete regions that form a least a first polishing feature 304 and a second polishing feature 306. In one example, the polishing feature region 594 may include a portion of the pad body 202 that contains one or more of the structures shown in FIGS. 3A-3L.

In one implementation, the polishing base layer 591 includes a homogeneous mixture of two or more different materials in each layer formed within the polishing base layer 591. In one example, the homogeneous mixture may include a mixture of the materials used to form the first polishing feature 304 and the second polishing feature 306 in each layer formed within the polishing base layer 591. In some configurations, it is desirable to vary the composition of the homogeneous mixture of materials layer-by-layer to form a gradient in zeta potential in the layer growth direction (e.g., Z-direction in FIG. 4B). The phrase homogeneous mixture is intended to generally describe a material that has been formed by dispensing and curing printed droplets that have at least two different compositions within each layer, and thus may contain a mixture of small regions of the at least two different compositions that are each sized at the resolution of the droplet ejecting printer 406. The interface between the polishing base layer 591 and the polishing feature region 594 may include a homogeneous blend of the materials found at the upper surface of the polishing base layer 591 and the lower surface of the polishing feature region 594, or include a discrete transition where the differing material composition in the first deposited layer of the polishing feature region 594 is directly deposited on the surface of the polishing base layer 591.

In some implementations of the polishing feature region 594, or more generally any of the pad bodies 302 described above, it is desirable to form a gradient in zeta potential in the first polishing features 304 and/or second polishing feature(s) 306 in a direction normal to the polishing surface of the polishing pad. In one example, it is desirable to have higher concentrations of a material composition used to form regions of high zeta potential in the printed layers near the base of the polishing pad (e.g., opposite to the polishing surface), and higher concentrations of a material composition used to form regions of low zeta potential in the printed layers near the polishing surface of the polishing pad. In another example, it is desirable to have higher concentrations of a material composition used to form regions of low zeta potential in the printed layers near the base of the polishing pad, and a higher concentration of a material composition used to form regions of high zeta potential in the printed layers near the polishing surface of the polishing pad.

In one implementation, it is desirable to form a gradient in the material composition within the material used to form the first and/or second polishing features in a direction normal to the polishing surface of the polishing pad. In one example, it is desirable to have higher concentrations of a material composition used to form the second polishing feature(s) 306 in the printed layers near the base of the polishing pad (e.g., opposite to the polishing surface), and higher concentrations of a material composition used to form the first polishing features 304 in the printed layers near the polishing surface of the polishing pad. In another example, it is desirable to have higher concentrations of a material composition used to form the first polishing features 304 in the printed layers near the base of the polishing pad, and a higher concentration of a material composition used to form the second polishing feature(s) 306 in the printed layers near the polishing surface of the polishing pad. For example, a first layer may have a ratio of the first printed composition to the second printed composition of 1:1, a ratio of the first printed composition to the second printed composition of 2:1 in a second layer and a ratio of the first printed composition to the second printed composition of 3:1 in a third layer. A gradient can also be formed within different parts of a single layer by adjusting the placement of the printed droplets within the plane of the deposited layer.

Figure 6:
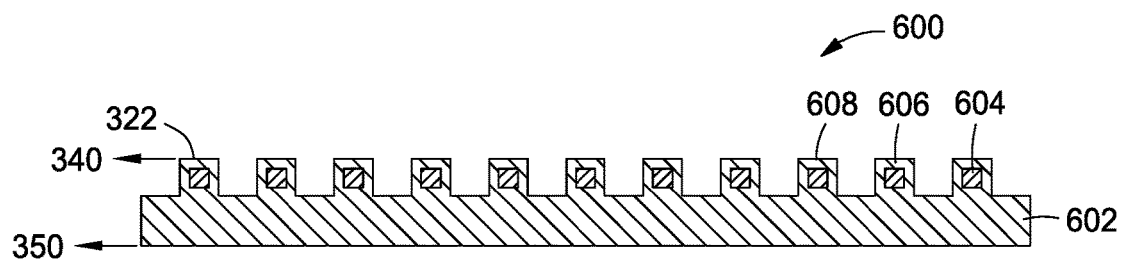
FIG. 6 is a schematic side cross-sectional view of a portion of a polishing pad having surfaces with regions of varying zeta potential according to an implementation of the present disclosure.

FIG. 6 is a schematic side cross-sectional view of a portion of a polishing pad 600 that includes a gradient (340→350) of zeta potential according to an implementation of the present disclosure. The polishing pad 600 includes a second polishing feature 602 that is a soft or low storage modulus E' material similar to the second polishing feature(s) 306 of the 3D printed polishing pad. Similar to the second polishing feature(s) 306, the second polishing feature 602 may be formed from one or more elastomeric polymer compositions that may include polyurethane and aliphatic segments. The polishing pad 600 includes a plurality of surface features 606 extending from the second polishing feature 602. Outer surfaces 608 of the surface features 606 may be formed from a soft or low storage modulus E' material or a composition of soft or low storage modulus E' materials.

In one implementation, the outer surfaces 608 of the surface features 606 may be formed from the same material or the same composition of materials as the second polishing feature 602. The surface features 606 may also include hard or high storage modulus E' features 604 embedded therein. The hard or high storage modulus E' features 604 may be formed from a material or a composition of materials that is harder than the surface features 606. The hard or high storage modulus E' features 604 may be formed from materials similar to the material or materials of the hard or high storage modulus E' features 604 of the polishing pad, including crosslinked polymer compositions and compositions containing aromatic groups. The embedded hard or high storage modulus E' features 604 alter the effective hardness of the surface features 606, and thus provide a desired target pad hardness for polishing. The soft or low storage modulus E' polymeric layer of the outer surfaces 608 can be used to reduce defects and improve planarization on the substrate being polished. Alternatively, a soft or low storage modulus E' polymer material may be printed on surfaces of other polishing pads of the present disclosure to provide the same benefit.

Figure 7:
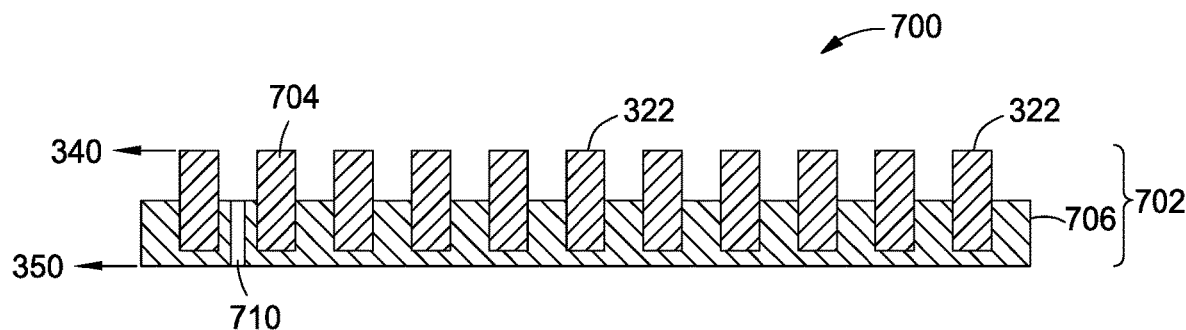
FIG. 7 is a schematic side cross-sectional view of a polishing pad having transparent regions and surfaces with regions of varying zeta potential formed therein, according to an implementation of the present disclosure.

FIG. 7 is a schematic perspective sectional view of a polishing pad 700 having one or more observation windows 710 and a gradient (340→350) of zeta potential formed therein, according to an implementation of the present disclosure. The polishing pad 700 may have a pad body 702. The pad body 702 may include one or more second polishing features 706 and a plurality of first polishing features 704 extending from the second polishing features 706 for polishing. The second polishing features 706 and the first polishing features 704 may be formed from materials similar to those for the second polishing feature(s) 306 and first polishing features 304 of the polishing pad 300. The first polishing features 704 may be arranged in any suitable patterns according to the present disclosure.

The one or more observation windows 710 may be formed from a transparent material or compositions to allow observation of the substrate being polished. The one or more observation windows 710 may be formed through, and/or about portions of, the second polishing features 706 or the first polishing features 704. In some implementations, the one or more observation windows 710 may be formed from a material that is substantially transparent, and thus is able to transmit light emitted from a laser and/or white light source for use in a CMP optical endpoint detection system. The optical clarity should be high enough to provide at least about 25% (e.g., at least about 50%, at least about 80%, at least about 90%, at least about 95%) light transmission over the wavelength range of the light beam used by the end point detection system's optical detector. Typical optical end point detection wavelength ranges include the visible spectrum (e.g., from about 400 nm to about 800 nm), the ultraviolet (UV) spectrum (e.g., from about 300 nm to about 400 nm), and/or the infrared spectrum (e.g., from about 800 nm to about 1550 nm).

In one implementation, the one or more observation windows 710 are formed from a material that that has a transmittance of >35% at wavelengths between 280-399 nm, and a transmittance of >70% at wavelengths between 400-800 nm. In some implementations, the one or more observation windows 710 are formed from a material that has a low refractive index that is about the same as that of the polishing slurry and has a high optical clarity to reduce reflections from the air/window/water interface and improve transmission of the light through the one or more observation windows 710 to and from the substrate.

In one implementation, the one or more observation windows 710 may be formed from a transparent printed material, including polymethyl methacrylate (PMMA). In another implementation, the window is formed using transparent polymeric compositions that contain epoxide groups, wherein the compositions may be cured using a cationic cure, and may provide additional clarity and less shrinkage. In a similar implementation, the window may be formed from a mixture of compositions that undergo both cationic and free radical cure. In another implementation, the window may be produced by another process, and may be mechanically inserted into a preformed orifice or area in the polishing pad that is formed by a 3D process.

Figure 8:
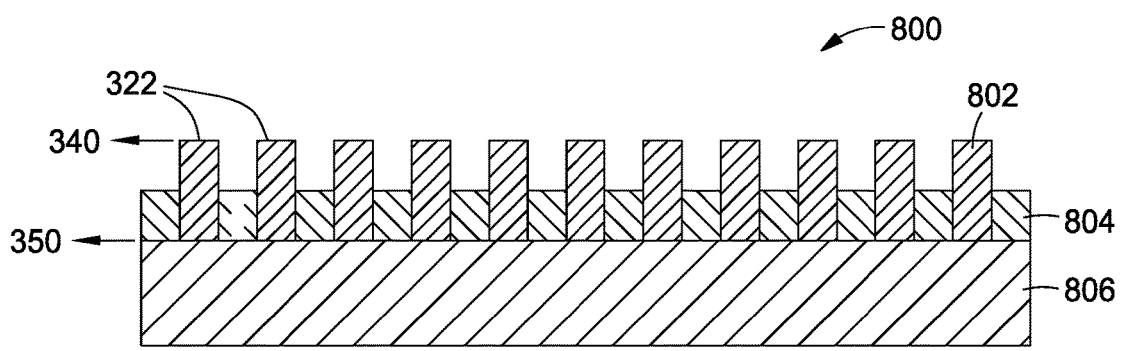
FIG. 8 is a schematic perspective sectional view of a polishing pad that has surfaces with regions of varying zeta potential and a supporting foam layer, according to an implementation of the present disclosure.

FIG. 8 is a schematic perspective sectional view of a polishing pad 800 that includes a gradient of zeta potential and a backing layer 806, according to an implementation of the present disclosure. The backing layer 806 may be a supporting foam layer. The polishing pad 800 includes a second polishing feature 804 and a plurality of first polishing features 802 protruding from the second polishing feature 804. The polishing pad 800 may be similar to any of the polishing pads described herein, with the exception that the backing layer 806 attached to the second polishing feature 804. The backing layer 806 may provide a desired compressibility to the polishing pad 800. The backing layer 806 may also be used to alter the overall mechanical properties of the polishing pad 800 to achieve a desired hardness and/or have desired storage modulus E' and loss modulus E". The backing layer 806 may have a hardness value of less than 80 Shore A scale.

In one implementation, the backing layer 806 may be formed from an open-cell or a closed-cell foam, such as polyurethane or polysiloxane (silicone), so that under pressure the cells collapse and the backing layer 806 compresses. In another implementation, the backing layer 806 may be formed from natural rubber, EPDM rubber (ethylene propylene diene monomer), nitrile, or neoprene (polychloroprene).

Figure 9:
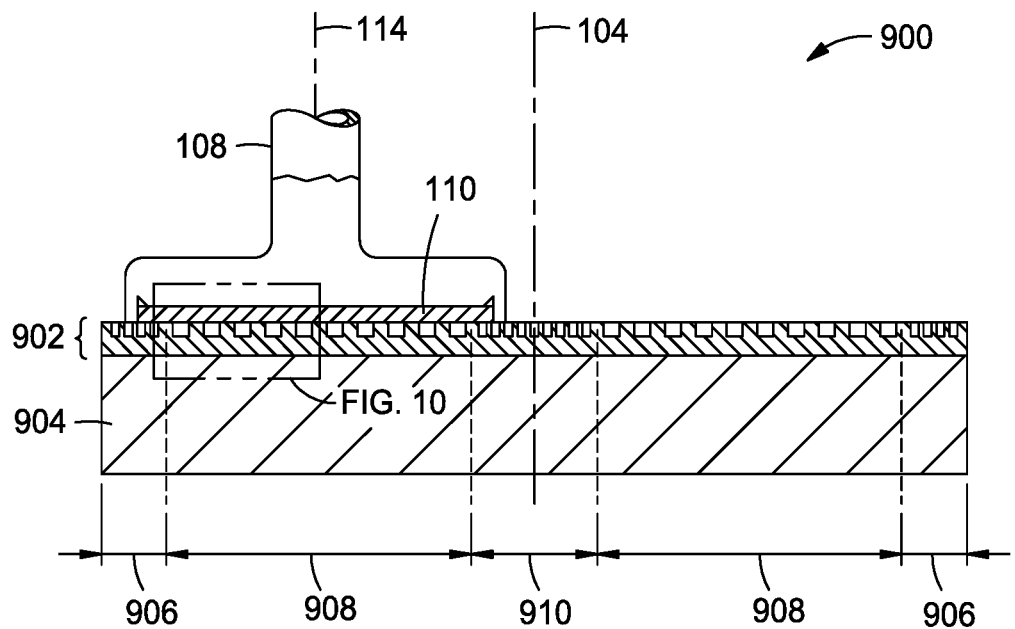
FIG. 9 is a schematic sectional view of a polishing pad having multiple zones and surface with regions of varying zeta potential, according to an implementation of the present disclosure.

FIG. 9 is a schematic sectional view of a polishing pad 900 having multiple zones. The polishing pad 900 may be designed to have different properties in regions contacting a central area of the substrate and regions contacting edge regions of the substrate during polishing. FIG. 9 schematically illustrates the carrier head 108 positioning the substrate 110 relative to the polishing pad 900. In one implementation, the polishing pad 900 may include a composite pad body 902 disposed on a backing layer 904. The composite pad body 902 may be manufactured by 3D printing. As shown in FIG. 9, the polishing pad 900 may be divided into an outer edge zone 906, a central zone 908 and an inner edge zone 910 along the radius of the polishing pad. The outer edge zone 906 and the inner edge zone 910 contact the edge region of the substrate 110 during polishing while the central zone 908 contacts the central region of the substrate during polishing.

The polishing pad 900 has different surface properties, such as zeta potential along the surface on the edge zones 906, 910 from the central zone 908 to improve edge polishing quality. In one implementation, the edge zones 906, 910 may have a different zeta potential than the central zone 908.

Figure 10:
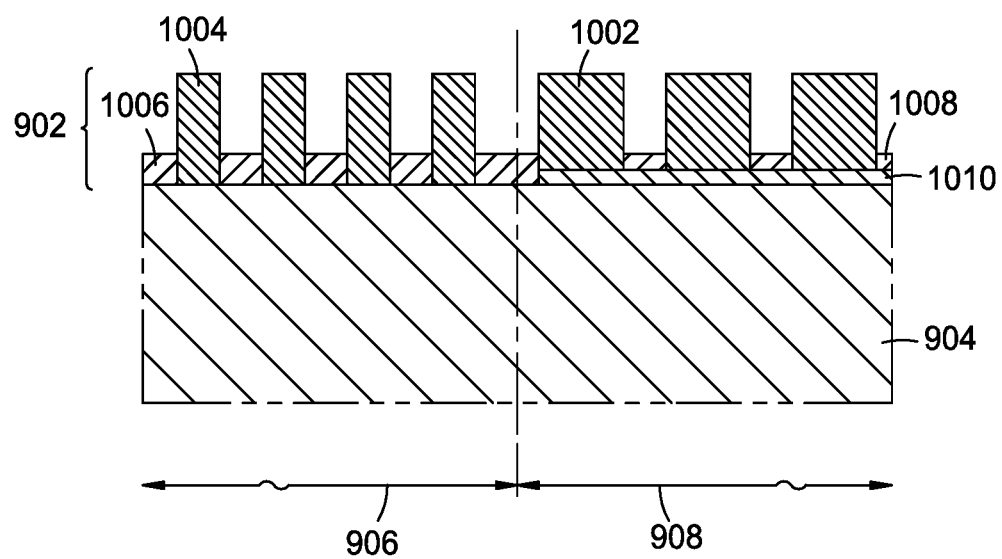
FIG. 10 is a partial enlarged sectional view of the polishing pad of FIG. 9, according to an implementation of the present disclosure.

FIG. 10 is a partial enlarged sectional view of the polishing pad 900 showing exemplary designs for the outer edge zone 906 and the central zone 908. The outer edge zone 906 includes a base material layer 1006 and a plurality of surface features 1002. The surface features 1004 may be formed from materials harder than the base material layer 1006. The central zone 908 includes a base material layer 1008 and a plurality of surface features 1004. The surface features 1002 may be formed from materials having a different zeta potential than the base material layer 1006. In one implementation, the central zone 908 may include a locking layer 1010 under the base material layer 1008. The plurality of surface features 1004 may be printed on the locking layer 1010 to improve stability. As shown in FIG. 10, the surface features 1002 in the central zone 908 are larger in size than the surface features 1004 in the outer edge zone 906. In one implementation, the pitch of the surface features 1004 in the outer edge zone 906 may be smaller than the pitch of the surface features 1002 in the central zone 908.

Exemplary Formulations:

The polishing articles described herein may be formed from at least one pre-polymer composition. The pre-polymer composition may be an ink jettable pre-polymer composition. The ink jettable pre-polymer composition may comprise at least one of: (1) one or more oligomer components; (2) one or more monomer components; (3) one or more zeta potential modifier components; (4) a photoinitiator component; (5) inorganic particles, organic particles or both; and (6) additional additives. The pre-polymer inks or compositions may be processed after being deposited by use of any number of means including exposure or contact with radiation or thermal energy, with or without a curing agent or chemical initiator. For example, ultraviolet radiation (UV), gamma rays, X-rays, accelerated electrons, and ion beams may be used to initiate polymerization reactions. For the purposes of this disclosure, the method of cure, or the use of additives to aid the polymerization, such as sensitizers, initiators, and/or curing agents, such as through cure agents or oxygen inhibitors.

The ink composition may comprise one or more oligomer components. Any suitable oligomer component capable of achieving desired properties in the final polishing article may be used. The one or more oligomer components may comprise at least one of an acrylic oligomer, a urethane (meth)acrylate oligomer, a polyester based (meth)acrylate oligomer, a polyether based (meth)acrylate oligomer, a silicone based meth(acrylate), vinyl(meth)acrylates, or an epoxy (meth)acrylate oligomer.

The oligomer component may be of low viscosity, low volatility, high reactivity, and low glass transition temperature. The oligomer component may be a multifunctional component. The functionality of the oligomer component may be 3 or less. The functionality of the oligomer component may be 2 or less.

Examples of suitable acrylic oligomers include, but are not limited to, those under the designations of CN820, CN152, and CN146, etc. from Sartomer®. Examples of suitable urethane (meth)acrylates include, but are not limited to, aliphatic and aromatic urethane (meth)acrylates under the designations of CN929, CN966, CN978, CN981, CN991, CN992, CN994, CN997, CN1963, CN9006, CN9007, etc. from Sartomer® and those from Cytek® Surface Specialty under the designations of Ebecryl 8402, Ebecryl 1290.

Examples of suitable polyester or polyether based (meth)acrylate oligomers include, but are not limited to, those under the designations of CN292, CN293, CN294E, CN299, CN704, CN2200, CN2203, CN2207, CN2261, CN2261LV, CN2262, CN2264, CN2267, CN2270, CN2271E, CN2273, CN2279, CN2282, CN2283, CN2303, CN3200, etc. from Sartomer® USA, LLC. Examples of suitable epoxy (meth) acrylates oligomer include, but are not limited to, those under the designations of Ebecryl 3701, Ebecryl 3708, Ebecryl 3200, Ebecryl 3600, etc. from Cytek® Surface Specialty, and CN151 from Sartomer®.

The one or more oligomer components may comprise at least 10 wt. %, 15 wt. %, 20 wt. %, 25 wt. %, 30 wt. %, 35 wt. %, 40 wt. %, 45 wt. %, 50 wt. %, or 55 wt. % based on the total weight of the ink composition. The one or more oligomer components may comprise up to 15 wt. %, 20 wt. %, 25 wt. %, 30 wt. %, 35 wt. %, 40 wt. %, 45 wt. %, 50 wt. %, 55 wt. %, or 60 wt. % based on the total weight of the ink composition. The amount of the oligomer component in the ink composition may be from about 10 wt. % to about 60 wt. % based on the total weight of the ink composition (e.g., from about 20 wt. % to about 50 wt. %; from about 40 wt. % to about 50 wt. %; or from about 10 wt. % to about 30 wt. %).

The ink composition may further comprise one or more monomer components. The monomer component typically offers good solvency to the oligomer component in ink formulations, which dilutes the ink to a low viscosity. The monomer component may also have a low glass transition temperature, which contributes to the flexibility of ink after curing. The monomer component may be a multifunctional component. The functionality of the monomer component may be 3 or less. The functionality of the monomer component may be 2 or less.

In one implementation, the monomer component comprises both mono-functional and di-functional monomers.

Examples of suitable mono-functional monomers include, but are not limited to, tetrahydrofurfuryl acrylate (e.g. SR285 from Sartomer®), tetrahydrofurfuryl methacrylate, vinyl caprolactam, isobornyl acrylate, isobornyl methacrylate, 2-phenoxyethyl acrylate, 2-phenoxyethyl methacrylate, 2-(2-ethoxyethoxy)ethyl acrylate, isooctyl acrylate, isodecyl acrylate, isodecyl methacrylate, lauryl acrylate, lauryl methacrylate, stearyl acrylate, stearyl methacrylate, cyclic trimethylolpropane formal acrylate, 2-[[(Butylamino) carbonyl] oxy]ethyl acrylate (e.g. Genomer 1122 from RAHN USA Corporation), 3,3,5-trimethylcyclohexane acrylate, and mono-functional methoxylated PEG (350) acrylate, etc.

Examples of suitable di-functional monomers include, but not are limited to, diacrylates or dimethacrylates of diols and polyether diols, such as propoxylated neopentyl glycol diacrylate, 1,6-hexanediol diacrylate, 1,6-hexanediol dimethacrylate, 1,3-butylene glycol diacrylate, 1,3-butylene glycol dimethacrylate 1,4-butanediol diacrylate, 1,4-butanediol dimethacrylate, alkoxylated aliphatic diacrylate (e.g. SR9209A from Sartomer®), diethylene glycol diacrylate, diethylene glycol dimethacrylate, dipropylene glycol diacrylate, tripropylene glycol diacrylate, triethylene glycol dimethacrylate, and alkoxylated hexanediol diacrylates, for example, SR562, SR563, SR564 from Sartomer®.

The one or more monomer components may comprise at least 10 wt. %, 15 wt. %, 20 wt. %, 25 wt. %, 30 wt. %, 35 wt. %, 40 wt. %, 45 wt. %, 50 wt. %, or 55 wt. % based on the total weight of the ink composition. The one or more monomer components may comprise up to 15 wt. %, 20 wt. %, 25 wt. %, 30 wt. %, 35 wt. %, 40 wt. %, 45 wt. %, 50 wt. %, 55 wt. %, or 60 wt. % based on the total weight of the ink composition. The amount of the monomer component in the ink composition may be from about 10 wt. % to about 60 wt. % relative to the total weight of the ink composition (e.g., from about 30 wt. % to about 60 wt. %; from about 20 wt. % to about 50 wt. %; from about 40 wt. % to about 50 wt. %; or from about 10 wt. % to about 30 wt. %).

The ink composition further comprises one or more zeta potential modifier components. The zeta potential modifier component comprises one or more oligomers, monomers, or both having an ionic charge (cationic, anionic, or nonionic) capable of modifying the zeta potential of a surface of the polishing article. Any suitable zeta potential modifier that provides the desired charge to the target surface may be used.

Cationic monomers useful in the ink composition include, but are not limited to the following: diallyldimethylammonium halide such as diallyldimethylammonium chloride (DADMAC), a methacryloyloxyethyl trimethylammonium halide such as methacryloyloxyethyl trimethylammonium chloride (MADQUAT), and the like. In addition, copolymers of cationic and non-ionic monomers (e.g., alkyl acrylates, alkyl methacrylates, acrylamide, styrene, and the like), such as poly(acrylamide-co-diallyldimethylammonium) chloride are also useful in the ink composition. Some other non-limiting examples of such cationic polymer include polyethyleneimine, ethoxylated polyethyleneimine, poly(diallyldimethylammonium)halide, poly(amidoamine), poly (methacryloyloxyethyl dimethylammonium) chloride, polyvinylpyrrolidone, polyvinylimidazole, poly(vinylpyridine), and polyvinylamine. The term "cationic monomer" as used herein refers to a monomer that has a positive charge. The term "cationic monomer" also includes a monomer that becomes cationic from a pH of 1 to a pH of 12.

Anionic monomers useful in the ink composition include, for example, anionic monomers of the following homopolymers such as polyacrylic acid ("PAA"), polymethacrylic acid ("PMAA"), polymaleic acid ("PMA"), poly(2-acrylamido-2-methyl-1-propanesulfonic acid (polyAMPS)®, and the like, as well as copolymers of anionic and non-ionic monomers, such as poly(acrylic acid-co-methacrylic acid), poly(acrylic acid-co-2-acrylamido-2-methyl-propanesulfonic acid), and the like. The anionic monomers can be utilized in the acidic form or as salts (e.g., sodium salts). The actual ionic character of the anionic polymer (i.e., fully ionized or partially ionized) will depend upon the pH of the CMP composition, as is well known in the art.

Non-ionic monomers useful in the ink composition include, for example, monomers of the following homopolymers: polyacrylamide ("PAM") homopolymers, and copolymers of acrylamide with one or more other non-ionic monomer such as methacrylamide, N-vinylpyrrolidone ("NVP"), and the like.

In one implementation, the zeta potential modifier is an acrylate based monomer or oligomer. The acrylate based monomer or oligomer may have one of the following functional groups: amino, ammonium, hydroxyl, ethyl, methyl, butyl, siloxane, or combinations thereof. The acrylate based monomer or oligomers may be primary, secondary tertiary, or quaternary in branching. The acrylate based monomer or oligomer may be mono-functional or multi-functional (e.g., di-functional, tri-functional, etc.).

Examples of the (meth)acrylate monomer and/or oligomer include mono-functional monomers such as isoamyl acrylate, stearyl acrylate, lauryl acrylate, octyl acrylate, decyl acrylate, isomyristyl acrylate, isostearyl acrylate, 2-ethylhexyl-diglycol acrylate, 2-hydroxybutyl acrylate, 2-acryloyloxy ethyl hexahydrophthalate, 2-Butoxyethyl acrylate, ethoxy diethylene glycol acrylate, methoxy diethylene glycol acrylate, methoxy polyethylene glycol acrylate, methoxy propylene glycol acrylate, phenoxyethyl acrylate, tetrahydrofurfuryl acrylate, isobornyl acrylate, 2-hydroxyethyl acrylate, 2-hydroxypropyl acrylate, 2-hydroxy-3-phenoxypropyl acrylate, 2-acryloyloxy ethyl succinate, 2-acryloyloxy ethyl phthalate, 2-acryloyloxyethyl-2-hydroxyethyl-phthalate, lactone modified flexible acrylate, and tert-butylcyclohexyl acrylate; bifunctional monomers such as triethylene glycol diacrylate, tetraethylene glycol diacrylate, polyethylene glycol diacrylate, tripropylene glycol diacrylate, polypropylene glycol diacrylate, 1,4-butanediol diacrylate, 1,6-hexanediol diacrylate, 1,9-nonanediol diacrylate, neopentyl glycol diacrylate, dimethylol-tricyclodecane diacrylate, diacrylate of a PO adduct of bisphenol A, hydroxy pivalic acid neopentyl glycol diacrylate, and polytetramethylene glycol diacrylate; trifunctional or higher functional monomers such as trimethylolpropane triacrylate ("TMPTA"), pentaerythritol triacrylate, pentaerythritol tetraacrylate, dipentaerythritol hexaacrylate, di(trimethylolpropane) tetraacrylate, glyceryl propoxy triacrylate, caprolactone-modified trimethylolpropane triacrylate, pentaerythritol ethoxy tetraacrylate, and caprolactam modified dipentaerythritol hexaacrylate; and oligomers thereof.

Other examples of the (meth)acrylate monomer and/or oligomer include 2-(Dimethylamino)ethyl methacrylate, [2-(Methacryloyloxy)ethyl]trimethylammonium methyl sulfate ("METAMS"), [2-(acryloyloxy)ethyl]trimethylammonium chloride ("AETAC"), [2-(Methacryloyloxy)ethyl]trimethylammonium sulfate, [2-(Methacryloyloxy)ethyl]trimethylammonium chloride ("METAC"), N-acrylamidopropyl-N, N,N-trimethylammonium chloride ("APTMAC"), methacrylamidopropyl trimethyl ammonium chloride ("MPTMAC"), dimethyl methacrylate, diallyldimethylammonium chloride ("DADMAC"), quaternized N-vinylpyridine, quaternized 2-vinylpyridine, quaternized 4-vinylpyridine, or combinations thereof.

The zeta potential modifier component in the ink composition may comprise at least 0.1 wt. %, 1 wt. %, 2 wt. %, 5 wt. %, 10 wt. %, 15 wt. %, or 17 wt. % based on the total weight of the ink composition. The zeta potential modifier component may comprise up to 1 wt. %, 2 wt. %, 5 wt. %, 10 wt. %, 15 wt. %, 17 wt., or 20 wt. % based on the total weight of the ink composition. The amount of zeta potential modifier component in the ink composition may be from about 0.1 wt. % to about 20 wt. % relative to the total weight of the ink composition (e.g., from about 1 wt. % to about 5 wt. %; from about 5 wt. % to about 10 wt. %; from about 10 wt. % to about 15 wt. %; or from about 15 wt. % to about 20 wt. %).

The ink composition may further comprise one or more photoinitiator components. In the radiation curing process, the photoinitiator component initiates the curing in response to incident radiation. The selection of the type of the photoinitiator component in the ink composition is generally dependent on the wavelength of curing radiation employed in curing the ink composition. Typically, the peak absorption wavelengths of selected photoinitiator vary with the range of wavelength of curing radiation to effectively utilize radiation energy, especially using ultraviolet light as radiation.

Examples of suitable photoinitiators include, but are not limited to, 1-hydroxycyclohexylphenyl ketone, 4-isopropylphenyl-2-hydroxy-2-methyl propan-1-one, 1-[4-(2-hydroxyethoxy)-phenyl]-2-hydroxy-2-methyl-1-propan-1-one, 2,2-dimethyl-2-hydroxy-acetophenone, 2,2-dimethoxy-2-phenylacetophenone, 2-hydroxy-2-methylpropionphenone, Diphenyl (2,4,6-trimethylbenzoyl) phosphine oxide, bis(2,6-dimethoxy-benzoyl)-2,4,6 trimethyl phenyl phosphine oxide, 2-methyl-1-[4-(methylthio) phenyl]-2-morpholino-propan-1-one, 3,6-bis(2-methyl-2-morpholinopropionyl)-9-n-octylcarbazole, 2-benzyl-2-(dimethylamino)-1-[4-(4-morpholinyl)phenyl]-1-butanone, benzophenone, 2,4,6-trimethylbenzophenone, and isopropylthioxanthone. Suitable blends of photoinitiators commercially available include, but are not limited to, those under the designations of Darocur 4265, Irgacure 1173, Irgacure 2022, Irgacure 2100 from Ciba® Specialty Chemicals; and Esacure KT37, Esacure KT55, Esacure KT0046 from Lamberti®).

The photoinitiator component in the ink composition may comprise at least 0.1 wt. %, 1 wt. %, 2 wt. %, 5 wt. %, 10 wt. %, 15 wt. %, or 17 wt. % based on the total weight of the ink composition. The photoinitiator component may comprise up to 1 wt. %, 2 wt. %, 5 wt. %, 10 wt. %, 15 wt. %, 17 wt. %, or 20 wt. % based on the total weight of the ink composition. The amount of photoinitiator component in the ink composition may be from about 0.1 wt. % to about 20 wt. % relative to the total weight of the ink composition (e.g., from about 1 wt. % to about 5 wt. %; from about 5 wt. % to about 10 wt. %; from about 10 wt. % to about 15 wt. %; or from about 15 wt. % to about 20 wt. %).

The ink composition may further comprise inorganic particles, organic particles or both. Because the 3D printing process involves layer-by-layer sequential deposition of at least one composition per layer, it may also be desirable to additionally deposit inorganic or organic particles disposed upon or within a pad layer to obtain a certain pad property and/or to perform a certain function. The inorganic or organic particles may be in the 50 nanometer (nm) to 100 micrometer (μm) range in size and may be added to the precursor materials prior to being dispensed by the droplet ejecting printer 406 or added to an uncured printed layer in a ratio of between 1 and 50 weight percent (wt. %). The inorganic or organic particles may be added to during the polishing pad formation process to improve the ultimate tensile strength, improve yield strength, improve the stability of the storage modulus over a temperature range, improve heat transfer, adjust a surfaces zeta potential, and adjust a surface's surface energy.

The particle type, chemical composition, or size, and the added particles may vary by application or desired effect that is to be achieved. In some implementations, the particles may include intermetallics, ceramics, metals, polymers and/or metal oxides, such as ceria, alumina, silica, zirconia, nitrides, carbides, or a combination thereof. In one example, the inorganic or organic particles disposed upon or within a pad may include particles of high performance polymers, such PEEK, PEK, PPS, and other similar materials to improve the thermal conductivity and/or other mechanical properties of the polishing pad.

The particle component in the ink composition may comprise at least 0.1 wt. %, 1 wt. %, 2 wt. %, 5 wt. %, 10 wt. %, 15 wt. %, or 17 wt. % based on the total weight of the ink composition. The particle component may comprise up to 1 wt. %, 2 wt. %, 5 wt. %, 10 wt. %, 15 wt. %, 17 wt. %, or 20 wt. % based on the total weight of the ink composition. The amount of particle component in the ink composition may be from about 0.1 wt. % to about 20 wt. % relative to the total weight of the ink composition (e.g., from about 1 wt. % to about 5 wt. %; from about 5 wt. % to about 10 wt. %; from about 10 wt. % to about 15 wt. %; or from about 15 wt. % to about 20 wt. %).

The ink composition may further comprise one or more additional components. Additional additives include, but are not limited to stabilizers, surfactants, leveling additives, and colorants.

Examples:

The following non-limiting examples are provided to further illustrate implementations described herein. However, the examples are not intended to be all inclusive and are not intended to limit the scope of the implementations described herein. The particular materials and amounts thereof, as well as other conditions and details, recited in these examples should not be used to limit the implementations described herein.

As noted above, in some implementations, one or more of the materials that are used to form at least one of the two or more polishing features, such as the first and second polishing features 304 and 306, is formed by sequentially depositing and post deposition processing of at least one curable pre-polymer composition. In general, the curable resin precursor compositions, which are mixed during the precursor formulation process performed in the precursor delivery section 453 of the additive manufacturing system 450, will include the formulation of pre-polymer compositions that contain functional oligomers, reactive diluents and curing components, such as initiators. Examples of some of these components are listed in Table 1 below.

Examples of functional oligomers can be found in items O1-O2 in Table 1 below. Examples of functional reactive diluents and other additives can be found in item M1 in Table 1. DMA and AMEC are both available from Sigma-Aldrich. Examples of curing components are found in item P1 in Table 1 and are available from Ciba Specialty Chemicals Inc. and RAHN USA Corporation.

TABLE 1

| Reference Name | Material Information | Functionality | Tg (° C.) | Viscosity (mPa · s) | MW (Da) |
|---|---|---|---|---|---|
| O1 | Aliphatic polyester urethane diacrylate | 2 | | | |
| O2 | Tetrahydrofurfuryl Acrylate | 1 | −28 | 6 | 156 |
| M1 | 2-[[(Butylamino) carbonyl]oxy]ethyl acrylate | | | <100 | 215 |
| DMMA | Dimethylaminoethyl Methacrylate | | 18 | 1.34 | 143 |
| AMEC | [2-(Acryloyloxy)ethyl] trimethylammonium chloride | | | | 193 |
| P1 | 2-Hydroxy-2-methyl-1-phenyl-propan-1-one | | N/A | N/A | 164 |

Examples of formulations are listed in Table 2.

TABLE 2

| Formulation No. | Material Composition (See Table 1 Ref. Name) | Formulation Composition (wt. %) |
|---|---|---|
| 1 | O1:O2:M1:AMEC:P1 | 41:33:22:1.9:1.9 |
| 2 | O1:O2:M1:AMEC:P1 | 39.7:32:21.5:4.7:1.9 |
| 3 | O1:DMMA:P1 | 49:49:2 |
| 4 | O1:O2:M1:P1 | 42:34:23:2 |

Figure 11:
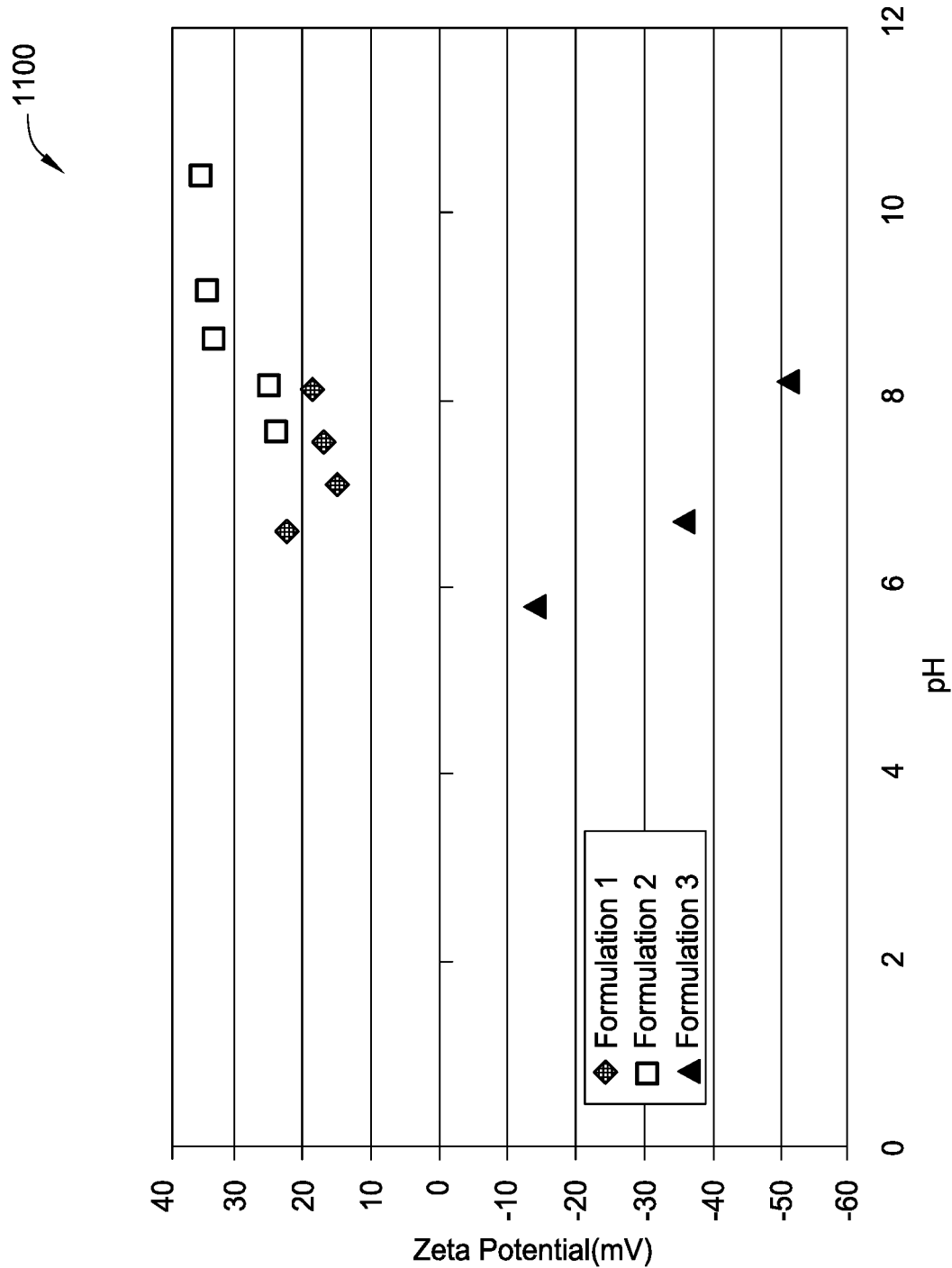
FIG. 11 is a plot depicting measured zeta potential relative to pH for polishing articles formed using formulations of the present disclosure.

FIG. 11 is a plot 1100 depicting measured zeta potential relative to pH for polishing articles from formulations depicted in Table 2. The zeta potential of the polishing surfaces of the polishing articles was measured using a SurPASS™ Electrokinetic Analyzer available from Anton Parr according to the streaming potential technique in which 1 mM of a KCl solution was used. Current polyurethane pads have a negative zeta potential. As depicted in FIG. 11, addition of the zeta potential modifier changes the polarity of the polishing article from negative to positive demonstrating the ability to tune the zeta potential.

While the foregoing is directed to implementations of the present disclosure, other and further implementations of the disclosure may be devised without departing from the basic scope thereof, and the scope thereof is determined by the claims that follow.

The invention claimed is:

1. A polishing article, comprising:
a composite polishing pad body, having:
a first grooved surface, comprising:
a plurality of polishing pad features formed from a first polymer material having a first zeta potential; and
one or more base features formed from a second polymer material having a second zeta potential; and
a second flat surface opposite the first grooved surface, wherein the first zeta potential is different from the second zeta potential;
wherein the first polymer material is formed from a first composition comprising a first zeta potential modifier selected from cationic monomers, anionic monomers, nonionic monomers, or a combination thereof.

2. The polishing article of claim 1, wherein the first zeta potential measured with the use of a neutral solution is equal to or above −70 mV and less than 0 mV and the second zeta potential measured with the use of a neutral solution is equal to or above 0 mV and less than 50 mV.

3. The polishing article of claim 1, wherein the first zeta potential measured with the use of a neutral solution is equal to or above 0 mV and less than 50 mV and the second zeta potential measured with the use of a neutral solution is equal to or above −70 mV and less than 0 mV.

4. The polishing article of claim 1, wherein the composite polishing pad body further comprises a third polymer material having a third zeta potential, wherein the third zeta potential differs from the first zeta potential and the second zeta potential.

5. The polishing article of claim 1, wherein the first zeta potential modifier comprises cationic monomers.

6. The polishing article of claim 1, wherein the second polymer material is formed from a second composition comprising a second zeta potential modifier selected from cationic monomers, anionic monomers, nonionic monomers, or a combination thereof.

7. The polishing article of claim 1, further comprising abrasive particles.

8. The polishing article of claim 1, wherein the plurality of polishing pad features are segmented polishing features arranged in a spiral pattern.

9. A polishing article, comprising:
a polishing pad body, having:
a polishing surface, comprising:
one or more first polishing features having an upper surface and a sidewall defining a plurality of grooves, wherein the upper surface comprises a first polymer material having a first zeta potential; and
one or more second polishing features defining a bottom surface of the plurality of grooves, wherein the bottom surface comprises a second polymer material having a second zeta potential different than the first zeta potential;
wherein:
the first zeta potential measured with the use of a neutral solution is equal to or above −70 mV and less than 0 mV and the second zeta potential measured with the use of a neutral solution is equal to or above 0 mV and less than 50 mV; or
the first zeta potential measured with the use of a neutral solution is equal to or above 0 mV and less than 50 mV and the second zeta potential measured with the use of a neutral solution is equal to or above −70 mV and less than 0 mV.

10. The polishing article of claim 9, wherein the sidewall comprises the first polymer material.

11. The polishing article of claim 9, wherein the first zeta potential measured with the use of the neutral solution is equal to or above −70 mV and less than 0 mV and the second zeta potential measured with the use of the neutral solution is equal to or above 0 mV and less than 50 mV.

12. The polishing article of claim 9, wherein the first zeta potential measured with the use of the neutral solution is equal to or above 0 mV and less than 50 mV and the second zeta potential measured with the use of the neutral solution is equal to or above −70 mV and less than 0 mV.

13. The polishing article of claim 9, wherein the polishing pad body further comprises a third polymer material having a third zeta potential, wherein the third zeta potential differs from the first zeta potential and the second zeta potential.

14. The polishing article of claim 9, wherein the sidewall comprises a third polymer material having a third zeta potential, wherein the third zeta potential differs from the first zeta potential and the second zeta potential.

15. The polishing article of claim 9 wherein the first polymer material is formed from a first composition comprising a first zeta potential modifier selected from cationic monomers, anionic monomers, nonionic monomers, or a combination thereof.

16. The polishing article of claim 15, wherein the second polymer material is formed from a second composition comprising a second zeta potential modifier selected from cationic monomers, anionic monomers, nonionic monomers, or a combination thereof.

17. The polishing article of claim 9, further comprising abrasive particles.

18. The polishing article of claim 9, wherein the plurality of grooves are segmented polishing grooves arranged in a spiral pattern.

19. A method of forming a polishing article, comprising:
depositing a plurality of composite layers with a 3D printer to reach a target thickness, wherein depositing the plurality of composite layers comprises:
depositing a first material having a first region with a first zeta potential; and
depositing a second material having a second region with a second zeta potential; and
solidifying the plurality of composite layers to form a composite pad body having one or more first features comprising the first material and one or more second features comprising the second material, wherein the one or more first features and the one or more second features form a unitary body;
wherein:
the first zeta potential measured with the use of a neutral solution is equal to or above −70 mV and less than 0 mV and the second zeta potential measured with the use of a neutral solution is equal to or above 0 mV and less than 50 mV; or
the first zeta potential measured with the use of a neutral solution is equal to or above 0 mV and less than 50 mV and the second zeta potential measured with the use of a neutral solution is equal to or above −70 mV and less than 0 mV.

20. The method of claim 19, wherein the first material comprises a first composition of materials that is formed by depositing droplets of a third material and a fourth material.

21. The method of claim 19, wherein the second material comprises a second composition of materials that is formed by depositing droplets of a fifth material and a sixth material.

22. The method of claim 19, wherein the first material forms discontinuous polishing features and the second material forms one or more base features, and wherein the one or more base features jointly surround the plurality of polishing feature to form a unitary body.

23. The method of claim 19, wherein the one or more first features are segmented polishing grooves arranged in a spiral pattern.

24. A polishing article, comprising:
a composite polishing pad body, having:
a first grooved surface, comprising:
a plurality of polishing pad features formed from a first polymer material having a first zeta potential; and
one or more base features formed from a second polymer material having a second zeta potential; and
a second flat surface opposite the first grooved surface, wherein the first zeta potential is different from the second zeta potential;

wherein:
the first zeta potential measured with the use of a neutral solution is equal to or above −70 mV and less than 0 mV and the second zeta potential measured with the use of a neutral solution is equal to or above 0 mV and less than 50 mV; or the first zeta potential measured with the use of a neutral solution is equal to or above 0 mV and less than 50 mV and the second zeta potential measured with the use of a neutral solution is equal to or above −70 mV and less than 0 mV.

25. A polishing article, comprising:
a polishing pad body, having:
a polishing surface, comprising:
one or more first polishing features having an upper surface and a sidewall defining a plurality of grooves, wherein the upper surface comprises a first polymer material having a first zeta potential; and
one or more second polishing features defining a bottom surface of the plurality of grooves, wherein the bottom surface comprises a second polymer material having a second zeta potential different than the first zeta potential;
wherein:
the polishing pad body further comprises a third polymer material having a third zeta potential, wherein the third zeta potential differs from the first zeta potential and the second zeta potential; or
the sidewall comprises a third polymer material having a third zeta potential, wherein the third zeta potential differs from the first zeta potential and the second zeta potential.

26. A polishing article, comprising:
a polishing pad body, having:
a polishing surface, comprising:
one or more first polishing features having an upper surface and a sidewall defining a plurality of grooves, wherein the upper surface comprises a first polymer material having a first zeta potential; and
one or more second polishing features defining a bottom surface of the plurality of grooves, wherein the bottom surface comprises a second polymer material having a second zeta potential different than the first zeta potential;
wherein the first polymer material is formed from a first composition comprising a first zeta potential modifier selected from cationic monomers, anionic monomers, nonionic monomers, or a combination thereof.

* * * * *